(12) United States Patent
Park et al.

(10) Patent No.: US 11,895,775 B2
(45) Date of Patent: Feb. 6, 2024

(54) MODULAR POWER ELECTRONICS CONVERTERS WITH ENHANCED CONNECTIVITY RELIABILITY AND SIMPLIFIED METHOD OF FABRICATION

(71) Applicant: UNIVERSITY OF MARYLAND, COLLEGE PARK, College Park, MD (US)

(72) Inventors: Yongwan Park, Palo Alto, CA (US); Shiladri Chakraborty, Calcutta (IN); Alireza Khaligh, Arlington, VA (US)

(73) Assignee: University of Maryland, College Park, College Park, MD (US)

( * ) Notice: Subject to any disclaimer, the term of this patent is extended or adjusted under 35 U.S.C. 154(b) by 29 days.

(21) Appl. No.: 17/810,050

(22) Filed: Jun. 30, 2022

(65) Prior Publication Data
US 2024/0008182 A1    Jan. 4, 2024

(51) Int. Cl.
| | |
|---|---|
| *H05K 1/14* | (2006.01) |
| *H05K 1/11* | (2006.01) |
| *H05K 1/18* | (2006.01) |
| *H05K 3/36* | (2006.01) |
| *H05K 3/34* | (2006.01) |
| *H01L 23/473* | (2006.01) |

(52) U.S. Cl.
CPC .............. *H05K 1/144* (2013.01); *H05K 1/115* (2013.01); *H05K 1/181* (2013.01); *H05K 3/341* (2013.01); *H05K 3/36* (2013.01); *H01L 23/473* (2013.01)

(58) Field of Classification Search
CPC ........ H05K 1/144; H05K 1/115; H05K 1/181; H05K 3/341; H05K 3/36
See application file for complete search history.

(56) References Cited

U.S. PATENT DOCUMENTS

| | | | |
|---|---|---|---|
| 7,393,214 B2* | 7/2008 | DiStefano | H01R 12/7082 439/74 |
| 2021/0257758 A1* | 8/2021 | Di Stefano | H01L 24/73 |
| 2022/0272880 A1* | 8/2022 | Chauhan | H01L 23/32 |

OTHER PUBLICATIONS

Advanced Packaging and Thermal Management of High-Power DC-DC Converters, Sevket U. Yuruker, et al., Proceedings of the ASME 2019 International Technical Conference and Exhibition on Packaging and Intergration of Electronic and Photonic Microsystems, INTERPACK2019, IPACK2019-6559, Oct. 7-9, 2019, Anaheim, CA, USA.

(Continued)

*Primary Examiner* — Sherman Ng
(74) *Attorney, Agent, or Firm* — Rosenberg, Klein & Lee

(57) ABSTRACT

A hybrid double-sided power switch module comprises a double PCB assembly with switch dies and conductive spacers disposed at both sides of the double PCB assembly in different topologies. The gate connections of the switch dies are enhanced by spring pins soldered in the THVs formed through the PCBs in alignment with the gate terminals. MFCs are positioned at both sides of the double PCBs assembly in contact with the tops of the switch dies and conductive spacers with fuzz buttons serving as contacts between the MFCs and the switch dies and spacers. MFCs serve different functions including AC bus-bars, DC bus-bars, heat-sinks, and their combination. The module can withstand external stress and is fabricated by a simplified and inexpensive process requiring only two solder pastes.

47 Claims, 60 Drawing Sheets

(56) References Cited

OTHER PUBLICATIONS

A Bar-Die Sic-Based Isolated Bidirectional DC-DC Converter for Electric Vehicle On-Board Chargers, Yongwan Park, et al., Department of Electrical and Computer Engineering and the Institute for Systems Research University of Maryland, College Park, Maryland, USA.

* cited by examiner

MODULAR POWER ELECTRONICS CONVERTERS WITH ENHANCED CONNECTIVITY RELIABILITY AND SIMPLIFIED METHOD OF FABRICATION

FIELD

The present disclosure addresses systems and devices for power electronics conversion, and particularly, the present disclosure addresses power switch modules with reliable interconnections between components, optimized configuration and topology, and strategies for component layout to improve electrical performance and thermal management.

The present disclosure also concerns the power switch modules built with multiple components positioned on opposite sides of a shared PCB assembly and stacked vertically on top of each other, where the critical connections between the components are strengthened by pressure-based contacts to withstand external mechanical stimuli, thus greatly improving the reliability of the subject power switch modules.

In addition, the present disclosure relates to the simplified and cost-efficient process for manufacturing power switch modules which requires only two conductive adhesives depositions in a cascade soldering routine, thus significantly reducing complexity and time consumption, as well as the cost, of the fabrication of the subject modular power electronics converters.

The present disclosure also addresses the systems which include switch module structures with integrated DC-link capacitors and gate-drive circuitry, as well as Multi-Functional Components (MFCs), integrated in a monolithic compact power electronics converter package, and approaches for the optimized components layout to lower communication inductances, to attain symmetrical current sharing, to reach a compact package volume, and to integrate thermal management in the overall system.

In some exemplary embodiments described in the present disclosure, the subject system and devices are contemplated to be used in (a) a series connection of switches to constitute a high-voltage (HV) half-bridge module, (b) parallel connection of switches to constitute a high-current half-bridge module (one of the embodiments of this approach is a configuration of switches in the multi-phase converters, for example, three-phase traction inverters), (c) configuration of switches in multi-level converters, for example, half-bridge and full-bridge modular multi-level and cascaded bridge converters and flying-capacitor multi-level converters, (d) common-source connection of two switches to constitute a four-quadrant switch for use in AC-AC converters (cycloconverters), or a combination thereof.

The subject disclosure also addresses the optimized hybrid assembly for modular electronics converter configurations, where the electrical and mechanical interconnections between components of the power electronic converters are fortified by the pressure-based contacts for critical connections in addition to soldering, thermal management approaches, and where the die fabrication strategies are optimized to facilitate easy manufacturing of the modules in question.

The subject disclosure further addresses various compact modular configurations for power electronic converter systems which are built with numerous components, including bare-die switch modules, thermo-electrically conducting spacers and thermo-electrical MFCs (which may simultaneously act as bus-bars and thermal management structures), with the bare-die switch modules wire-bondlessly attached to opposite sides of a shared main Printed Circuit Board (PCB) assembly with gate and source pads on the bare-die switch modules facing a respective side of the PCB assembly, where connections between the bare-die switch modules are established using through-hole-vias (THVs), thermo-electrically conductive spacer and MFC, and where the main PCB assembly may also house the gate drive circuitry (gate drive ICs, decoupling capacitors, and gate resistors), which are positioned in close proximity to the bare-die switch modules.

The subject disclosure further addresses the compact modular power electronic converter configurations with numerous components vertically stacked at both sides of the main PCB assembly, and high-frequency decoupling capacitors coupled across the local DC+ and DC− terminals in close proximity to the main PCB assembly, thus resulting in low power-loop communication inductances.

In addition, the present disclosure addresses power electronic converters manufactured in a compact modular format, which includes the bare-die switches wire-boundlessly attached to opposite sides of the main PCB assembly, where the modular power electronics converters configurations can be easily expanded to any number of such modules, while maintaining an optimal switching performance and high connectivity reliability.

BACKGROUND

Most commercial switch module technologies use ceramic substrate-based direct-bonded-copper (DBC) packaging approaches with wire-bonding as presented, for example, in C. Chen, et all., "A review of SiC power module packaging: Layout, material system and integration," CPSS Transactions on Power Electronics and Applications, vol. 2, no. 3, pp. 170-186, 2017, and F. H. et al., "Review of Packaging Schemes for Power Module", IEEE Journal of Emerging and Selected Topics in Power Electronics, vol. 8, no. 11, pp. 223-238, 2020.

In such approaches, the dc-link decoupling capacitors and gate-drive circuitry are not included within the packaged switch module, which increases commutation loop inductances and limits electrical performance at high switching frequencies. Furthermore, only one side of each switch is cooled using a heat-sink through successive layers of DBC substrate, baseplate and thermal interface material (TIM) are placed between the heat-sink and the switches, which leads to inefficient thermal management.

The use of wire-bonding is another drawback, as wire-bonds have been reported to be the single-largest cause of failure in power modules and also increase loop inductances (S. Seal, et al., "High Performance Silicon Carbide Power Packaging—Past Trends, Present Practices, and Future," Energies, 2017).

To reduce layout-related parasitic inductances, half-bridge modules with integrated dc-link decoupling capacitors and/or gate drive IC have been recently reported in C. DiMarino, et al., "A high-density, high-efficiency 1.2 kV SiC MOSFET module and gate drive circuit," in IEEE Workshop on Wide Bandgap Power Devices and Appl., 2016; L. Zhang, et al., "Integrated SiC MOSFET Module with Ultra Low Parasitic Inductance for Noise Free Ultra High Speed Switching," in IEEE Workshop on Wide Bandgap Power Devices and Appl., 2015; L. Zhang, et al., "An Improved SiC MOSFET-gate driver integrated power module with ultra-low stray inductances," in IEEE Workshop on Wide Bandgap Power Devices and Appl., 2017; and C. Chen, et al., "An SiC MOSFET-gate driver integrated power module with ultra-low straw inductances," in IEEE Workshop on Wide Bandgap Power Devices and Appl., 2017.

Some other approaches described in M. Guacci, et al., "Analysis and design of a 1200 V All-SiC planar interconnection power module for next generation more electrical aircraft power electronic building blocks," CPSS Transactions on Power Electronics and Applications, 2017; and A. Stippich, et al., "A Highly-Integrated SiC Power Module for fast switching DC-DC Converters" in IEEE Energy Converts. Congr. And Expo, 2019, have shown to further improve layout inductance by using planar bonding for the power connections, instead of conventional wire-bonds.

To alleviate the challenges related to wire-bonding, several wire-bondless switch-integration approaches have also been recently proposed which use dual PCBs with sandwiched die (A. E. Risseh, et al., "Realization of a Planar Power Circuit Board," in Int. Symp. On Power Electro., Elect. Drives, Automat. and Motion, June 2018), flip-chip bonding (S. Seal, et al., "3-D wire Bondless Switching Cell Using Flip-Chip-Bonded Silicon Carbide Power Devices," IEEE Trans. Power Electron, vol. 8, no. 1, pp. 367-380, March 2020), and PCB-embedded packaging (F. Hou, et al., "Fan-Out Panel-Level PCB-Embedded SiC Power MOSFETs Packaging", IEEE J. Emerg. Sel. Topics Power Electron, vol. 8, no. 1, pp. 367-380, March 2020; (G. Regnat, et al., "Optimized Power Modules for Silicon Carbide mosfet", IEEE Trans. Ind. Appl., vol. 54, no. 2, pp. 1634-1644, May 2013; and E. Hoene, et al., "Ultra-Low-Inductance Power Module for Fast Switching Semiconductors," in Proc. of PCIM Eur. Conf. for Power Electron, Intell. Motion, Renew, Energy and Energy Manage, May 2013).

To enhance thermal performance through double-sided cooling and elimination of TIM and substrate, some researchers (L. M. Boteler, et al., "Stacked power module with integrated thermal management," in IEEE International Workshop on Integrated Power Packaging, 2017, and Y. Xu, et al., "Development of an ultra-high density Power Chip on Bus (PCoB) module," in IEEE Energy Conversion Congress and Exposition, 2016), have recently introduced the idea of wire-bondless integration using MFCs, which simultaneously operate as heat-sinks and bus-bars. However, these approaches are limited in terms of electrical performance as their use of metal substrate prevents the integration of the dc-link decoupling capacitors and gate-drive circuitry close to the switches, which eventually leads to high parasitic loop inductances.

Another limitation of commercial and state-of-the-art switch modules is that they only consider half-bridge module structures, which in some cases may be extended to high-current applications through switch paralleling, as presented in G. Regnat, et al., "Optimized Power Modules for Silicon Carbide mosfet," IEEE Trans. Ind. Appl., vol. 54, no. 2, pp. 1634-1644, May 2013, E. Hoene, et al., "Ultra-Low Inductance Power Module for Fast Switching Semiconductors," in Proc. Of PCIM Eur. Conf. for Power Electron, Intell. Motion, Renew Energy and Energy Manage, May 2013, Cree, "Design Considerations for Designing with Cree SiC Modules Part 1. Understanding the Effects of Parasitic Inductance," 2013: https://www.mouser.com/pdfDocs/Cree-Design-Considerations for-Designing-with-Cree-SiC-Modules-Part-1.pdf., and P. Beckedahl, et al., "400A, 1200V SiC power module with 1 nH commutation inductance," in Int. Conf. on Integr. Power Electron. Syst., 2016.

However, the feasibility of these layout strategies to other common application scenarios such as, for example, high-voltage converters, multi-phase converters, modular multi-level converters, cycloconverters, etc., have not been explored.

In addition, for multi-phase converters, where a complete power converter can be built using connection of individual half-bridge modules, an additional inductance formed due to an external connection between the modules, can limit switching performance.

To address these challenges, a half-bridge switch module configuration with integrated dc-link decoupling capacitors and gate-drive circuitry in a single package was presented in S. U. Yuruker, et al., "Advanced packaging and thermal management of high-power DC-DC converters" in Proc. ACME Int. Tech. 974 Conf. Exhib. Packag. Integr. Electron. Photon. Microsyst., October 2019, and Y. Park, et al., "A bare-die SiC-based isolated bi-directional DC-DC converter for electric vehicle on board-chargers" in Proc. IEEE Transp. Electrific. Conf. Expo. (ITEC), June 2020, pp. 49-54, featuring multi-functional components serving as both electrical bus-bars and heat-sinks. The module demonstrated sufficiently low electric parasitic parameters and double-sided cooling for enhanced electrical and thermal performance, respectively (Y. Park, et al., "DAB Converter for EV On-Board Chargers Using Bare-Die SiC MOSFETs and Leakage-Integrated Planar transformer", IEEE Trans. Transp. Electrific., early access, October 2021, doi: 10.1109/TTE.2021.3121172).

Although having the improved electrical and thermal performance, that half-bridge switch module happened to have manufacturing and reliability-related concerns, which are believed to prohibit automated mass-production of the technology and utilization in high power applications.

Specifically, the switch modules in their vertical implementation, presented in the S. U Yuruker, et al., and Y. Park, et al., supra, have their shortcomings, which arise from the nature of the vertically expanded configuration with the relatively heavy and bulky MFCs directly attached to the dies and the spacers on the PCB, where some electrical connections are inherently vulnerable to external stimuli due to the directly transmission of mechanical shock or vibration to the switch dies. The mechanical stimulus can cause a connectivity issue, especially, on the gate connection of the switch dies to the small size of the gate pad of the switch dies which typically is smaller than 1 $mm^2$.

This problem becomes more significant once combined with the re-metallization due to the reduced solderable area of the gate pad (which is smaller than the original pad prior to the re-metallized gate pad). Any kind of connectivity issue including the gate connection may cause catastrophic failure on the entire module if it occurs during operation.

Another drawback of the vertically expanded MFCs design arises from the use of several different solder pastes. The module presented in S. U Yuruker, et al., and Y. Park, et al., supra, involves numerous components stacked vertically upon one another, such as bare-die SiC MOSFETs, metallic spacers, and various MFCs, on two sides of the same shared PCB substrate in a symmetric fashion. As the module design in both components stack vertically over small areas on both sides of the PCB substrate, it necessitates the use of multiple solder pastes with different liquidus temperatures in a cascade soldering process in order to prevent detachment of previously populated components during assembly of latter ones. To be specific, as many as four different solder pastes may need to be used sequentially, where higher temperature solder pastes are used at the earlier stages of the process than the lower temperature solder pastes to prevent detachment of previously populated components during assembly of the subsequently added components. The large number of the required solder pastes, as well as the number of the related soldering routines, can significantly add to the fabrication-related complexity, as well as the process costs and time consumption.

Commonly used vertical power devices have an aluminum-metalized gate and source pads for wire-bonding while having solderable metal layers on the drain side (e.g., successive layers of Ni and Ag). Therefore, previous approaches for wire-bondless packaging of such vertical devices have involved additional re-metallization for making the gate and source pads solderable. Other approaches explored include bonding gold stud bumps on the gate and source pads by using aluminum wire bonding technology or direct soldering with special aluminum flux.

However, all the afore-presented methods are post-fabrication processes, so the additional steps directly result in additional cost. Besides, further reliability-related concerns occur due to the immaturity of the listed approaches.

To circumvent the afore-mentioned issues, it would be desirable to use a fabrication concept which implements solderable metal layers on both sides of the die during the wafer fabrication process instead of the conventionally adopted approach of having aluminum metallization on the gate and source sides and solderable metal on the drain side. The new metal layers for solderable pads would consist of successive layers: adhesion layer to the substrate of the die (e.g., Ti), diffusion barrier layer (e.g., Ni) and solderable metal layer (e.g. Ag). Such an approach not only can reduce the manufacturing complexity of dual-side, wire-bondless attachment of the switch dies but also can potentially reduce the fabrication process cost by eliminating an additional, external process step.

It thus would be highly desirable to eliminate the challenges of the contemporary switch module technologies by providing a hybrid switch structure with vertical disposition of the components for different power converter topologies having highly reliable electrical connections, capable of withstanding thermo-mechanical stresses between the dies and MFCs, and manufactured by a simplified and less expensive manufacturing process.

SUMMARY

It is therefore an object of the subject matter to provide modular power electronics converter configurations built with multiple components positioned on opposite sides of a shared PCB assembly and stacked vertically on top of each other, where at least the critical connections between the components are strengthened by pressure-based contacts to withstand external thermal and mechanical stresses, thus greatly improving the reliability of the subject modular power electronics converters.

It is an addition object of the subject matter to provide a simplified and cost-efficient process for manufacturing modular power electronics converters which requires only two conductive adhesives depositions in a cascade soldering routine, thus significantly reducing complexity and time consumption, as well as the cost, of the fabrication of the subject modular power electronics converters.

It is a further object of the present disclosure to provide power electronics converter configurations built with switch modules and MFCs vertically extended on opposite sides of a shared PCB assembly where the connectivity is strengthened by employing pressure-based contacts, such as for example, spring pins, at least for the gate connections in the switch modules to maintain the gate connection by continuously imposing pressing force on the gate pad regardless of the external stimuli and applied stress.

It is also an object of the present disclosure to provide the power electronics converter configurations built with switch modules (employing pressure-based contacts), as well as conductive spacers, disposed at opposite sides of a shared PCB assembly, and MFCs vertically extended from the top of the switch modules and the spacers, with the MFCs connected to the switch module dies and the spacers by flexible metal contacts, such as, for example, the "fuzz-button" contacts to provide an appropriate connection without much concern of unevenly distributed pressure.

It is another object of the subject matter to address the systems which include switch module structures with integrated DC-link capacitors and gate-drive circuitry, as well as Multi-Functional Components (MFCs), integrated in a monolithic compact power electronics converter package, and approaches for the optimized components layout to lower communication inductances, to attain symmetrical current sharing, to reach a compact package volume, and to integrate thermal management in the overall system.

It is still an object of the subject matter to provide a high-voltage power switch module having highly reliable electrical connectivity that includes multiple switch dies connected in series which can be fabricated in a compact format without degrading electrical and thermal performance, and which can be extended to a cascade form with optimal layout and assembly without requiring any additional wire bonding.

It is an additional object of the present disclosure to present high-current parallel switch modules having highly reliable electrical connectivity which can be modified to an expanded area-efficient option by placing the switches in two rows, with the switching performance further enhanced by accommodating additional decoupling capacitors on the separated DC bus-bars. Such a high current parallel switch module is envisioned to be expandable to cover all configurations of multi-phase converters, for example, three-phase inverters, for traction applications.

It is still an object of the present disclosure to provide a half-bridge modular multi-level converter (MMC) with highly reliable electrical connections which can be fabricated through the electrical optimal wire-bondless composition, and which are easily expandable to full-bridge MMCs by sharing the AC-node MFCs.

Still another object of the subject matter is to provide a flying-capacitor-based multi-level converter having improved and highly reliable electrical contacts, where multiple phase-legs are fabricated by attaching additional flying capacitors to corresponding AC-node MFCs to the high-voltage switch module.

Still a further object of the present disclosure is to provide a four-quadrant (back-to-back) switch-based phase-legs for direct AC-AC converters that can be fabricated with optimal layout with the switches of a phase-leg placed on the same side of the PCB assembly.

It is an additional object of the present disclosure to provide modular highly compact and highly integrated power switch modules integrated with forced-air cooling for medium heat-flux applications without degrading the optimal electric performance, or with direct liquid cooling for high heat-flux applications where direct liquid cooling uses dielectric coolant which can be realized in the same layout with the power switch module.

It is a further object of the present disclosure to provide power electronic converters integrated with direct liquid cooling which allows the use of non-dielectric coolant fluid such as WEG and/or water, or which uses an insulated coolant chamber directly soldered to the MFCs through patterned DBC or AMB approach. In this implementation, the MFCs serve as heat-spreaders and bus-bars simultaneously. The insulated coolant chamber approach can be modified to a different form where the MFCs function as heat-spreaders, bus-bars, and heat-exchangers simultaneously. The insulated coolant chamber approach can be combined with forced-air cooling as a hybrid concept to maximize a thermal performance.

Another object of the present disclosure is to provide power electronic converters integrated with thermal management systems where two insulated coolant chamber approaches can be combined with forced-air cooling as a hybrid cooling concept to maximize thermal performance. Alternatively, an advanced metal-based heat sink can be applied to the MFCs, including plate-fin heat-sinks, square-pin-fin heat sinks, a round-pin-fin heat-sinks, staggered-pin-fin heat-sinks, as well as microchannel heat-sinks.

It is still an object of the present disclosure to provide highly compact integrated power module structures where the switch modules can be expanded to N switch modules (for higher rated current or voltage) while maintaining the optimal electrical performance, attributed to the individual decoupling capacitors embedded into each unit structure and/or symmetrical layout. Due to the symmetry of the subject switch modules in terms of layout and electrical performance, computer-aided design (CAD) optimization can be implemented at the schematic level without the requirement for additional parasitic-extraction processes for different rated voltage and current modules. Instead, the parasitic-extraction computations of a single unit structure can be simply repeated to form an expanded module.

It is another object of the present disclosure to provide electrically reliable highly compact integrated power module structures containing switch modules where the switch configuration has extremely low layout-related parasitic capacitances attributed to small overlapping areas between different potential nodes in the configuration.

It is further an object of the present disclosure to provide a novel manufacturing approach for fabrication of highly compact integrated power switch module structures, including in certain embodiment, power electronics converters, with vertical power semiconductor devices configuration in which two PCB are secured to one another with a low temperature solder paste to form a PCB assembly, while the switch modules are secured to the opposite sides of the PCB assembly with a high-temperature solder paste and with the spring pin for the gate connection of each switch module with the goal to increase the electrical reliability of the system and to reduce manufacturing complexity and lessen the number of the solder pastes in the manufacturing of the subject packaging technology.

Another object of the present disclosure is to enable a high level of thermal-electric integration due to the inclusion of heat-sinks (or heat-separators) into the module, which results in high power density. Each switch module can have low power commutation loop inductances due to the closed placement of the decoupling capacitors and the gate driver circuitry. The use of Z-dimension through the board (PCB) assembly to form the power and gate loops helps realize vertical loop structures with low loop areas and thus low inductances. In addition, the wide and short planner interconnection paths through the MFCs also help achieve low loop inductances compared with wire-bonding-based switch modules.

In one aspect, the present disclosure addresses a hybrid double-sided power switch module structure which comprises:

a first printed circuit board (PCB) and a second PCB, where the first PCB has a first side and a second side opposite to the first side, and where the second PCB has a third side and a fourth side opposite to the third side of the second PCB.

The first and second PCBs are configured with at least first and second through-hole-vias (THVs). The first THV extends between the first and second sides of the first PCB, and the at least second THV extends between the third and fourth sides of the second PCB.

A plurality of first switch dies are secured to the first side of the first PCB with a gate terminal of each first switch die facing the first side of the first PCB in alignment with the first THV formed through the first PCB.

At least one first spring pin is soldered inside the first THV formed through the first PCB by a high-temperature solder paste (through using local heating like soldering iron) with the first conductive cap of the first spring pin aligned and in contact with the gate terminal of the first switch die.

A plurality of second switch dies are secured to the third side of the second PCB with a gate terminal of each second switch die facing the third side of the second PCB in alignment with the second THV formed through the second PCB.

At least one second spring pin is soldered inside the second THV formed through the second PCB by the high-temperature solder paste. The second conductive cap of the second spring pin is positioned in contact with the gate terminal of the second switch die.

The first and second PCBs are secured to one another by a low-temperature solder paste with the second and fourth sides thereof facing each other, thus forming a double PCB assembly with the first and second switch dies at the first and third sides interconnected to configure a power switch module of a predetermined configuration, which, in certain embodiments, may have a power electronics converter topology.

The subject hybrid double-sided power switch module further comprises a plurality of conductive spacers secured to the first and third sides of the first PCB and second PCB by a first high-temperature solder paste pad.

A plurality of multi-functional components (MFCs) are disposed at opposite sides of the double PCB assembly, each MFC being disposed in contact with a top surface (drain pad) of respective switch dies and an upper surface of respective conductive spacers.

An array of flexible metal fuzz buttons is disposed between the MFCs and the switch dies, as well as the spacers.

The switch dies are coupled in a series or parallel to form different power electronics topologies, including, for example, a high-voltage half-bridge configuration, a high-current half-bridge configuration, a modular half-bridge multi-level converter (MMC) configuration, a number N of serially connected full-bridge multi-level converter module configurations, topologies with flying capacitors coupled across respective MFCs, with the half-bridge configuration of the power switch module including four-quadrant switch dies $S_1$, $S_2$, $S_3$, $S_4$, coupled in series, and other alternative topologies.

Preferably, the subject hybrid power switch module is used in combination with a thermal management sub-system composed of thermal-management components, such as, for example, MFCs, heat-sink(s), heat-spreader(s), and their combination, with the subject power switch module, in any configuration, being sandwiched between the thermal-management components in thermal contact therewith. A coolant circulating sub-system may be operatively coupled to the thermal-management components for circulating a coolant medium therethrough. The coolant circulating sub-system may be used in the form of a forced air cooling, or a liquid cooling with dielectric coolant, or a liquid cooling with non-dielectric coolant, or a liquid cooling combined with an insulated coolant chamber, and combination thereof.

In some embodiments utilizing the liquid cooling with the insulated coolant chamber, the MFCs may serve as heat spreaders and bus-bars simultaneously, with the insulated coolant chamber secured to the MFCs.

In another aspect, the present disclosure addresses a method for fabrication of a hybrid double-sided power switch module, comprising the steps of:

configuring first PCB and a second PCB with respective through-hole-vias (THV) extending between the first and second sides of the first PCB and between the third and fourth sides of the second PCB;

securing at least one first switch die to the first side of the first PCB with a gate terminal of the at least first switch die facing the first side of the first PCB in alignment with the THV formed through the first PBC, and soldering at least one first spring pin inside the THV formed through the first PCB by a high-temperature solder paste with a conductive cap of the first spring pin aligned and in contact with the gate terminal of the at least first switch die.

The operations of attaching a switch die to the third side of the second PCB and soldering another spring pin in contact with the gate terminal of the switch die are performed for the second PCB similar to the first PCB.

The first PCB assembly is subsequently secured to the second PCB assembly with a low-temperature solder paste, thus forming a double PCB assembly carrying the switch dies arranged in a predetermined topology on both sides of the double PCB assembly, thus creating a highly reliable hybrid switch module with a desired power electronics converter topology capable of withstanding external mechanical stresses and fabricated by a simplified and inexpensive process.

A plurality of MFCs are attached in contact with the switch dies on both sides of the double PCB assembly for serving various functions including AC bus-bars, DC bus-bars, heat-sinks, etc.

These and other objects of the present disclosure will become apparent in view of the Patent Drawings and the following description of the preferred embodiment(s).

BRIEF DESCRIPTION OF THE DRAWINGS

FIG. 13A shows an assembly view and FIG. 13B shows the resulting integrated module;

FIG. 16A shows the assembly view, and FIG. 16B shows the resulting integrated structure;

FIG. 24A shows an assembly view, and FIG. 24B shows the resulting integrated module.

DETAILED DESCRIPTION

Referring to FIGS. 1A-1D, a subject power switch module, constituting a fundamental building block 200, has been fabricated which can be used in a variety of alternative power electronics converter topologies, as will be detailed in further paragraphs herein. In the subject fundamental block, desired features have been attained for high performance switch module design, including, but not limited to (a) extremely low parasitic parameters, (b) double-sided cooling for each switch die, (c) high level of integration, and (d) high compatibility and modularity to various switch module configurations in conjunction with (e) high reliability of electrical connectivity, (f) ability to withstand mechanical and thermal stress and external stimuli, and (g) fabrication by a simplified and cost efficient process.

Figure 1A:
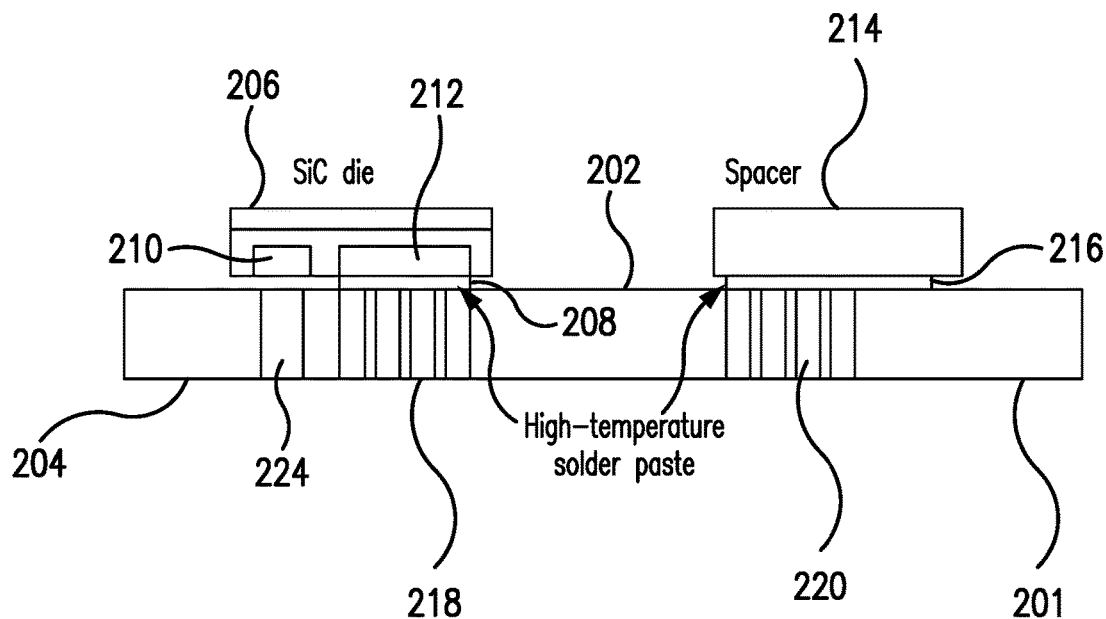
FIGS. 1A-1D are representative of the fabrication of the subject power switch module with the spring pins used for the gate connections, with FIG. 1A depicting the process of soldering switch dies and spacers on a PCB using high-temperature solder paste, FIG. 1B depicting the process of soldering the spring pins with a holding cap by using high-temperature solder paste, FIG. 1C depicting the assembly of the two PCBs to compose a half-bridge configuration, and FIG. 1D showing the assembly with MFCs by using fuzz-buttons.
Figure 1B:
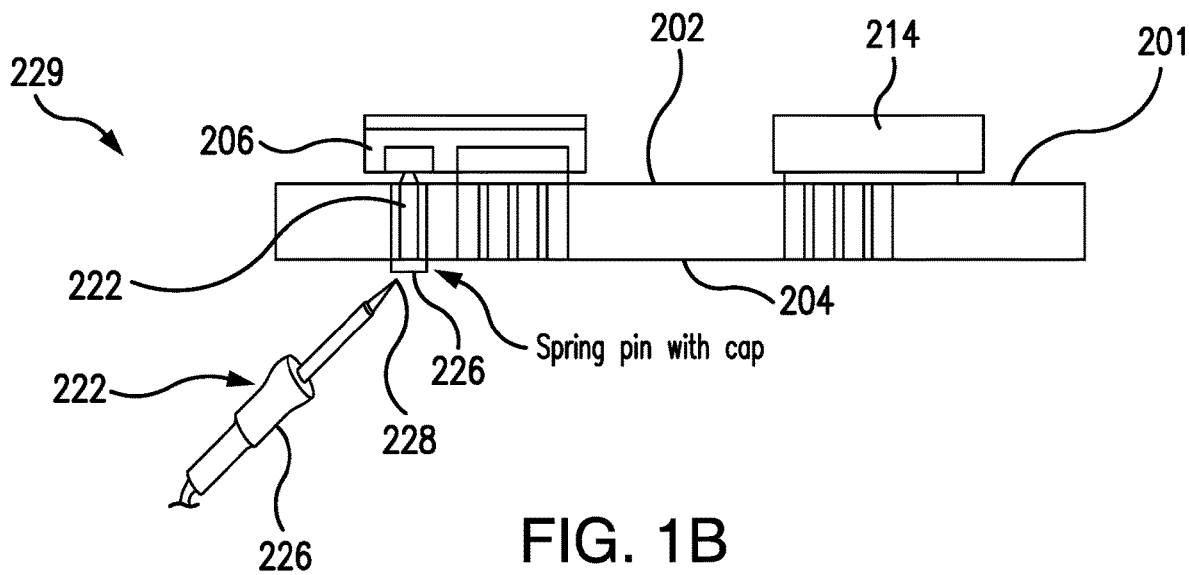
Figure 1C:
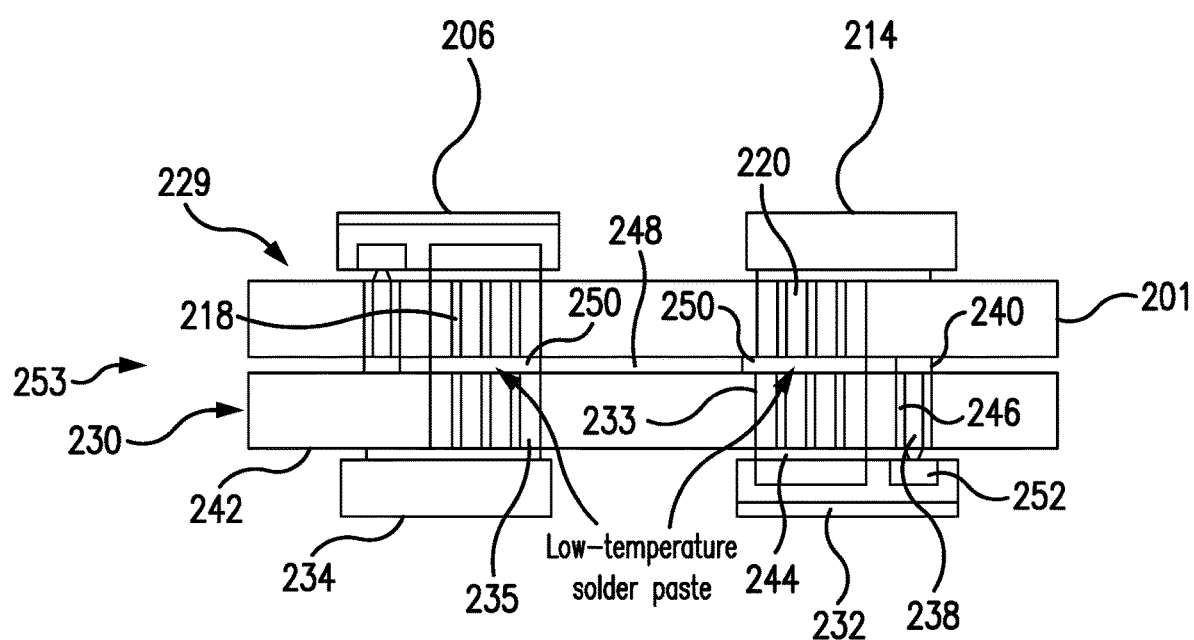

The building block in question employs a hybrid assembly method for interconnection involving pressure-based contacts for critical connections in addition to conventional soldering. The assembly process may be divided into four stages represented in FIGS. 1A-1D. In the first assembly stage shown in FIG. 1A, source pads of the switch dies and spacers are attached to a respective PCB substrate through a soldering routine using a high-temperature soldering paste. Subsequently, as presented in FIG. 1B, spring pins are utilized to form the gate connections of the switch dies at one side of the respective PCB with the holding cap of the spring pin at the opposite side of the respective PCB. The use of the spring pins results in forming the gate connectivity less prone to the potential issues arising from mechanical stresses. The process steps shown in FIGS. 1A-1B are repeated for another switch die position at another PCB, and two PCB assemblies, each with a respective switch die and the spacer, are attached one to another, thus forming the two-board-assembly, as shown in FIG. 1C.

Figure 1D:
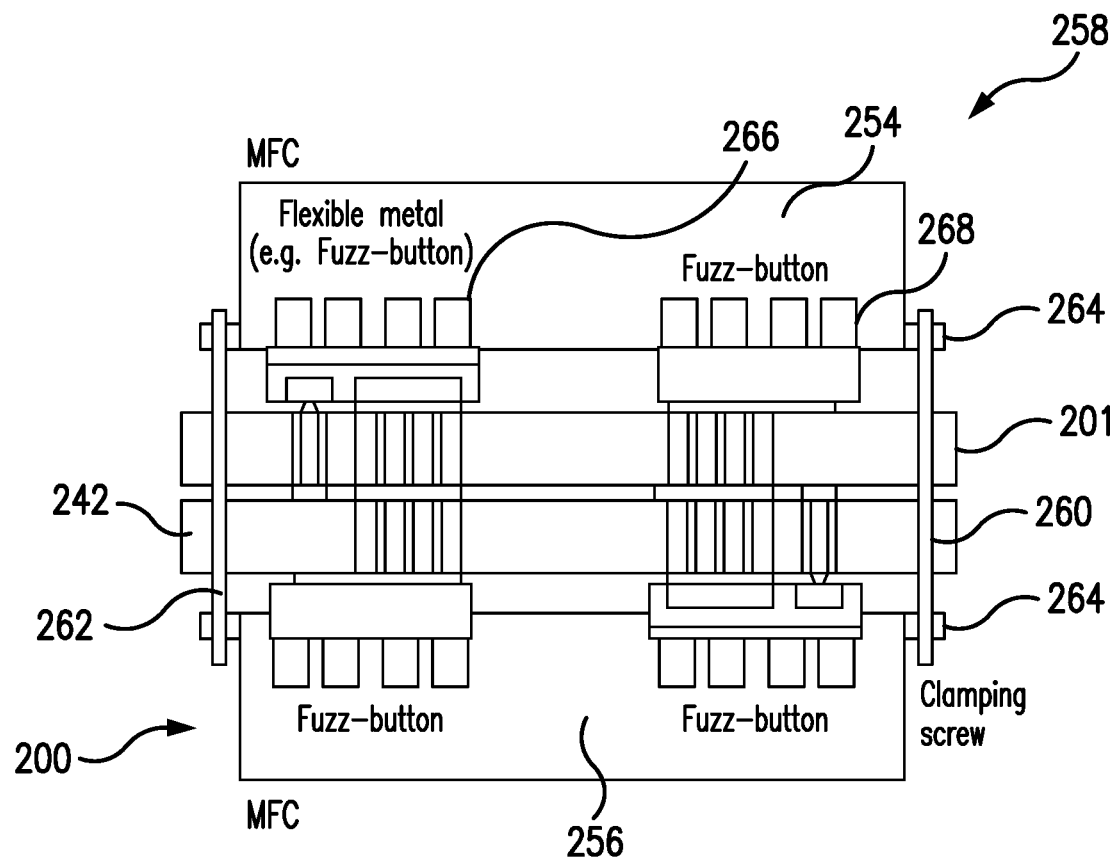

Finally, multi-functional components (MFCs) are populated vertically on both sides of the two-board-assembly by using flexible metal connectors, such as for example, "Fuzz-button" connectors, and clamping screws are utilized to secure the MFCs and the PCBs to each other to result in the hybrid switch module 200, as shown in FIG. 1D. MFCs are components which can be configured in various formats to be able to serve as AC bus-bars, or AC terminals, or heat-sinks, etc., as well as serve as combination of the AC bus-bars/terminals and heat-sinks simultaneously, as will be detailed infra.

In general, one common challenge of physical pressure-based contacts is to apply and "appropriate" force and tension to the switch dies. Too weak of physical force may cause the connectivity issue and may degrade electrical and thermal performance, while a too strong physical force may physically deform and damage the dies. The use of the spring pins and the flexible metal connectors in the subject assembly ensures the appropriate connections without serious concern of an unevenly distributed pressure. Thus, the subject assembly scheme enhances the switch module's reliability-related characteristics by mitigating the connectivity issue and CTE (Coefficient of Thermal Expansion)—related thermo-mechanical stresses between the switch dies and the MFCs.

The subject hybrid composition scheme also is beneficial in the improved manufacturability due to requiring a smaller number of conductive adhesive materials, compared with conventional cascade soldering that involves more than three different solder pastes. Consequently, the need for the high-temperature PCB material such as Polyimide which is necessary for the complicated cascade soldering process of the conventional fabrication, can be obviated in the present manufacturing process. Also, the subject improved switch module assembly 200 which consists of two separate Printed Circuit Board (PCBs) with each PCB for each switch die's position, can be advantageous in manufacturing simplicity.

Specifically, the novel unique approach to fabrication of the vertically expanded power switch module 200 begins by providing a first PCB 201 having a first (or upper) side 202 and a second (or lower) side 204. As shown in FIG. 1A, a switch die 206 is attached to the upper side 202 of the PCB 201 and is secured to the side 202 by a high temperature solder paste, for example, SAC305, shown as a high-temperature solder paste pad 208 which is needed to prevent detachment of the switch die 206 from the PCB 201. The switch die 206 has a gate terminal (pad) 210 and source terminal (pad) 212 on the same side of the PCB 201. The source terminal 212 is secured to the upper side 202 of the PCB 201 by the high temperature solder paste pad 208.

A conductive spacer 214 is formed on the upper side 202 of the PCB 201 and is attached to the PCB 201 with a high-temperature solder paste shown as the high-temperature solder paste pad 216. The high-temperature solder paste pads 208 and 216 are formed by the same high-temperature solder paste in the same soldering step.

As shown in FIG. 1A, an array of through hole vias (THVs) 218 are formed through the thickness of the PCB 201 in alignment with the source terminal 212 of the switch die 206. The THVs 218 are electrically connected at the side 202 of the PCB 201 with the high temperature solder paste pad 208 and extend through the entire thickness of the PCB 201 to its lower side 204 for electrical connection with the components which are either located at or have contact with the lower side 204 of the PCB 201.

An array of through hole vias (THVs) 220 are formed through the thickness of the PCB 201 in alignment with the spacer 214. The THVs 220 extend between the high temperature solder paste pad 216 at the bottom of the spacer 214 through the entire thickness of the PCB 201 to exit at the lower side 204 of the PCB 201 for electrical connection either with components populating the lower side 204 of the PCB 201 or to form a contact with the components which are to be in contact with the spacer 214 through the PCB 201. The THVs 218 and 220 are filled with a conductive material to form electrical paths and electrical connections between the components at both sides 202 and 204 of the PCB 201.

As shown in FIG. 1B, a spring pin 222 is inserted into a gate through hole via gate THV 224 extending through the thickness of the PCB 201 in alignment with the gate terminal 210 of the switch die 206. The spring pin 222 has a cap 226 at one end of the spring pin 222. Local heating, such as, for example, a soldering iron 228, can be used to secure the cap 226 at another end of the spring pin 222. The spring pin 222 is inserted into the gate THV 224 with the cap 226 positioned at the lower side 204 of the PCB 201. The spring pin 222 is soldered inside the gate THV 224 by using a high-temperature solder paste which maintains the spring pin 222 with the cap 226 in electrical contact with the gate terminal 210 of the switch die 206. The assembly 229 shown in FIG. 1B thus is formed which includes the PCB 201 with the switch die 206, spacer 214, and the spring pin 222 all secured together with the arrays of the THVs, as described in the previous paragraphs.

Another assembly 230 is formed with a switch die 232, spacer 234, and the spring pin 238 with the cap 240 secured to a PCB 242. The spacer 234 and the SiC switch die 232 are attached at the same side of the PCB 242 using the high temperature solder paste 244. The spring pin 238 with the cap 240 is soldered with the high-temperature solder paste inside the gate THV 246 formed through the thickness of the PCB 242 in alignment with the gate terminal 252 of the switch die 232. The assembly 230, similar to the assembly 229, is also formed with arrays of the THVs 233 (under the source pad) and 235 (under the spacer) aligned, respectively, with the source pad of the switch die 232 and the spacer 234 and extending through the thickness of the PCB 242.

The assemblies 229 and 230 are brought one to another, as depicted in FIG. 1C, by the lower side 204 of the PCB 201 and lower side 248 of the PCB 242 facing one another. The PCBs 201 and 242 are secured to one another by a low temperature solder paste pad 250 formed between the respective ends of the THVs 218 and 235, as well as THVs 220 and 233, aligned one with another, thus forming an assembly 253 and composing a half-bridge configuration with the switch dies 206 and 232 formed on different sides of the assembly 253 of the PCBs 201 and 242, as well as the spacers 214 and 234 positioned at the opposite sides of the assembly 253, as shown in FIG. 1C.

Referring to FIG. 1D, the assembly 253 of the two PCBs 201 and 242 populated on both sides thereof with the switch dies 206 and 232 and the spacers 214 and 234 with the spring pins 222 and 238 soldered through the thickness of the PCBs 201 and 242, respectively, in electrical and mechanical contact with the gate pads 210 and 252 of the switch dies 206 and 232, respectively, to maintain the gate connection by continuously imposing pressing force on the gate pads (terminals) 210 and 252, are subsequently populated with the multi-functional components (MFCs) 254 and 256 disposed vertically on the tops of the respective switch dies and spacers to form a resulting hybrid assembly 258, also referred to herein as the switch module assembly. The MFCs 254 and 256 can be formatted to serve as AC and/or DC terminals, as well as the bus-bars and heat-sinks, which will be detailed in further paragraphs.

The resulting hybrid assembly 258 includes the assemblies 229 and 230 combined together and MFCs 254 and 256 which are maintained secured to one another by using, for example, clamping screws 260 and 262 which extend through holes formed at the periphery of the PCBs 201 and 242 and through the openings in the tabs 264 extending at the ends of the MFCs 254 and 256. The connection between the MFCs 254, 256 and the tops of the switch dies 206, 232, as well as the tops of the spacers 214, 234, may be provided through flexible metal such as "fuzz-button" 266, 268.

As it is known to those skilled in the art, the fuzz-button contacts are high performance contact pins available from Custom Interconnect, which offer superior value to other contact technologies such as pogo pins, spring probes, and soldering. The fuzz buttons act like a miniature spring, providing much contact compliance. The fuzz buttons make a direct mating point and are manufactured from a long strand of cold-plated highly specialized fine wire that offers high level of conductivity, strength, and oxidation resistance. The standard wire material used is a gold-plated beryllium-copper alloy which offers lower signal distortion levels, high mating cycle relatability and excellent stability under shock/vibration.

The resulting hybrid assembly 258 which constitutes an exemplary half-bridge switch module configuration uses a spring pin with a cap in contact with the gate terminal of each switch die which provides an appropriate gate connection without concern of unevenly distributed pressure of conventional structures, which improves the hybrid assembly's reliability-related characteristics by mitigating CTE related thermo-mechanical stresses between the switch dies and the MFCs and which can be fabricated using only two different solder pastes (high temperature solder paste for attaching the SiC switch die and the spacer to the surface of the PCB and the low temperature solder paste for maintaining the companion PCBs in the assembly secured to one another.

The principle of the subject matter presented in the previous paragraphs in conjunction with illustrations shown in FIGS. 1A-1D, are applicable to and are contemplated for utilization in various multi-layer vertically expanding designs using a variety of topologies, such as, for example, power switch modules configurations, including, but not limited to power electronic converters having DC-link capacitors, gate-drive circuitry, thermo-electrically multi-functional components (MFCs), which are presented in FIGS. 2A-25B. In exemplary embodiments, the known concept of using the spring pin with the cap for gate connections may be used in series connection of switches to constitute high voltage half-bridge modules, in parallel connection of switches to constitute high-current half-bridge modules, including the configuration of switches in multi-phase converters such as three-phase traction inverters, configuration of switches in multi-level converters, for example, half-bridge and full-bridge modular multi-level and cascaded bridge converters and flying-capacitor multi-level converters, common-source connection of two switches to constitute a four-quadrant switch for use in AC-AC converters, combinations thereof, and numerous other topologies and structures, as will be presented infra.

Referring to FIGS. 1A-25B, the subject configurations of the switch modules and fabrication approaches are presented for various example embodiments. In these example embodiments, thermal management approaches and die fabrication strategies to facilitate easy manufacturing of the modules are contemplated. Each exemplary configuration shown in FIGS. 1A-25B includes the bare-die switches (any number of the switch dies and spacers may be positioned on opposite sides of the PCB assembly 253, depending on the switch module configuration topology), with switch dies wire-bondlessly attached to a main PCB assembly 253 (composed of two main PCBs) with the gate and source pads of the switch dies facing the respective board. Connections between the switches are established using through-hole-vias (THVs), thermo-electrically conducting spacers and thermo-electrical MFCs, which may simultaneously act as bus-bars and heat-sinks. Additionally, the main PCB assembly 253 may also house the gate drive circuitry (gate drive ICs, decoupling capacitors and gate resistors) positioned in close proximity to the switch dies. Each exemplary configuration has high-frequency decoupling capacitors placed across the local DC+ and DC− terminals and close to the main PCB assembly. This approach leads to low power-loop commutation inductances. In addition, the hybrid assembly 258 may utilize a second PCB (also referred to herein as an interface PCB) in addition to the main PCB assembly 253, on which the companion terminal of the dc+ and dc− MFCs are attached. The interface PCB may also house the terminal DC connector and additional DC-link capacitors. The configuration of the hybrid assembly (switch module) 258 can be easily expanded to include a number N of the switch modules, while maintaining optimal switching performance.

The design and manufacturing principles presented supra and depicted in FIGS. 1A-1D are utilized in the various power electronics converters configurations and topologies disclosed in the further paragraphs and illustrated in FIGS. 2A-25B.

As depicted in FIGS. 2A-2C, 3A-3B, and 4A-4B, the subject hybrid assembly 258 has a power electronics converter configuration which is based on a series connection of switches forming a high-voltage half-bridge switch module topology 10. The high-voltage half-bridge switch module 10 is composed of multiple switches S1, S2, S3 and S4, S5, S6 coupled in series for high-voltage applications. The switches S1-S3 and S4-S6 are connected in series between the dc1− node and dc1+ node with a capacitor C coupled therebetween. The nodes AC1 and AC2 are formed between the switches S1 and S2 and S2-S3, respectively. The nodes AC4 and AC5 are formed between the switches S4-S5 and S5-S6, respectively. The switch node AC(N) is formed between the sequences of switches S1-S3 and S4-S6, as shown in the schematic diagram in FIG. 2A.

Figure 2A:
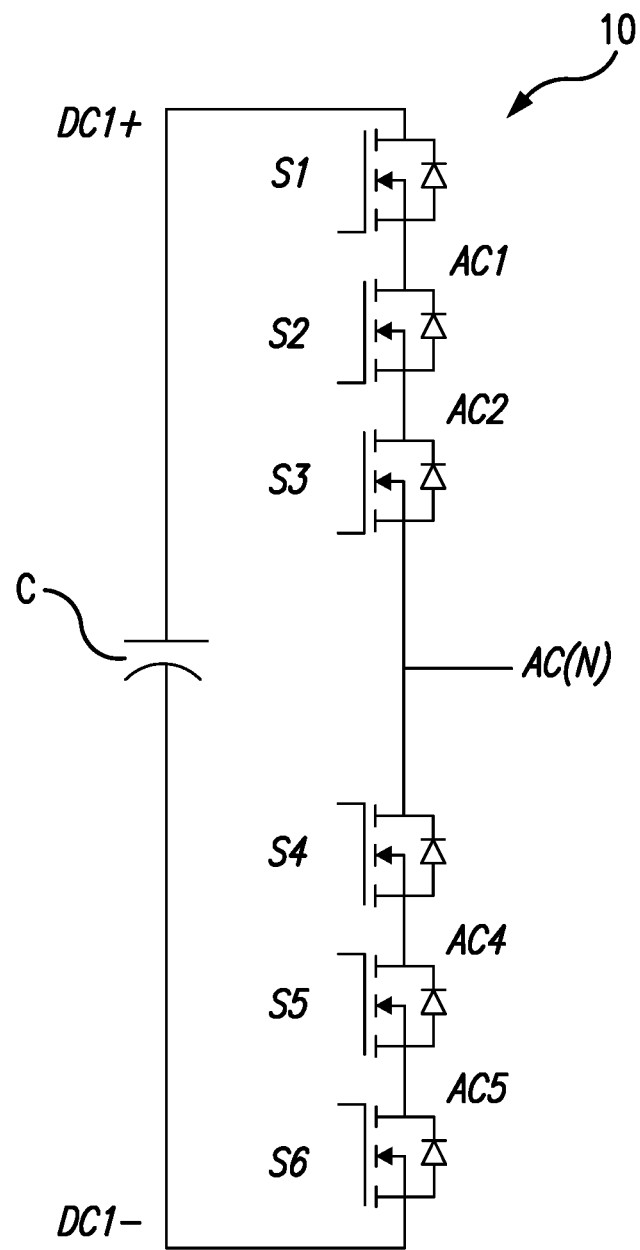
FIGS. 2A-2C are representative of the subject switch module assembly for series-connected switches constituting a high-voltage (HV) half-bridge, with FIG. 2A depicting a schematic of the subject HV half-bridge configuration, FIG. 2B showing the isometric view of the subject module, and FIG. 2C representative of the simplified front view of the subject module.
Figure 2B:
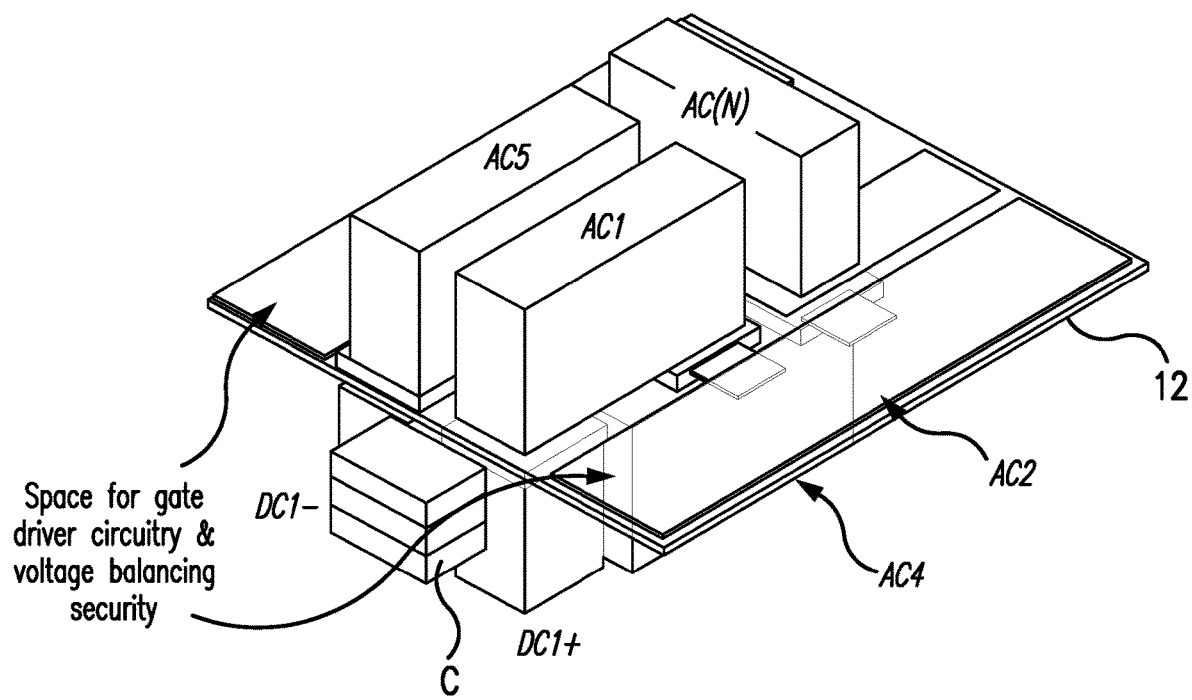
Figure 2C:
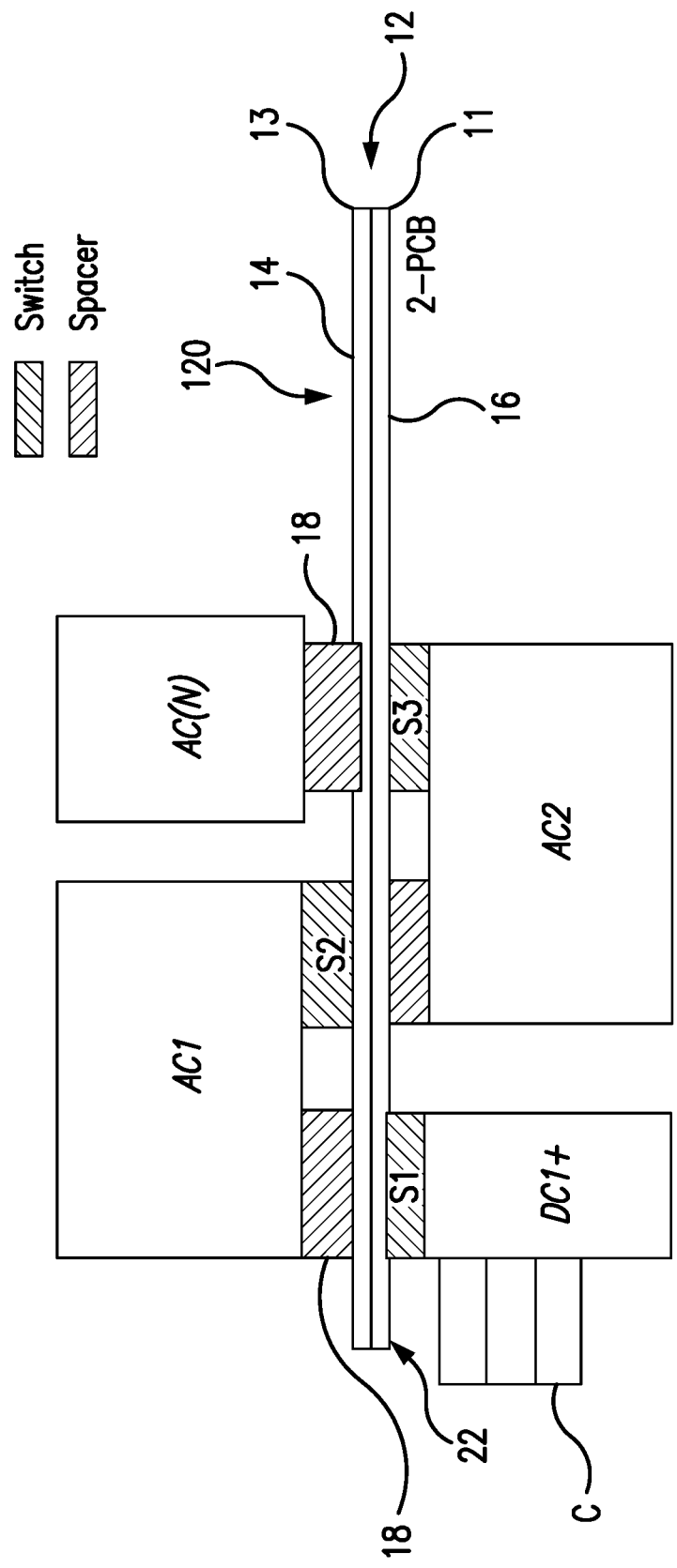

As presented in FIGS. 2B and 2C, a main PCB assembly 12 is formed with a PCB 11 and a PCB 13 in accordance with the principles presented in previous paragraphs and depicted in FIGS. 1A-1D. The upper side 14 and bottom side 16 of the main PCB assembly 12 are utilized to form conductive traces and predetermined topologies for conductive spacers 18 in the exemplary embodiment shown in FIGS. 2B and 2C. The switch S1 and switch S3 are shown to be attached to the bottom side 16 of the main PCB assembly 12, while the switch S2 is secured to the top side 14 of the main PCB assembly 12 with the spacers 18 sandwiched, respectively, between the nodes AC1, AC2, and AC(N) and the respective surfaces of the main PCB assembly 12. Similarly, the switch S5 is positioned at the bottom side 16 of the main PCB assembly 12, and the switches S4 and S6 are positioned at the upper side 14 of the main PCB assembly 12. The node AC5 is shown to be positioned on the top of the main PCB assembly 12, while the node AC4 is positioned at the bottom of the main PCB assembly 12 with the respective spacers 18 disposed between the AC5 node and the side 14 of the main PCB assembly 12, as well as between the AC4 node and the side 16 and the main PCB assembly 12. It is to be understood, that a spring pin (best shown in FIGS. 1B-1D) is soldered through the PCBs 11 and 13 in the main PCB assembly 12 in contact with the gate pad of each of the switch dies S1-S6.

The configuration shown in FIGS. 2A-2C is only an exemplary embodiment and other topologies and relative dispositions of the AC and DC nodes, as well as the switch dies and spacers, are contemplated in the present design.

As shown in FIGS. 2B and 2C, the capacitor C is disposed in close proximity to the switch dies in the circuitry, thus benefiting in low parasitic capacitances in the subject module 10. As shown in FIGS. 2B-2C, the capacitor C is attached directly to the nodes DC1+ and DC1−. Areas 20 and 22 is available on either of the top side 14 or bottom side 16 of the main PCB assembly 12 to accommodate a gate driver circuitry and voltage balancing circuitry.

Figure 3A:
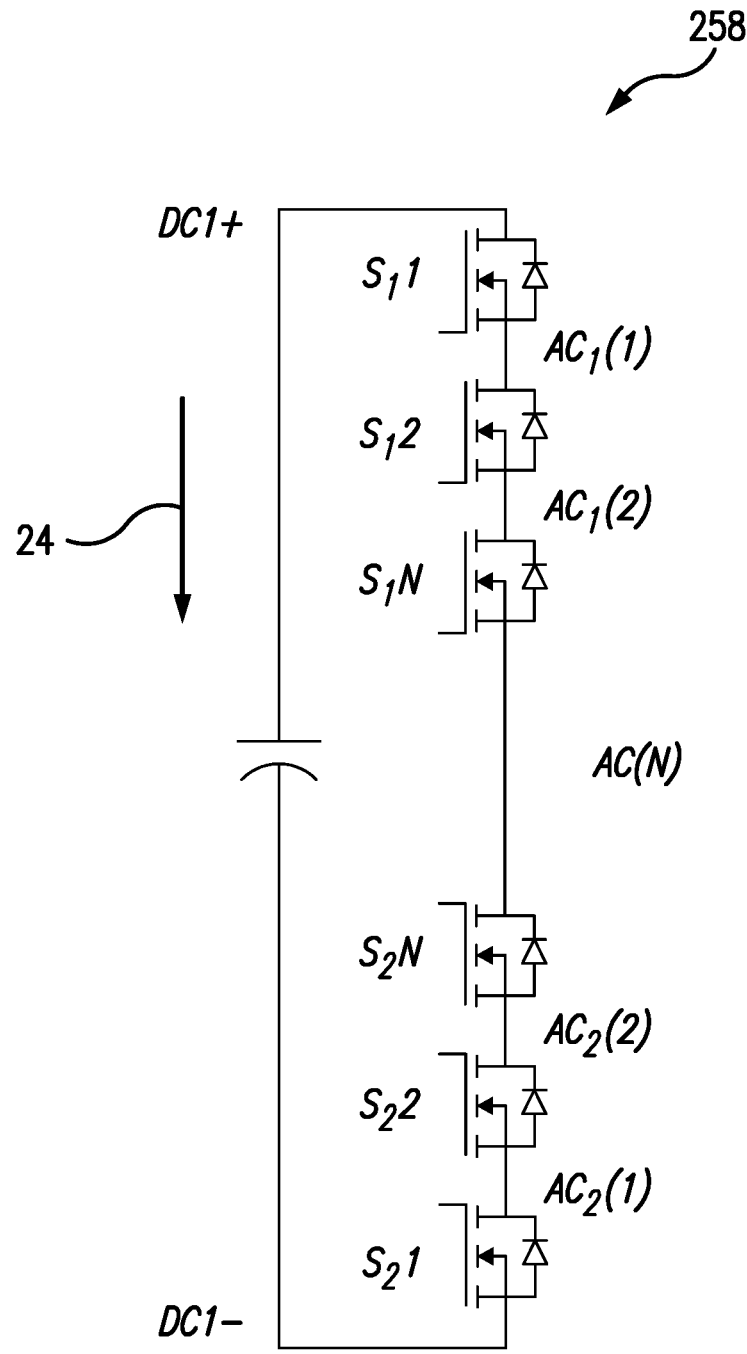
FIGS. 3A-3B illustrate the concept of expansion of the structure shown in FIGS. 2A-2B to a larger number of switches connected in series with FIG. 3A showing a schematic of the subject HV half-bridge module with N switches, and FIG. 3B showing a front view of the expanded series-switch module constituting the HV half-bridge configuration.
Figure 3B:
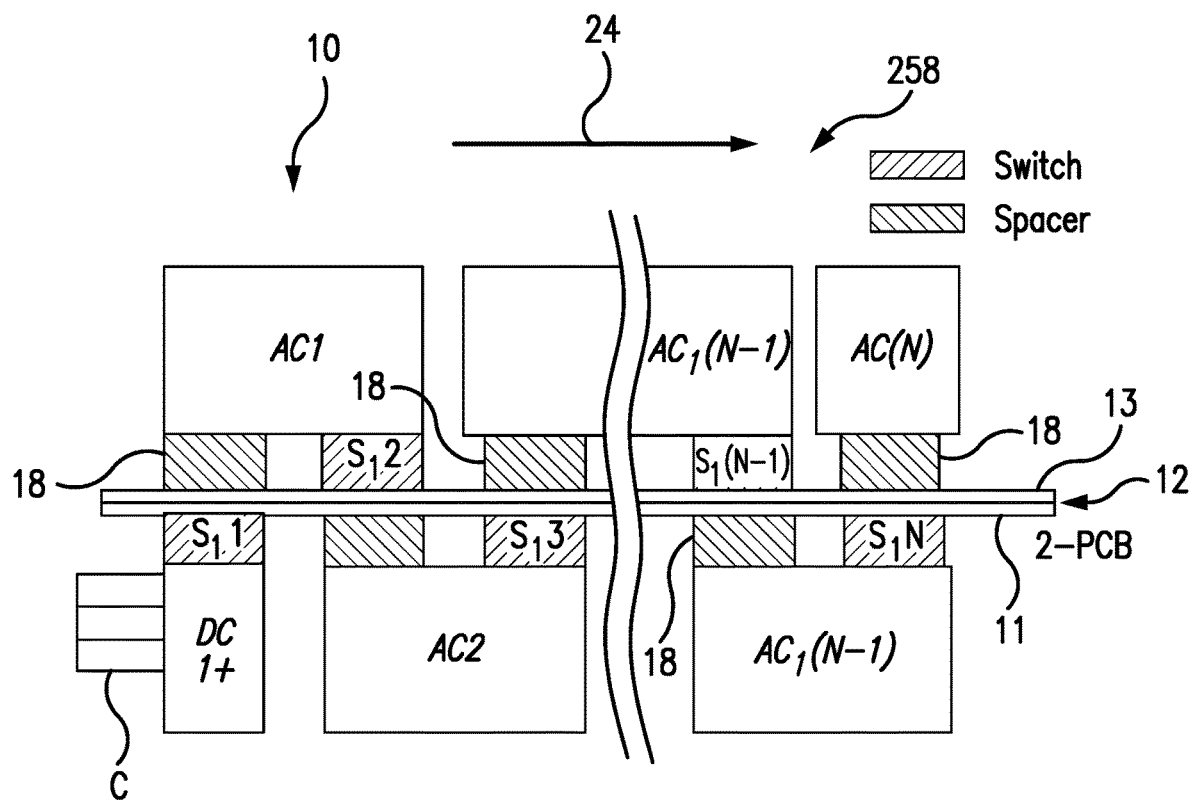

FIGS. 3A-3B reflect the concept of expansion of the structure shown in FIGS. 2A-2C to a hybrid assembly 258 built with a number N of the switch modules 10 connected in series with N switch dies $S_1$ (1, 2, . . . , N), respectively, for the high side, and switches $S_2$ (N, N−1, . . . , 1), respectively, for a low side of the hybrid assembly 258. As shown in FIGS. 3A-3B, the switch module 10 shown in FIGS. 2A-2C, is expanded in a direction 24 until it reaches the switch node SiN. The companion switches $S_2$ then expand in the opposite direction to return to the initial point to close the loop with proximity of the DC1+ and DC1− bus-bars.

Figure 4A:
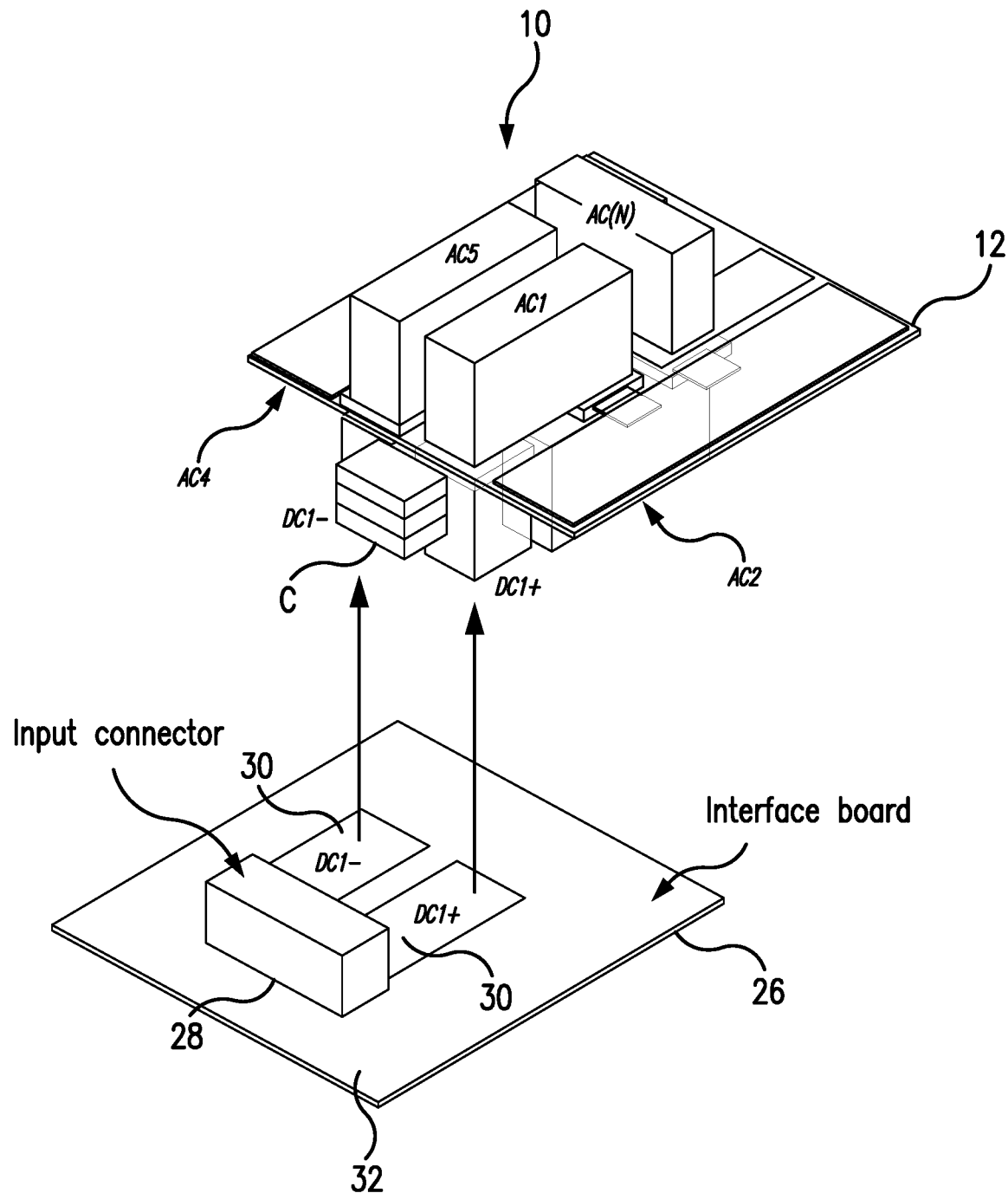
FIGS. 4A-4B depict the subject series-switch module integrated with the interface board with FIG. 4A being an assembly view, and FIG. 4B showing the integration approach.
Figure 4B:
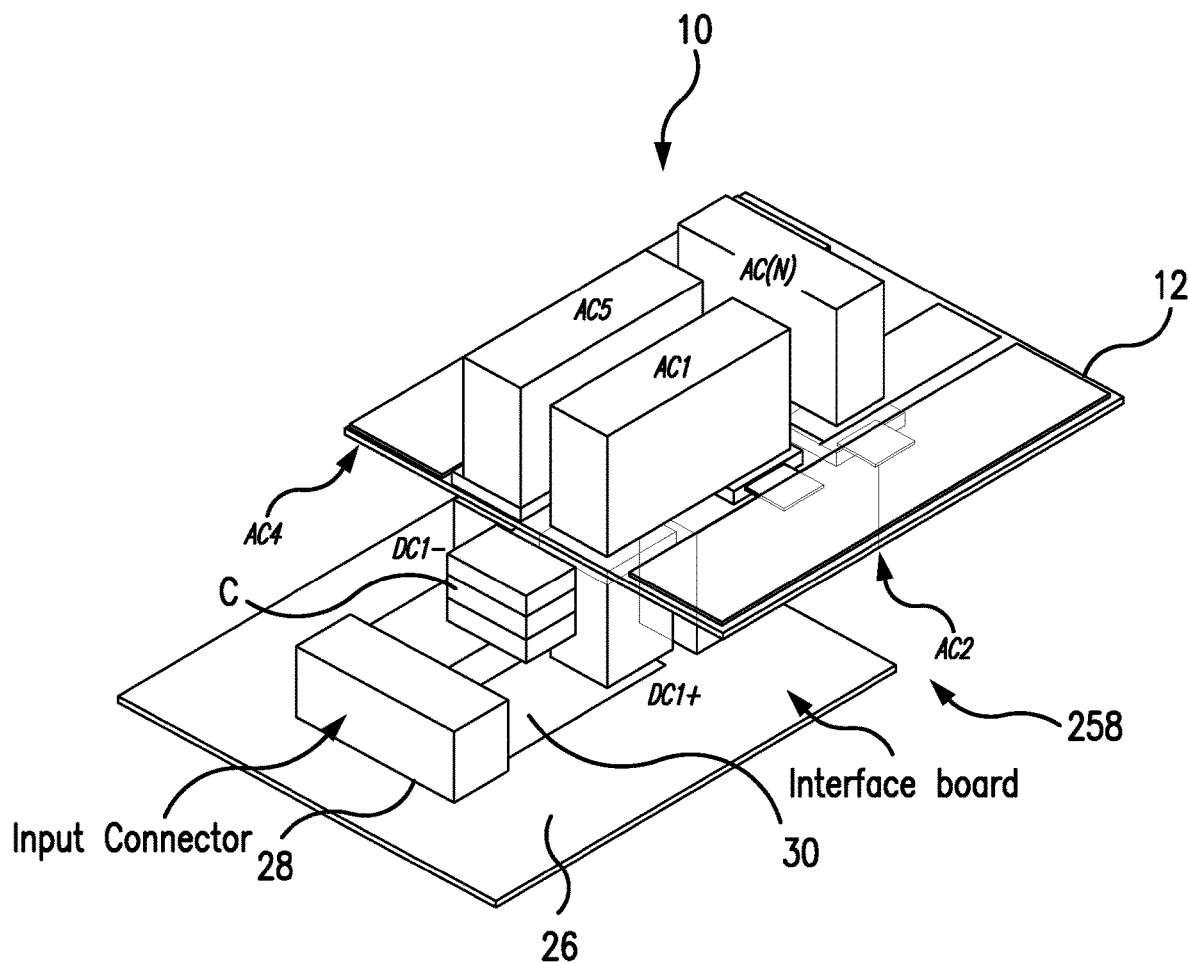

FIGS. 4A-4B show the process of integration of the series-switch module 10 of FIGS. 2A-2C and 3A-3B with the interface board (or PCB) 26. As shown, the interface PCB 26 has an input connector 28 and conductive traces 30 formed on the top surface 32 of the interface PCB 26. When integrated with the main PCB assembly 12, the dc1+ and dc1− bus-bars are brought in contact with the traces 30, so that the power supplied through the input connector 28 into the switch module 10 can be provided for operation to all components of the switch module 10.

The resulting hybrid assembly structure 258 is either encapsulated in an encapsulate material to secure the interface board 26 integral with the main PCB assembly 12, or the main PCB assembly 12 and the interface board 26 are secured to one another by any other means which are known to those skilled in the art and are not going to be discussed herein in detail.

Figure 5A:
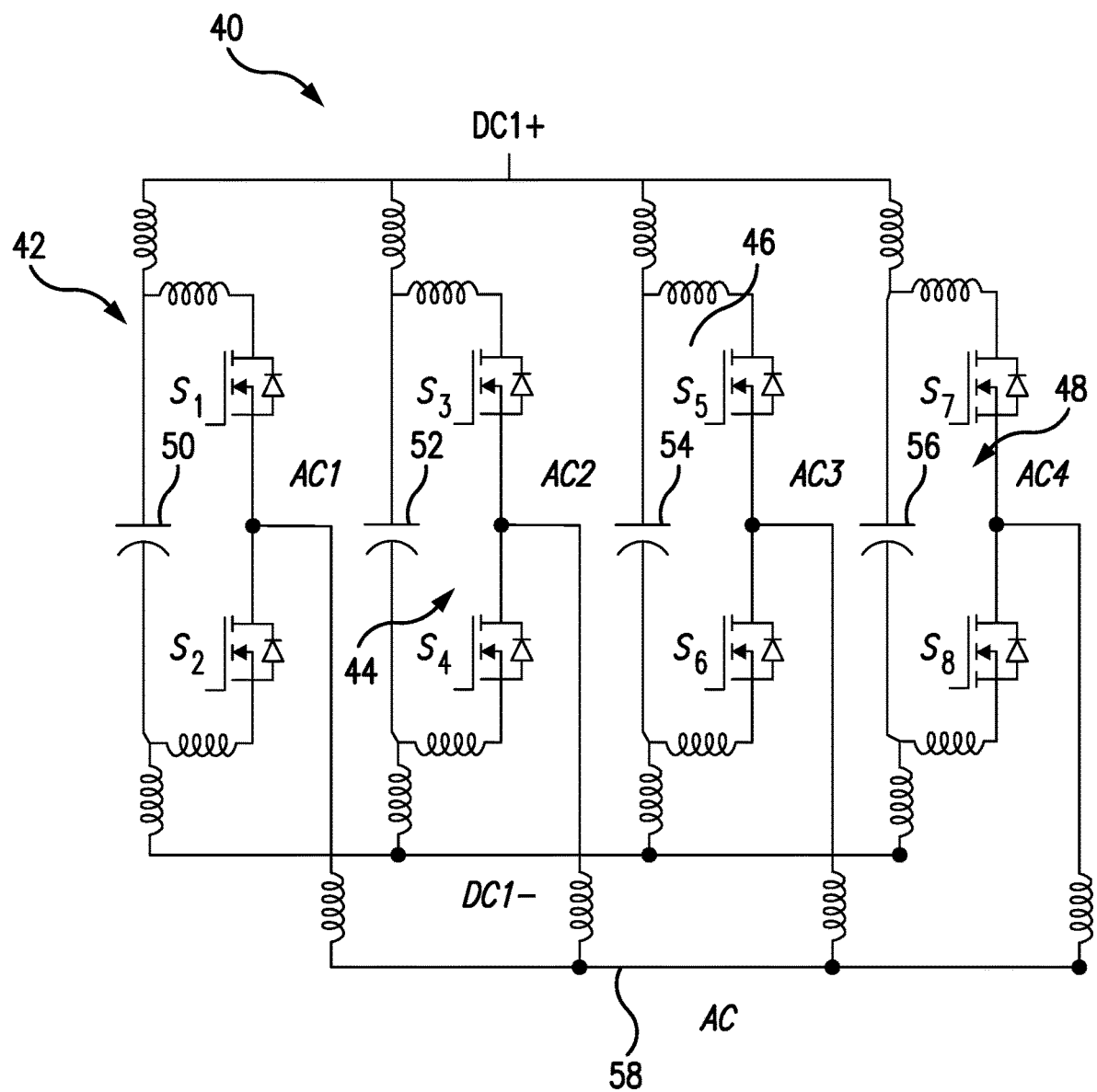
FIGS. 5A-5C are representative of the subject switch module configuration and assembly for several parallel-connected switches constituting a high current half-bridge topology with FIG. 5A showing the schematic of the subject switch module configuration, FIG. 5B showing an isometric view of the subject switch module configuration, and FIG. 5C showing the front view of the subject switch module configuration.
Figure 5B:
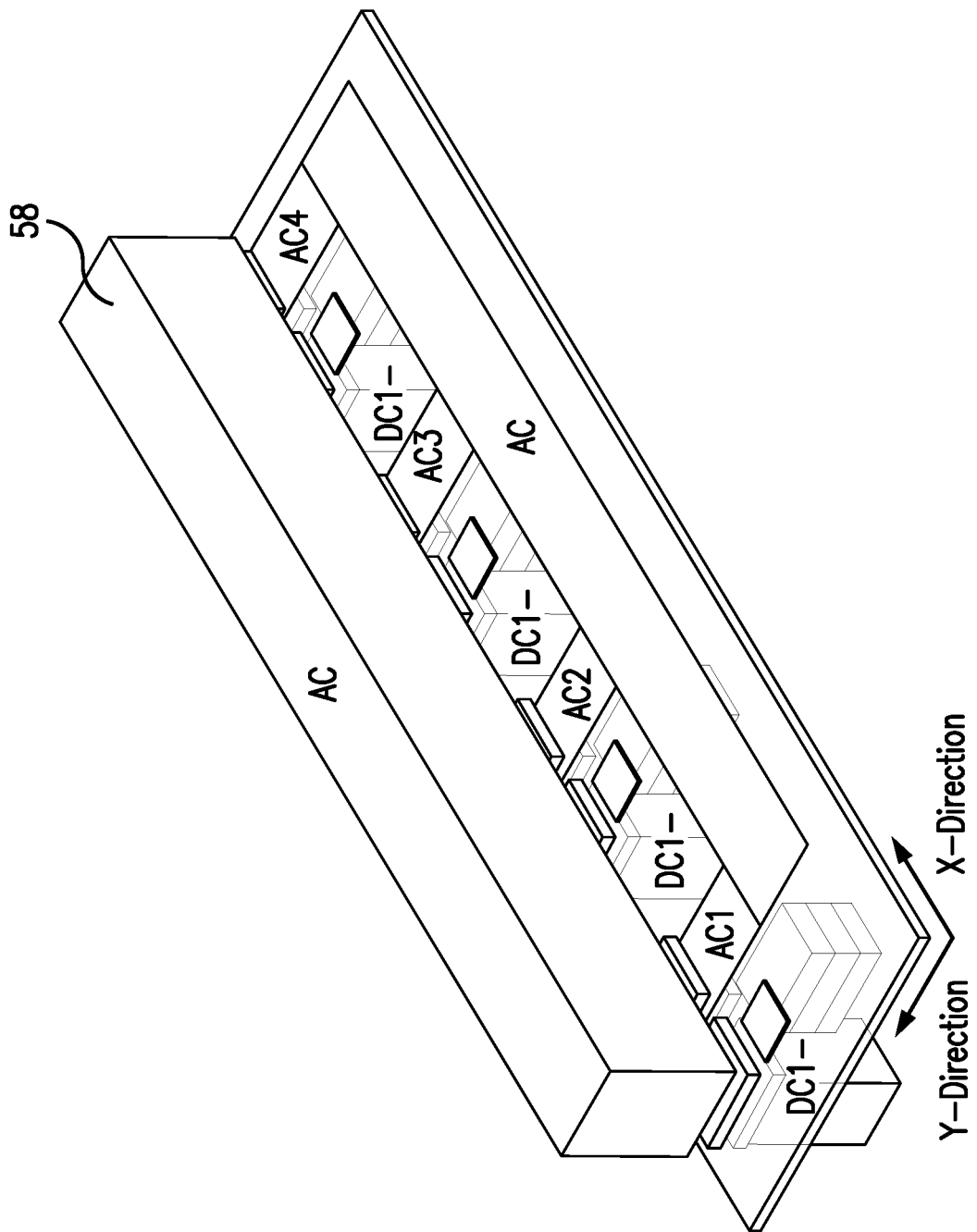
Figure 5C:
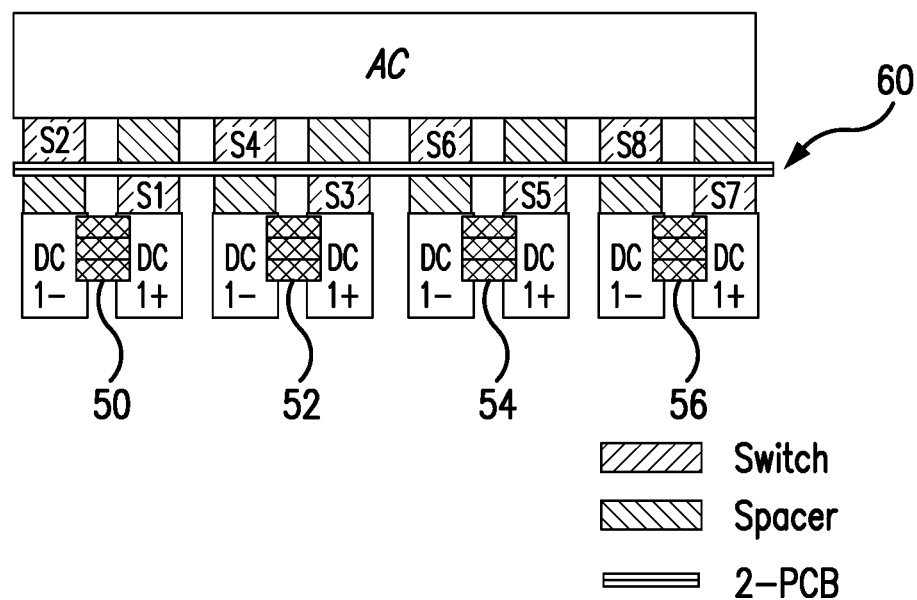

Referring to FIGS. 5A-5C, 6A-6B, and 7A-7B, an alternative embodiment of the subject switch module is presented which is based on the parallel connection of the switch dies to form a high-current half-bridge converter topology 40. As shown in FIGS. 5A-5C, the switch module 40 includes four switch legs 42, 44, 46, 48 with the switch leg 42 including switch dies S1, S2 interconnected one to another with the capacitor 50 and the AC node AC1. The switch leg 44 includes switches S3 and S4 with the capacitor 52 coupled therebetween and the AC node AC2. The switch leg 46 includes the switches S5 and S6 with the capacitor 54 interconnected therebetween and with the AC node AC3. The switch leg 48 includes switches S7 and S8 with the capacitor 56 coupled therebetween and with the AC node AC4.

The AC nodes AC1, AC2, AC3, and AC4 are coupled to the common AC bus-bar 58. The switches S1, S3, S5, and S7 are coupled to the DC1+ terminal, and the switches S2, S4, S6, and S8 are coupled to the DC terminal DC1−. As shown in FIGS. 5B-5C, the switches S2, S4, S6, and S8 are positioned on an upper side of the main PCB assembly 60, and the switches S1, S3, S5, and S7 are positioned at the bottom side of the main PCB assembly 60 in the single row of switches on each side. The main advantage of this topology is a fully symmetric power loop inductance (which leads to balanced current sharing among the switches).

As shown in FIGS. 5A-5C, the common AC node 58 is represented by the AC bus-bar which extends in alignment with and is electrically coupled to the AC nodes AC1, AC2, AC3 and AC4 of the switch legs 42, 44, 46, and 48. The principles of the main PCB assembly and spring pins fortified contact for the gate pad of each switch die depicted in FIGS. 1A-1D is fully applicable to the high-current half-bridge converter topology 40 of FIGS. 5A-5C, 6A-6B, and 7A-7B.

Figure 6A:
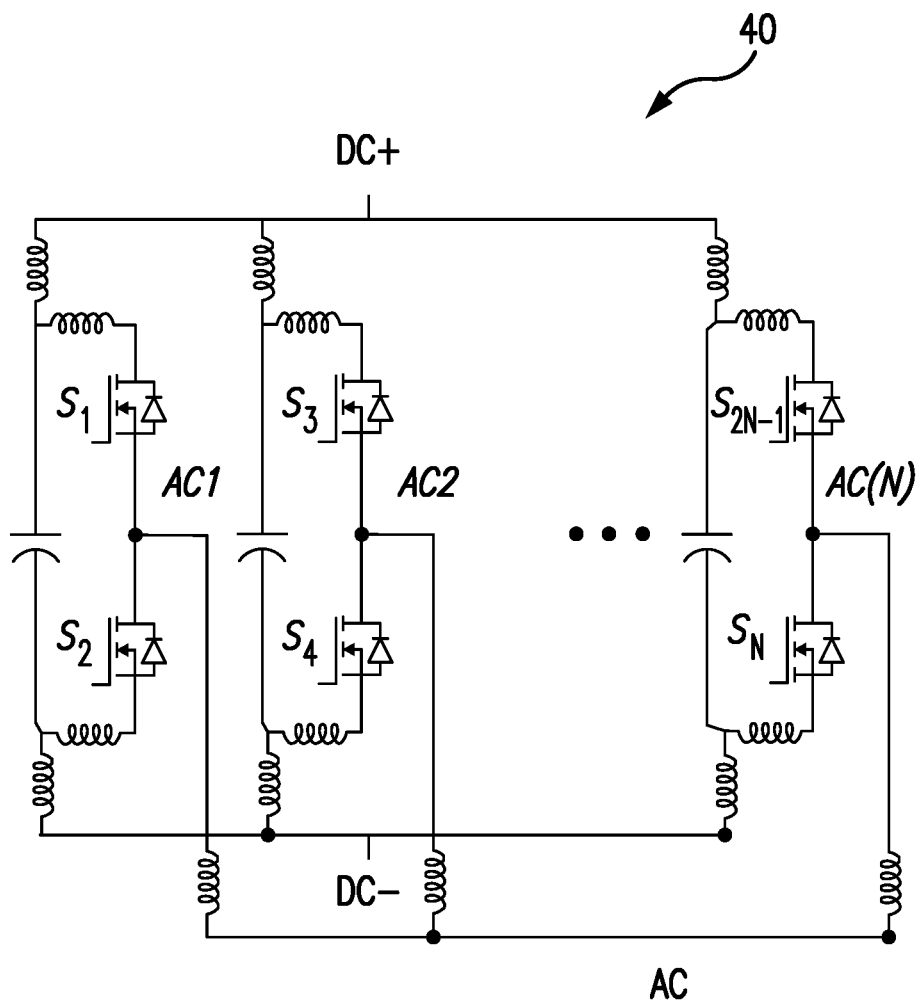
FIGS. 6A-6B represent the concept of expansion of the subject switch module shown in FIGS. 5A-5C to N phase-legs connected in parallel, with FIG. 6A showing a schematic of the switch module, and FIG. 6B showing the front view of the expanded parallel-switch module.
Figure 6B:
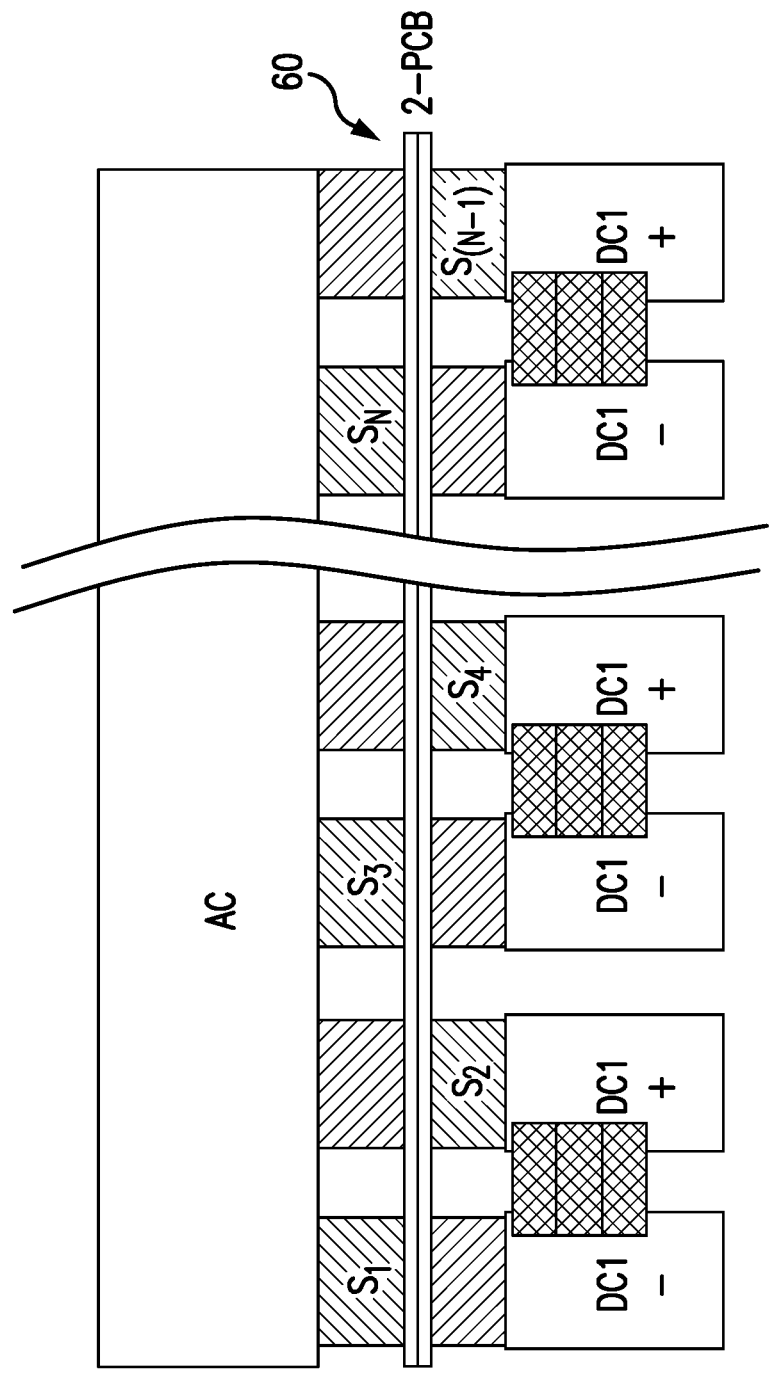
Figure 7A:
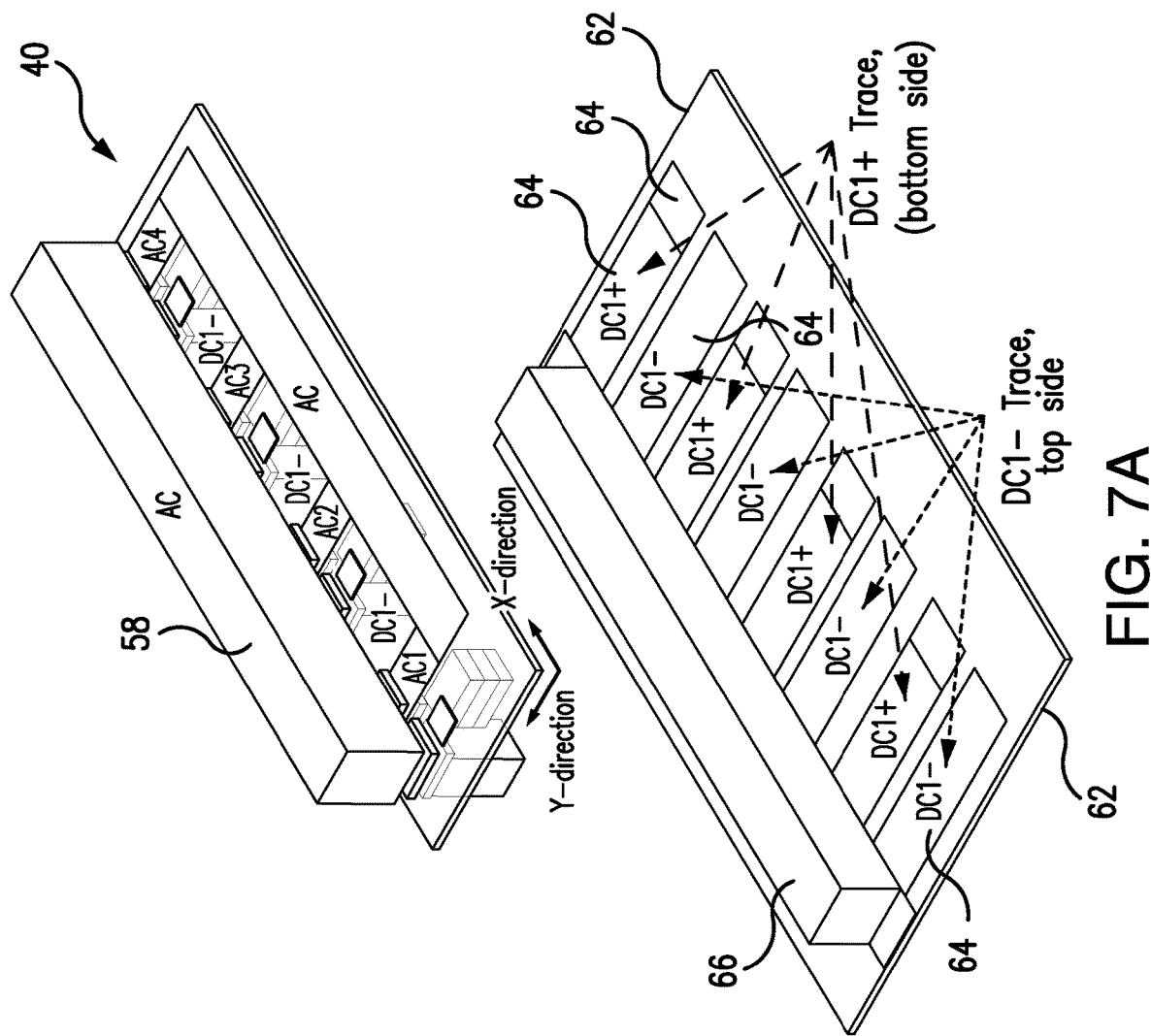
FIGS. 7A-7B show a parallel-switch module integrated with the interface board, with FIG. 7A showing the assembly view, and FIG. 7B showing the integration process.
Figure 7B:
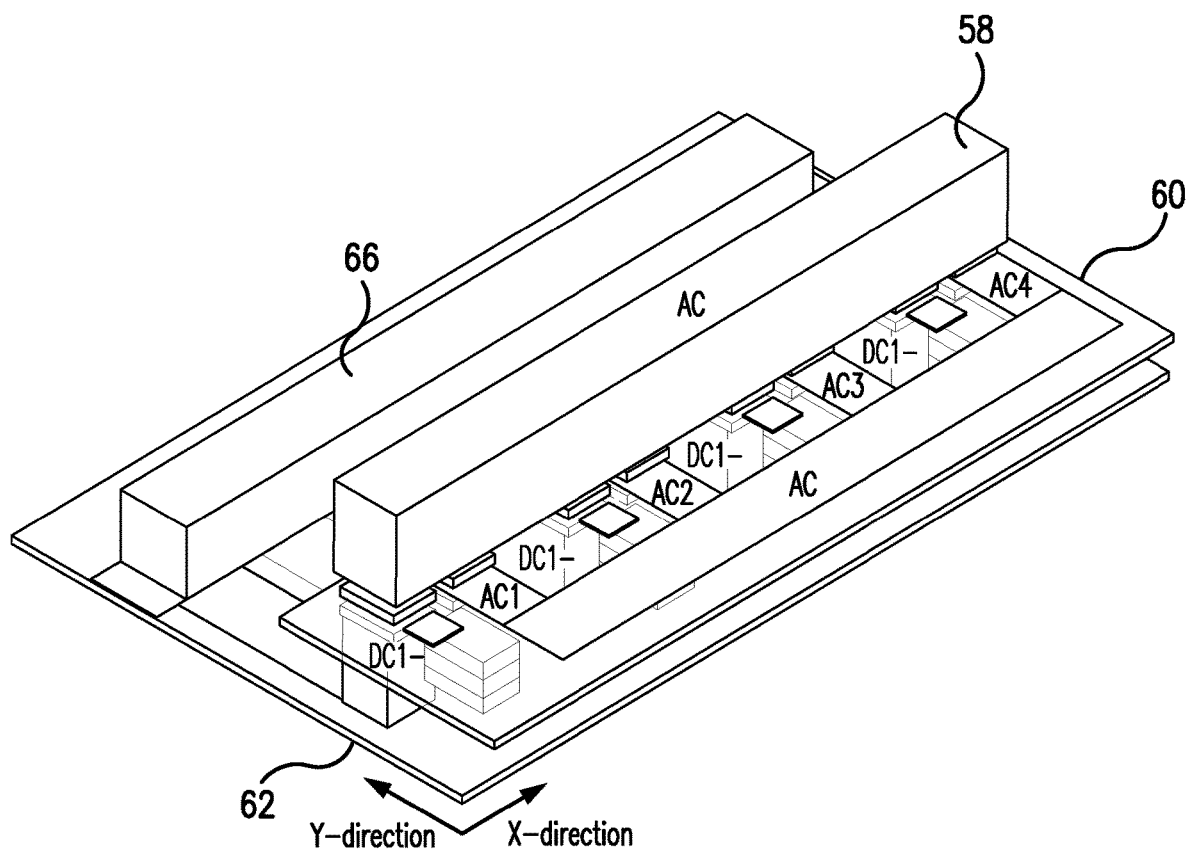

FIGS. 6A-6B illustrate the concept of expansion of the switch module 40 shown in FIGS. 5A-5C to a number N of the phase legs coupled in parallel. FIGS. 7A-7B depict formation of the hybrid assembly where the switch module 40 is integrated with the interface board 62 which is patterned with the conductive traces 64 for the DC nodes connections and has an input connector 66 attached to the conductive traces.

FIGS. 8A-8D, 9A-9B, and 10A-10B are representative of an alternative embodiment of the subject switch module built with a plurality of switch dies connected in parallel to compose a high current half-bridge configuration topology 70. As shown in FIGS. 5A-5C, 6A-6B and 7A-7B, the configuration of the switch module 40 places the switches in a single row on each side of the main PCB assembly 60 with the main advantage of this layout being completely symmetric power loop inductances. The alternative layout of the switch module 70 illustrated in FIGS. 8A-8D, 9A-9B, and 10A-10B places the switch dies in units of several full bridges with each full bridge built of four switches S1, S2, S3, S4 and S5, S6, S7, S8, respectively, each including two high side switches and two low side switches. Specifically, as presented in FIGS. 8A-8D, the switches S1, S2, S3, and S4 are combined in a full-bridge unit 72. The switches S5 and S6, S7, and S8 are combined in another full-bridge unit 73. The AC1 bus-bar is formed between the switches S1 and S2, and the AC2 bus-bar is formed between the switches S3 and S4. Similarly, the AC3 bus-bar is formed between the switches S3 and S6, and the AC4 bus-bar is formed between the switches S7 and S8.

Switches S1 and S2 form a phase-leg 74, switches S3, S4 form the phase-leg 76, switches S5 and S6 form the phase-leg 78, and switches S7, S8 form the phase-leg 80. Each phase-leg 74, 76, 78 and 80 includes a corresponding capacitor 82, 84, 86, and 88, respectively. Each capacitor is coupled between the respective switches in each phase-leg. One end of each phase-leg is coupled to the DC1+ bus-bar, and another end of each phase-leg is coupled to the DC1− bus-bar.

A common AC bus-bar 90 is coupled to bus-bars AC1, AC2, AC3, and AC4 as shown in FIGS. 8A-8D. As shown in the top view in FIG. 8C, the whole topology is divided into four phase legs 74, 76, 78, and 80, with phase-legs 74,76,78 and 80 including gate drivers 92, 94, 96, and 98, respectively. An array of the spacers 100 are positioned between a respective side of the main PCB assembly 71 and a corresponding component such as AC bus-bars or DC1−, DC1+ bus-bars on either side of the main PCB assembly 71. The capacitors 82, 84, 86, and 88 are affixed to the DC1− and Dc 1+ bus-bars in a respective phase-leg.

Figure 8A:
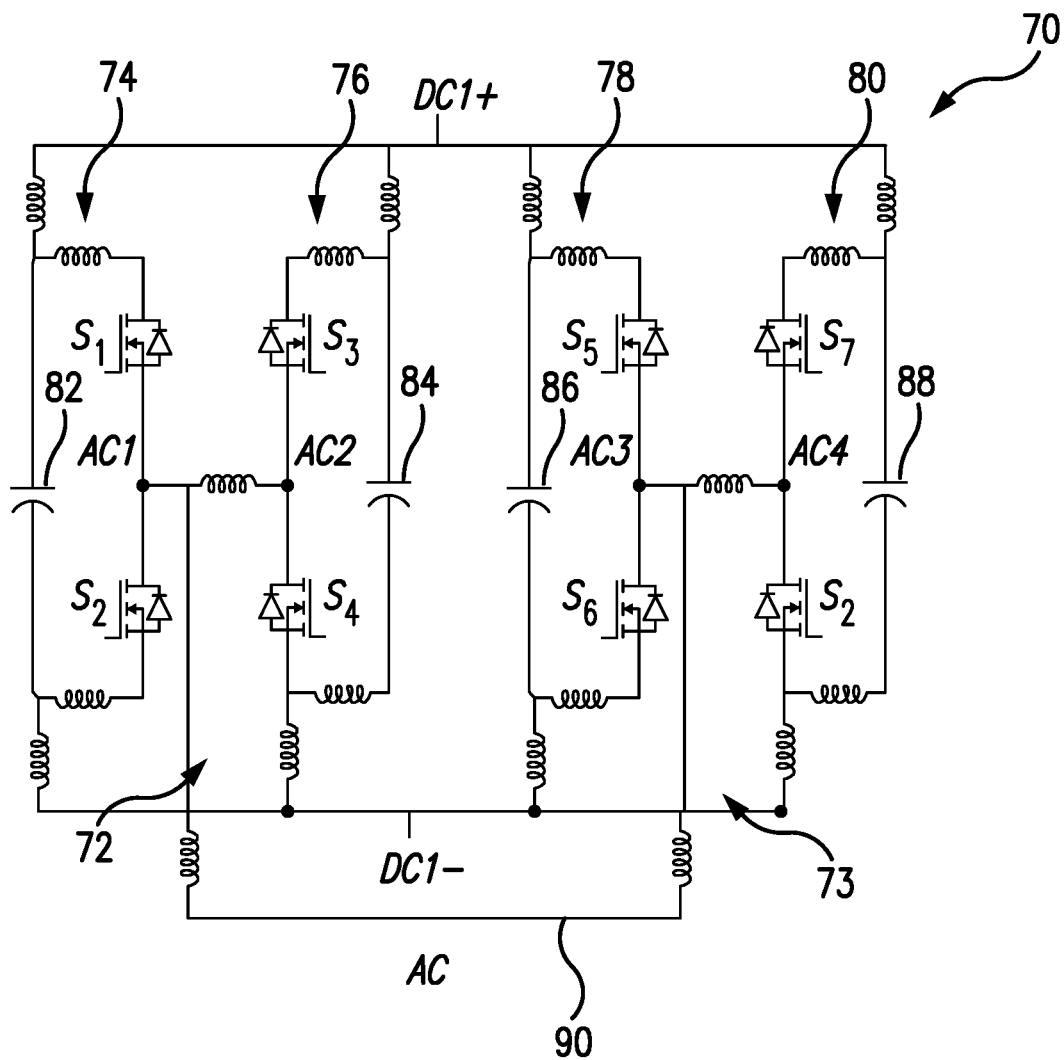
FIGS. 8A-8D are representative of a subject alternative parallel switch module configuration for the high-current half-bridge topology with FIG. 8A showing a schematic of the subject module, FIG. 8B being an isometric view of the subject module, FIG. 8C showing the top view, and FIG. 8D showing a front view of the subject module.
Figure 8B:
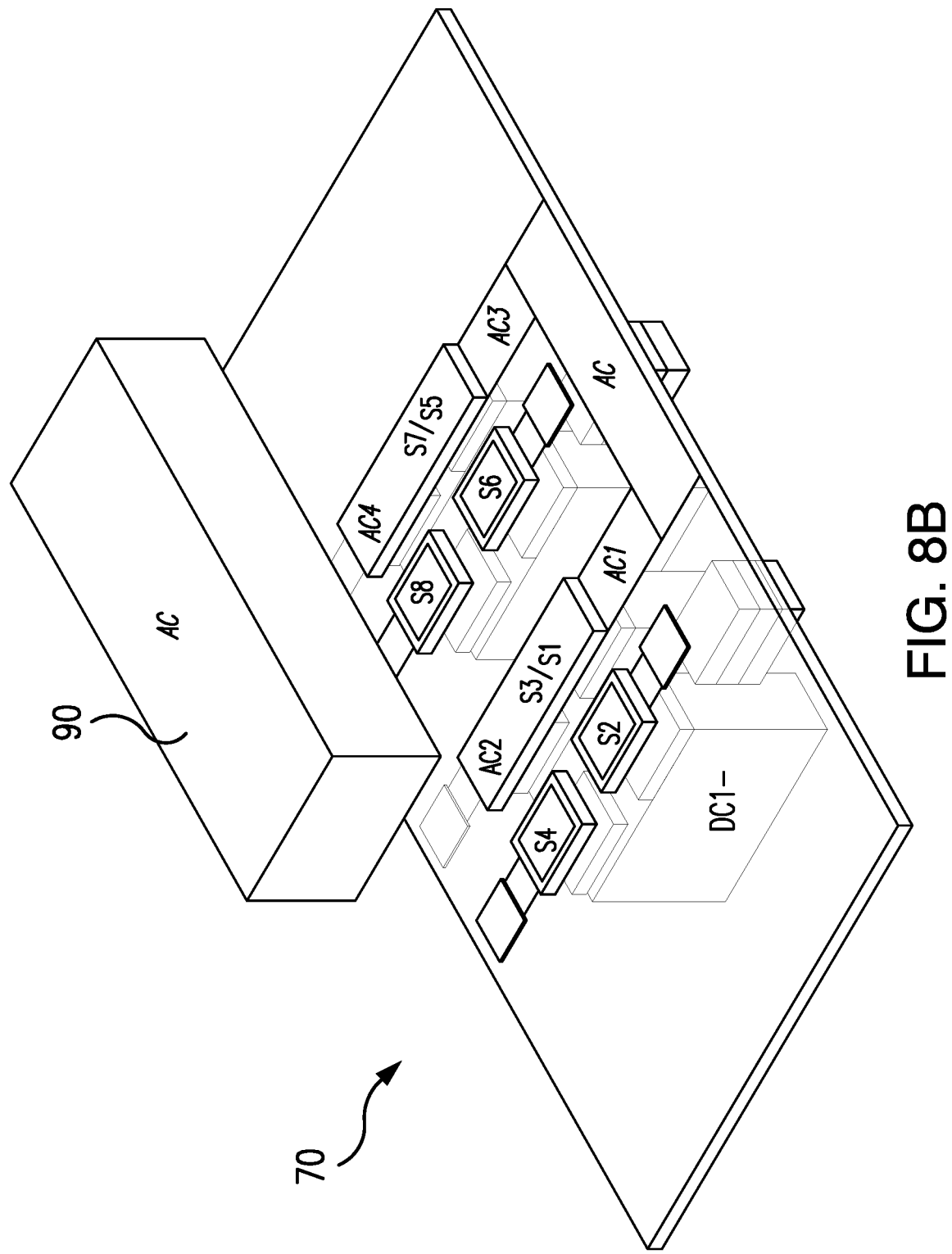
Figure 8C:
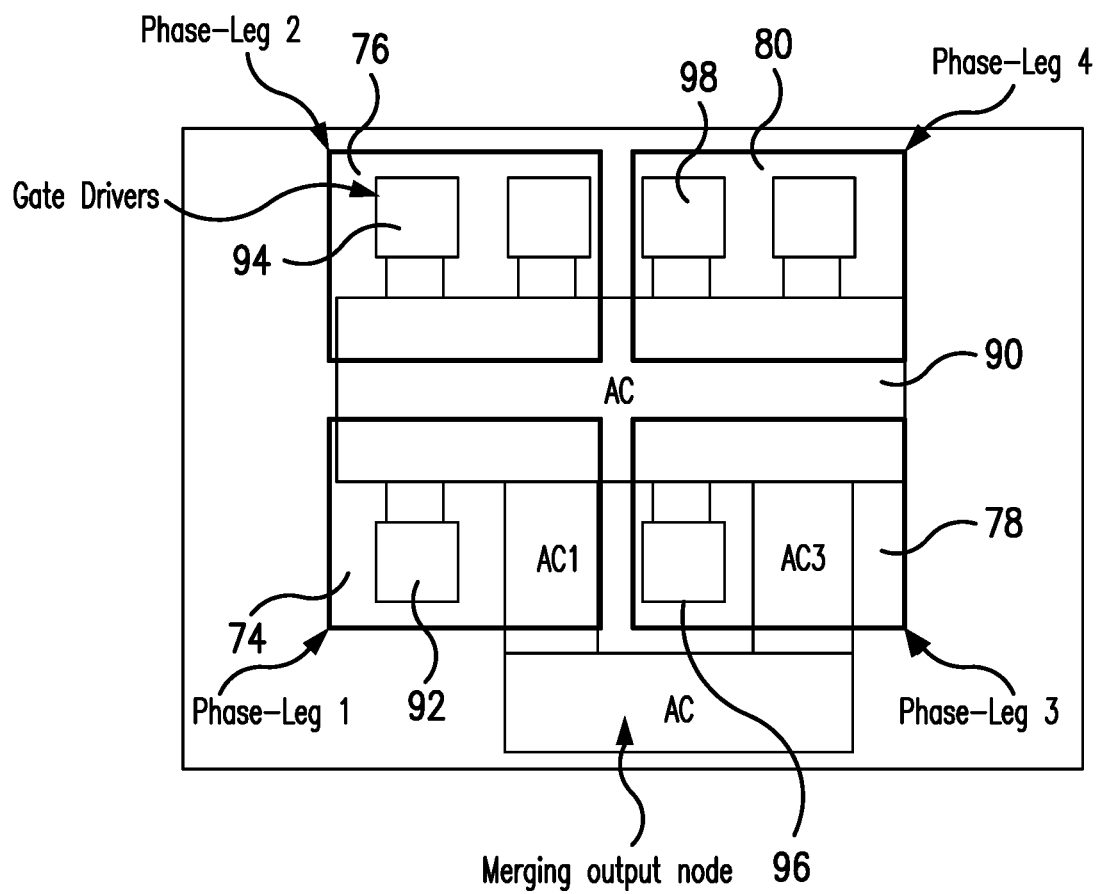
Figure 8D:
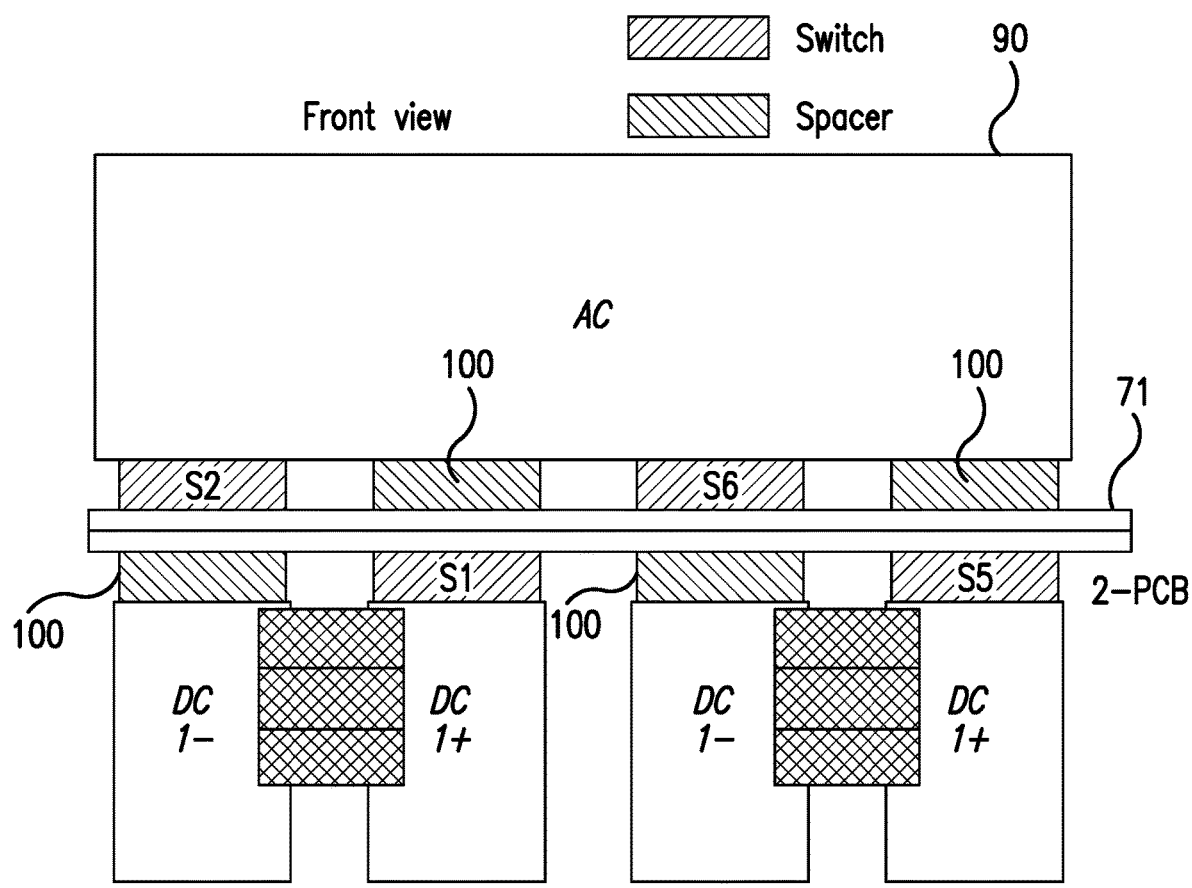
Figure 9A:
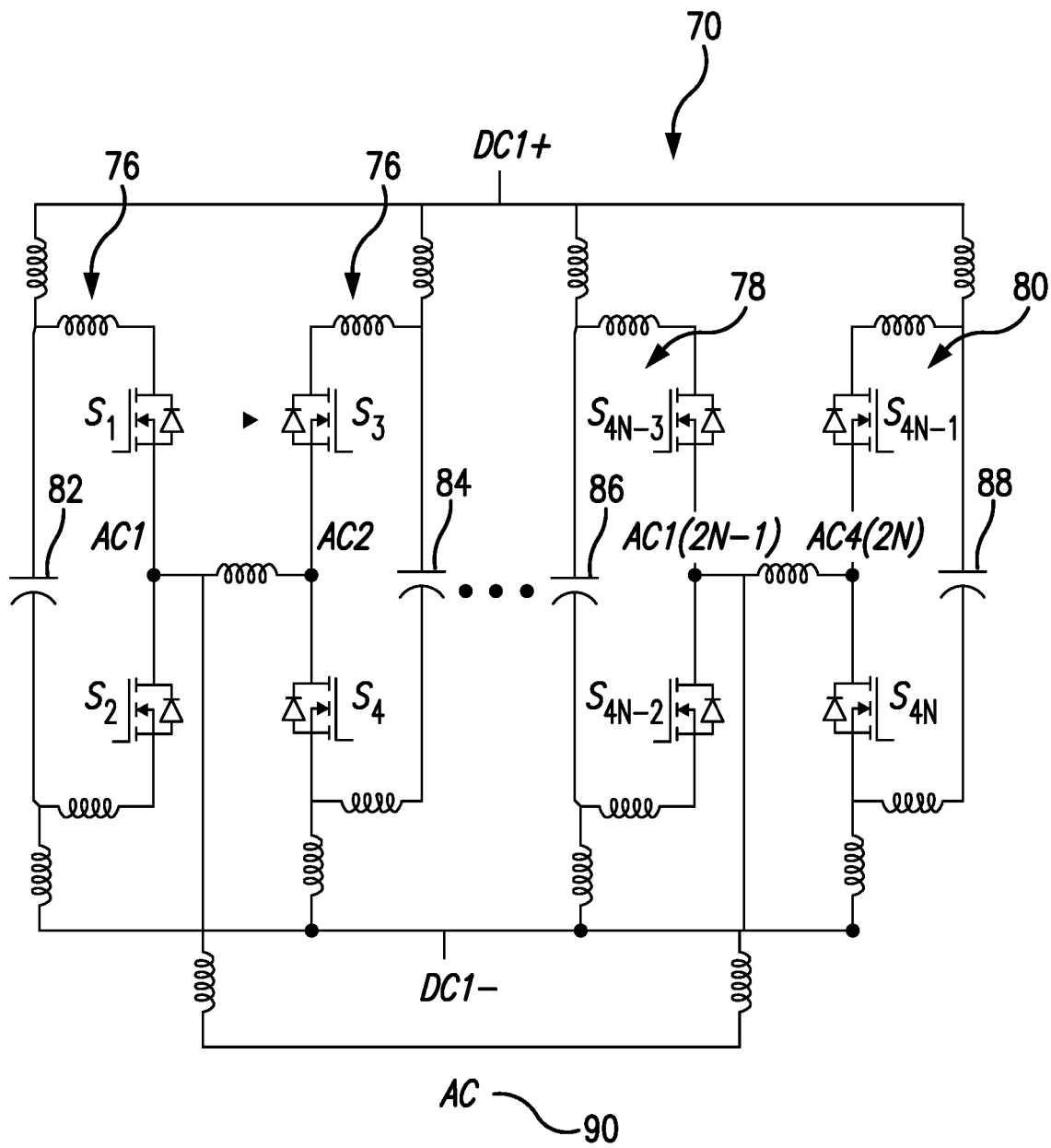
FIGS. 9A-9B are representative of the concept of expansion of the structure module shown in FIGS. 8A-8D to N phase-legs connected in parallel, with FIG. 9A being a schematic diagram of the subject module, and FIG. 9B being a front view of the expanded N-numbered parallel-switch subject module.
Figure 9B:
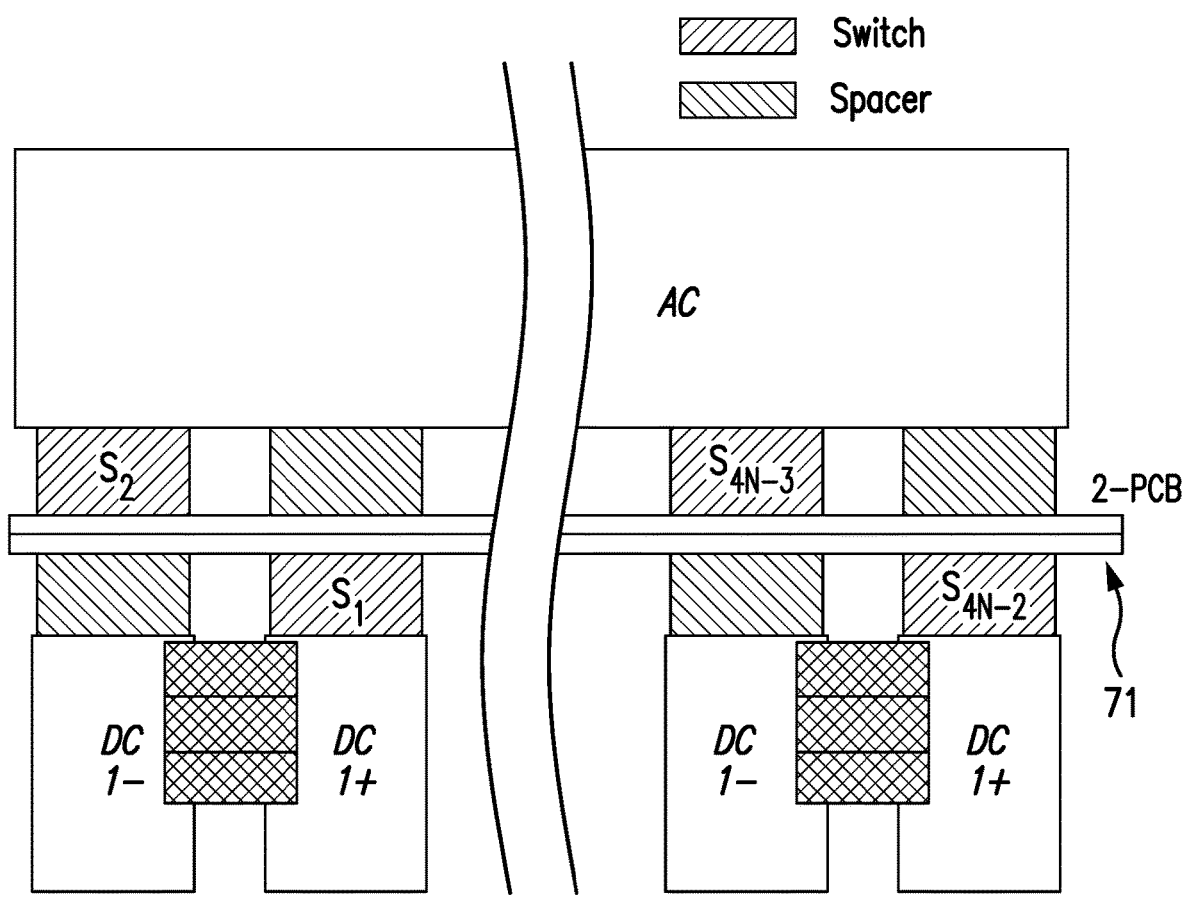
Figure 10A:
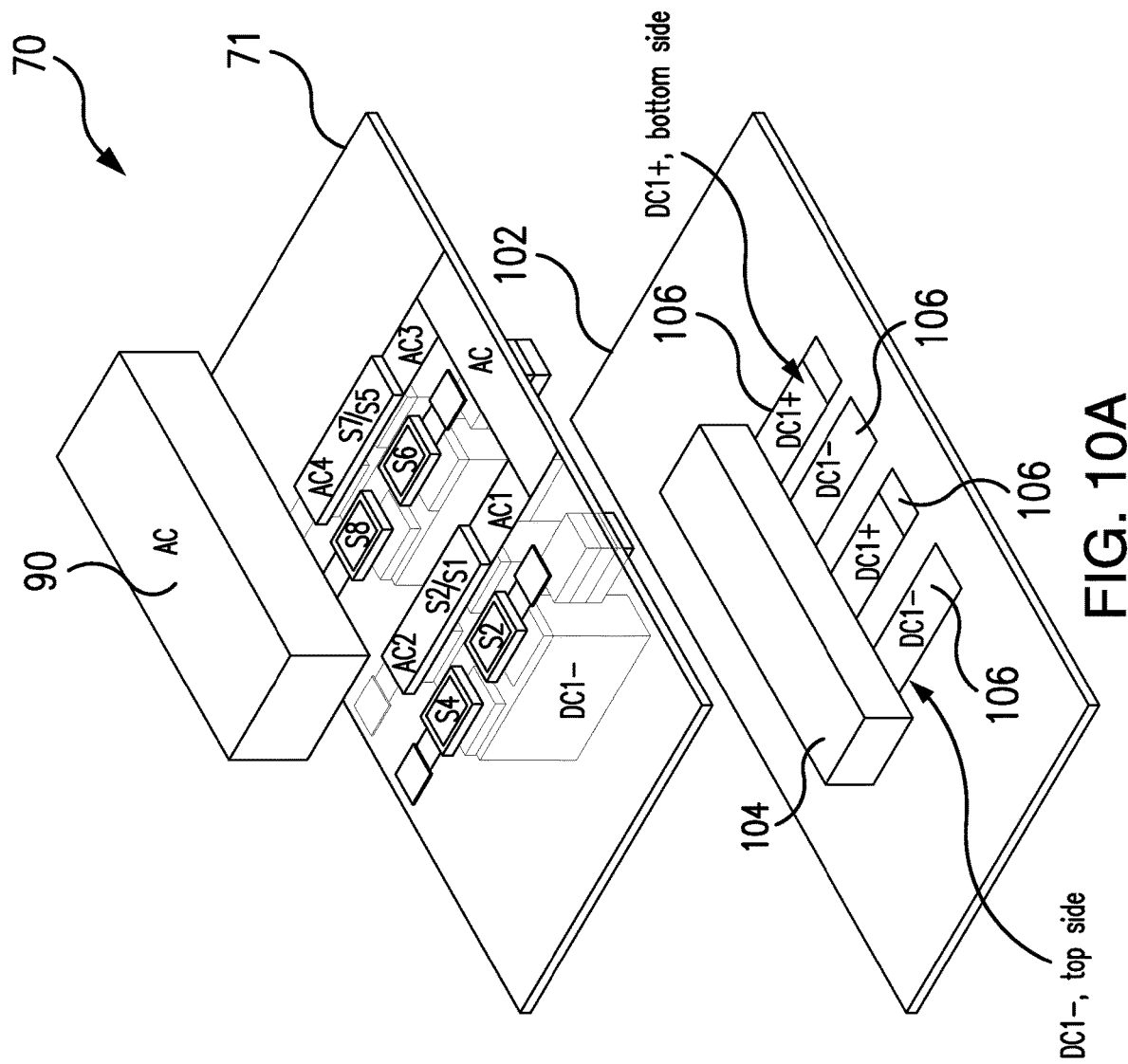
FIGS. 10A-10B show the parallel switch module of FIG. 8A integrated with the interface board with FIG. 10A being an assembly view, and FIG. 10B showing the resulting integrated structure.
Figure 10B:
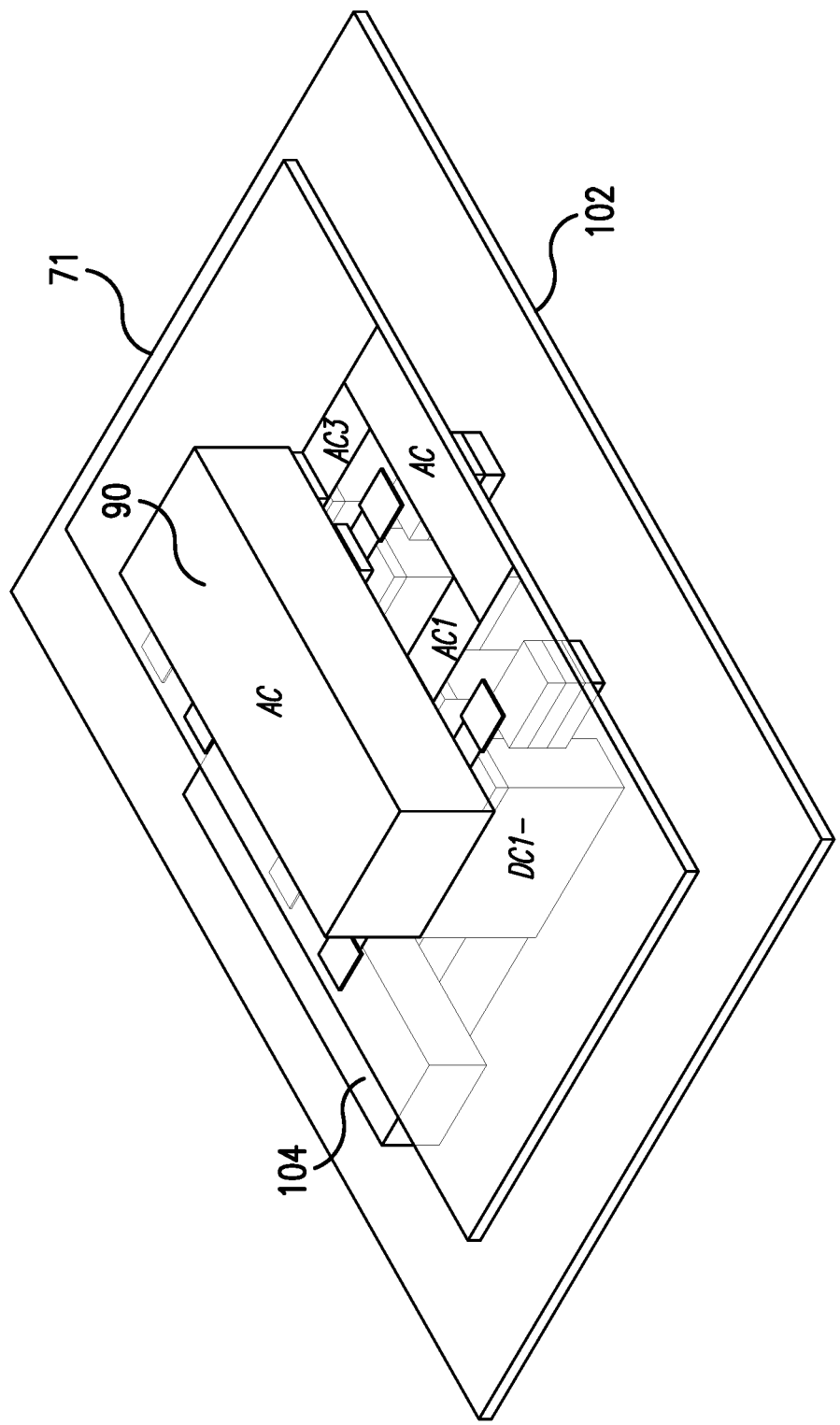

Shown in FIGS. 9A-9B is the concept of expansion of the switch module configuration 70 shown in FIGS. 8A-8D to a number N of the phase-legs connected in parallel. FIGS. 10A-10B show the switch module configuration 70 of FIGS. 8A-8D integrated with the interface board 102 carrying the input connector 104 and an array of connection pads/traces 106 for DC1− and DC1+ terminals which are brought in alignment with corresponding components on the main PCB assembly 71 when integrated one with another, as shown in FIG. 10B. This approach is more area efficient because the switch dies are placed in two rows (a row of the switch dies S2, S4 and a row of the switch dies S6, S8 at the top of the main PCB assembly 71) as best shown in FIGS. 8B, 8C, and 10A. Similarly, the two rows topology is formed for the lower side of the main PCB assembly 71.

The tradeoff of this design is that the power loop inductances are not completely symmetric. To be specific, as illustrated in FIGS. 8A-8D, the second phase-leg 76 and the fourth phase-leg 80 are slightly far from the common AC node 90, as compared with the first phase-leg 74 and the third phase-leg 76.

Similar to the other topologies presented in the present disclosure, the principles presented in previous in conjunction with FIGS. 1A-1D are utilized in the embodiments shown in FIGS. 8A-8D, 9A-9B and 10A-10B.

Figure 11A:
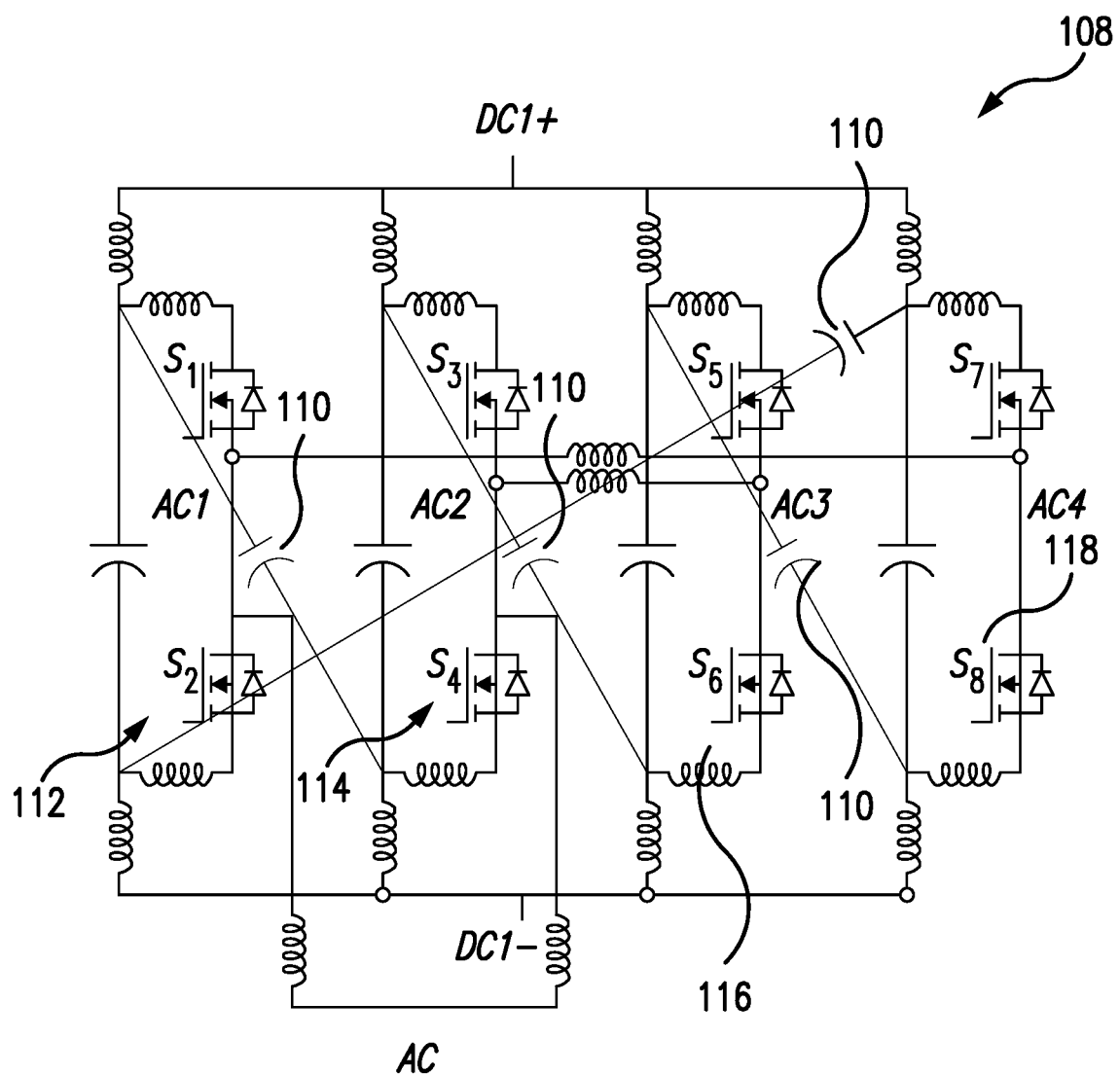
FIGS. 11A-11C show an alternative embodiment of the subject module, with parallel switch module configuration for a high-current half-bridge topology with FIG. 11A being a schematic of the subject module, FIG. 11B being an isometric view, and FIG. 11C showing a front view of the subject module.
Figure 11B:
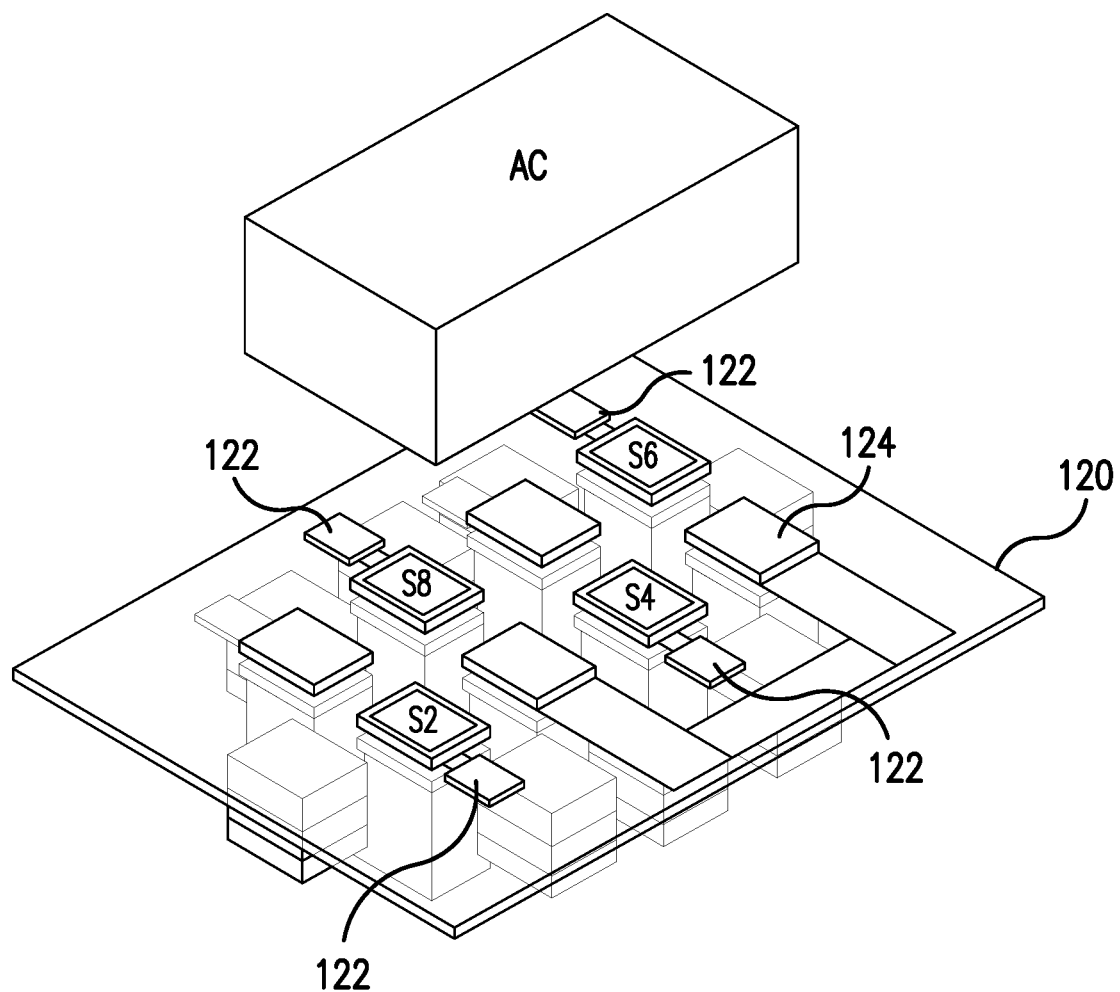
Figure 11C:
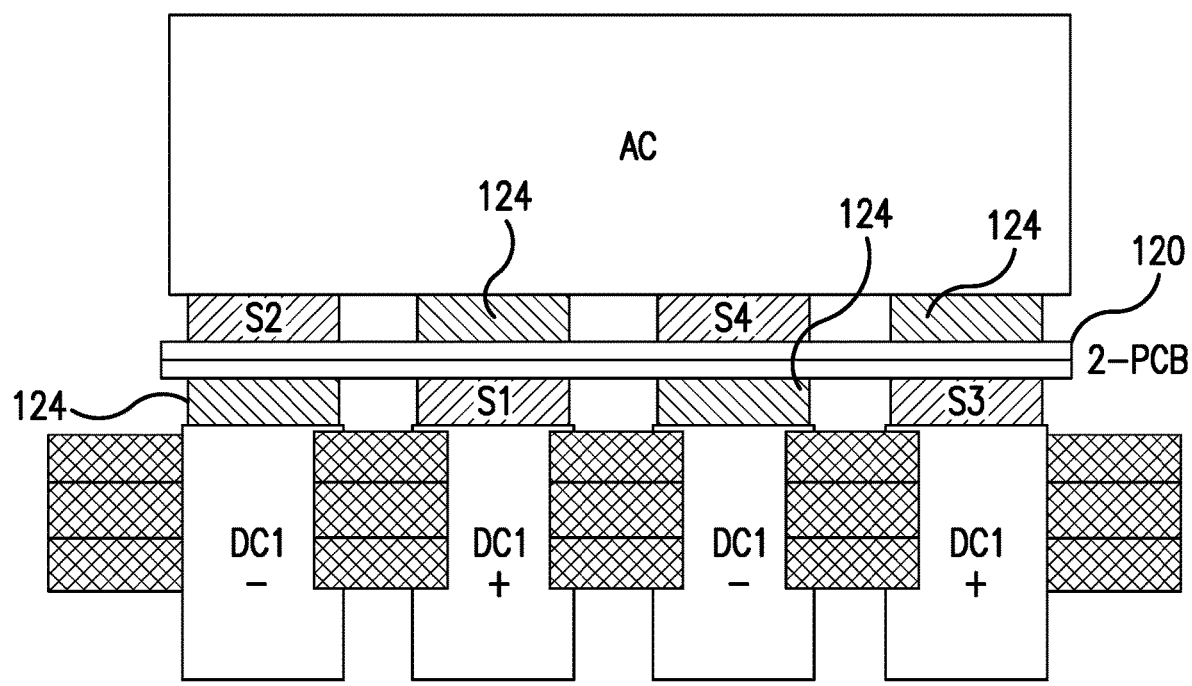

Another alternative layout for the parallel connection of switch dies in a half-bridge configuration 108 is shown in FIGS. 11A-11C. The switch module configuration 108 may be considered as a folded form of the switch module configuration 40 shown in FIGS. 5A-5C. The layout 108 accommodates additional decoupling capacitors 110 between the two adjacent of the phase-legs 112,114,116,118, thereby significantly enhancing switching performance. A demerit of this design is that the parasitic inductances are not completely symmetric.

The topology of placing the switches S2, S8, S4, and S6 on the top of the main PCB assembly 120 is shown in FIG. 11B, with gate drivers 122 fabricated in proximity to each corresponding switch module. The front view of the configuration shown in FIG. 11C shows the topology of the lower side of PCB 120 with the switches S1 and S3 visible on the front view and with the array of spacers 124 fabricated between the corresponding side of the main PCB assembly 120 and the AC and DC bus-bars.

Figure 16A:
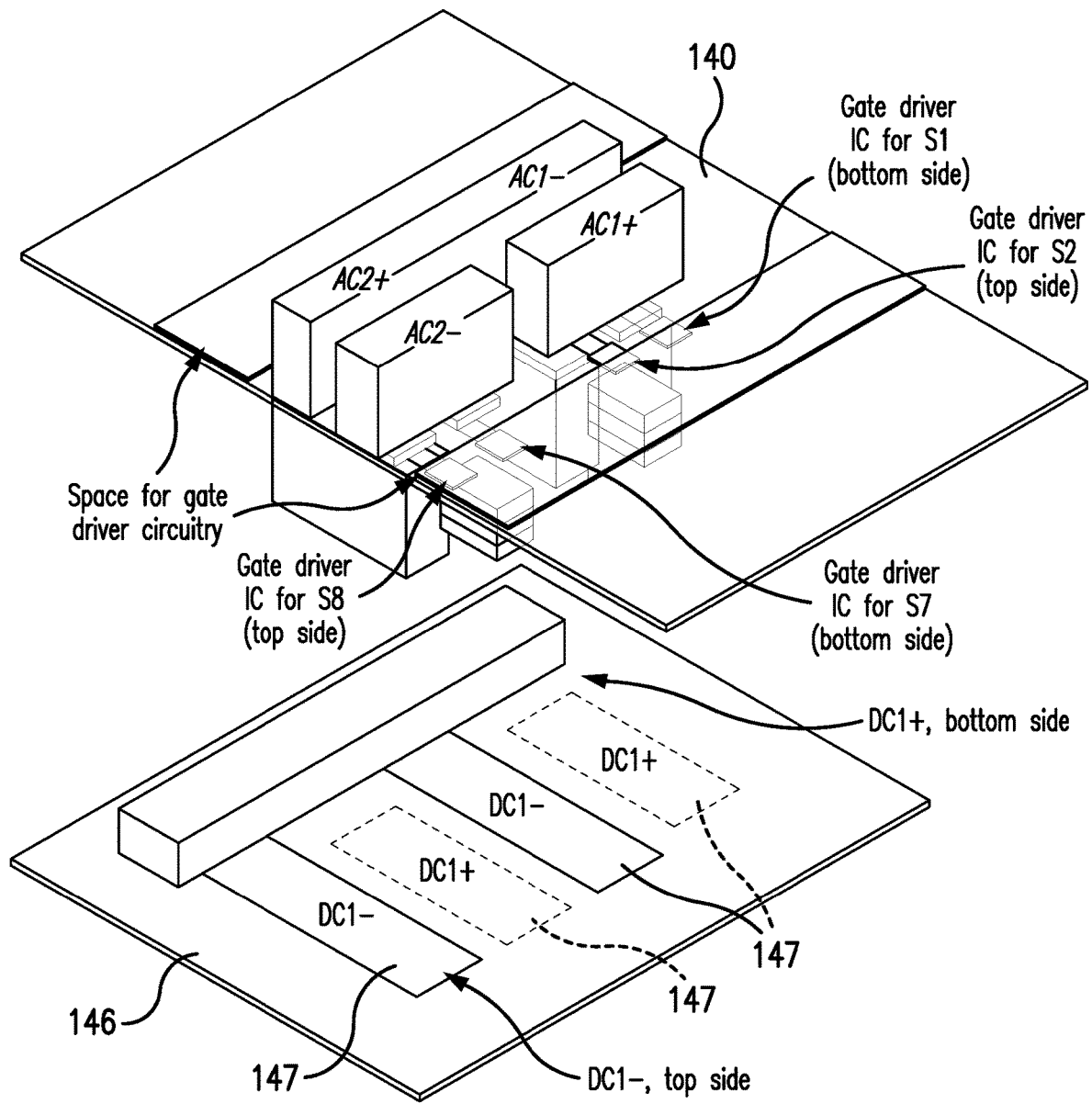
FIGS. 16A-16B show the subject full-bridge MMC module of FIGS. 14A-14C and 15A-15C integrated with the interface board, where
Figure 16B:
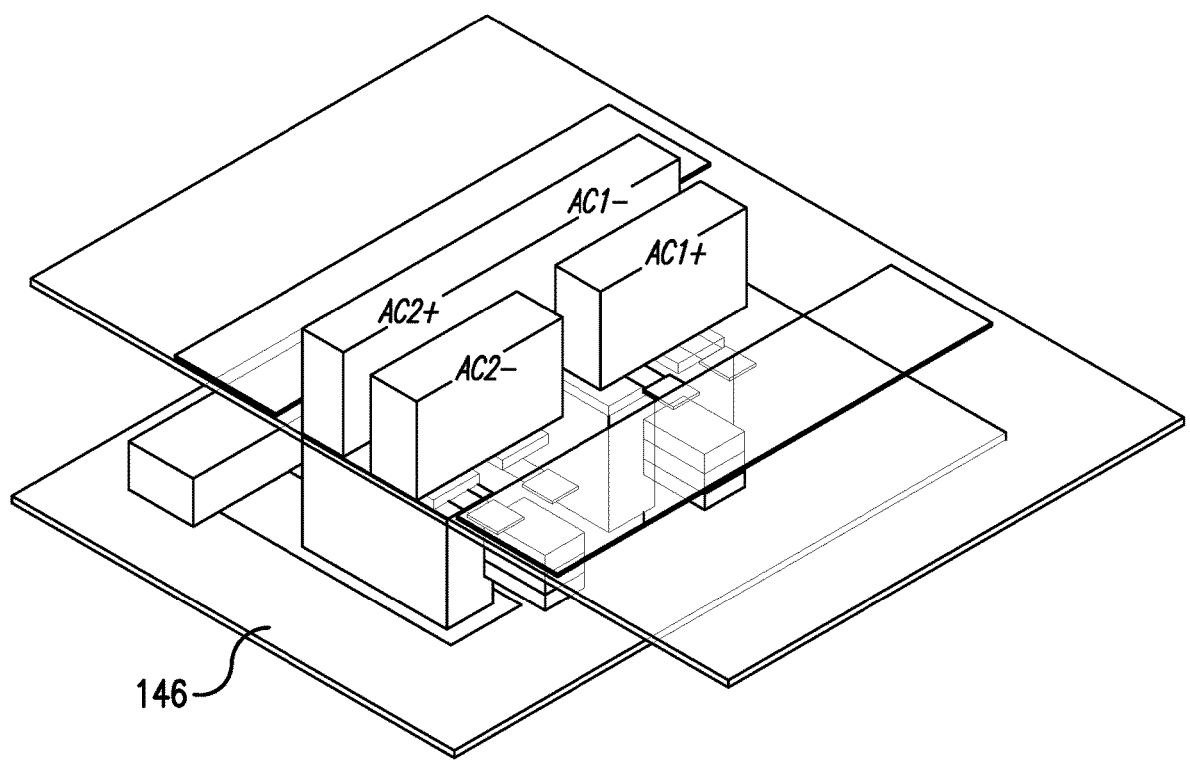
Figure 17A:
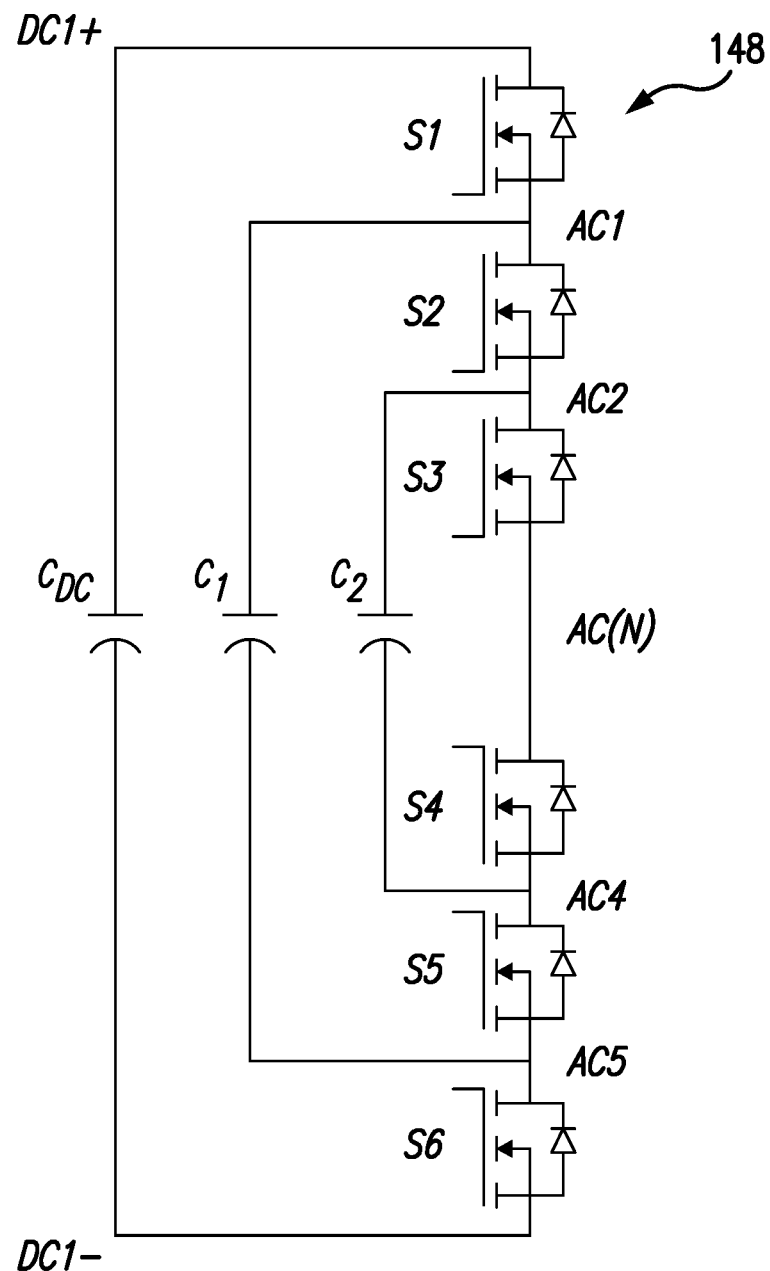
FIGS. 17A-17C show an alternative subject switch configuration and assembly for a switched-capacitor converter topology with FIG. 17A showing a schematic of the switched-capacitor converter, FIG. 17B being an isometric view of the switched-capacitor converter, and FIG. 17C showing a simplified front view of the switched-capacitor converter.
Figure 17B:
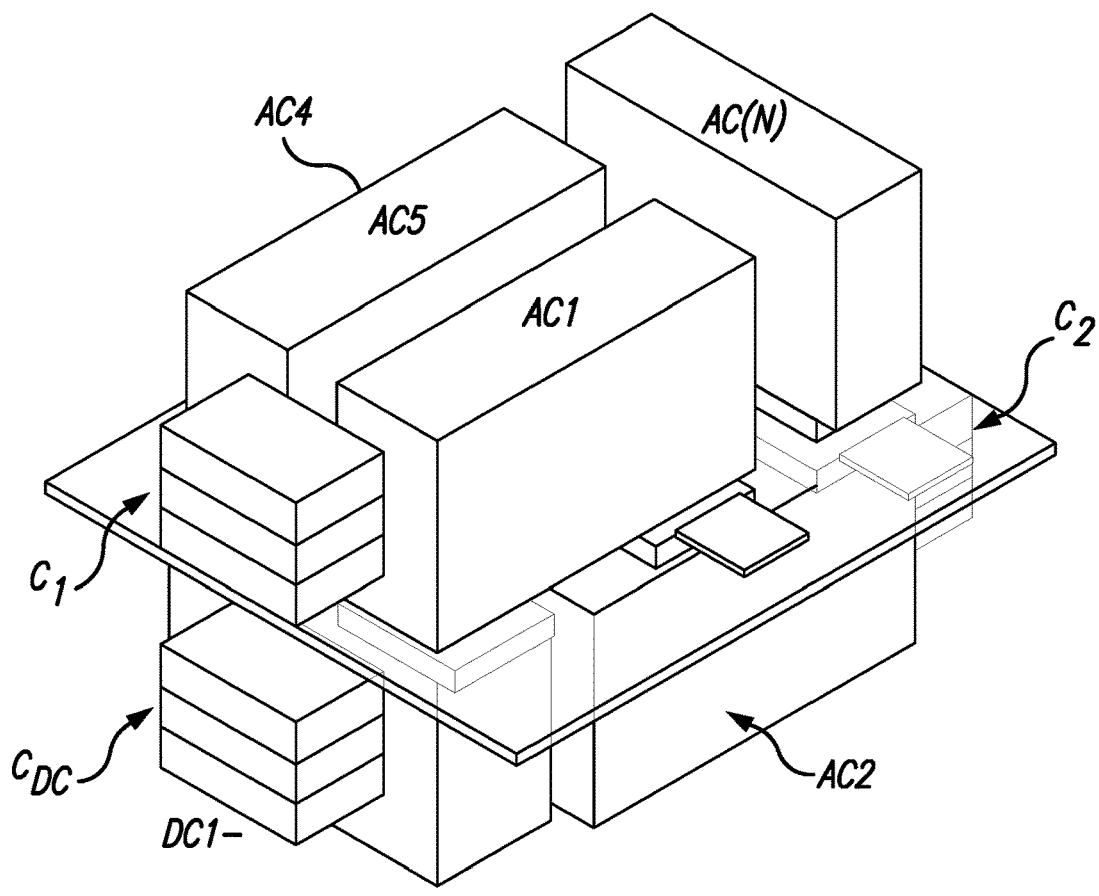
Figure 17C:
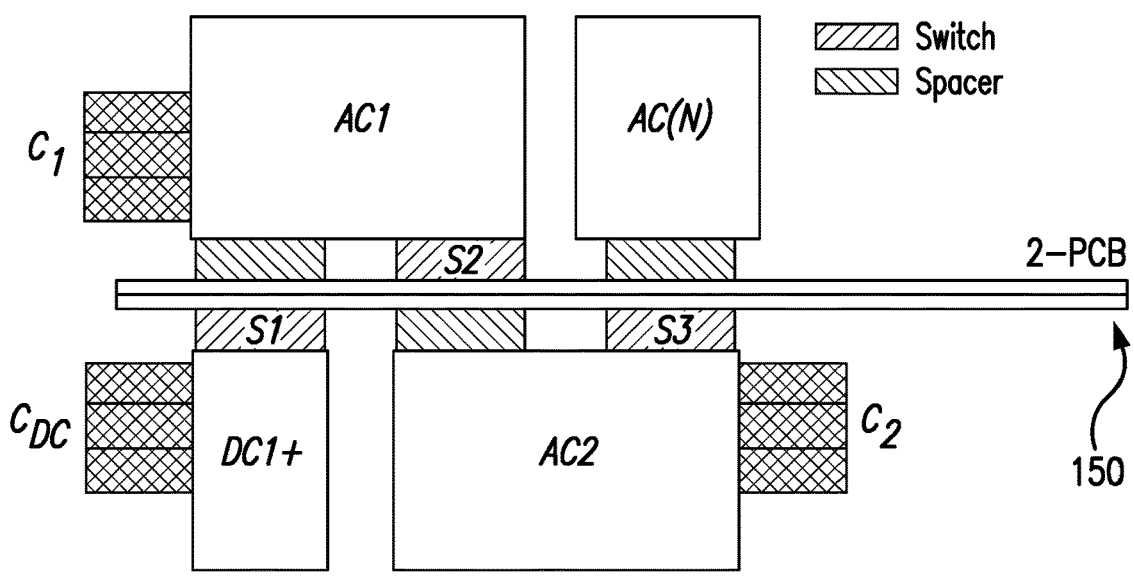

FIGS. 12A-12C, 13A-13B, 14A-14C, 15A-15C, 16A-16B, and 17A-17C show multilevel converter structures. The multilevel converter structures presented herein are configured as modular multilevel converters (MMC) in FIGS. 12A-12C, 13A-13B for a half-bridge MMC 128, and FIGS. 14A-14C, 15A-15C, 16A-16B for a full-bridge configuration 129. The switches in the half-bridge MMC 128 are connected through the copper trace 132 on the board and/or inner layers of the main PCB assembly 130. The switches for the full-bridge MMC 129 have a common node between successive bridges formed through sharing of the AC node of the MFCs. Shown in FIGS. 17A-17C is a flying capacitor multilevel converter 148 having an interconnection of the switch dies forming a multi-level switched-capacitor converter. Additional flying capacitors are attached across the corresponding MFCs.

FIGS. 12A-12C and 13A-13B are representative of the half-bridge MMC 128 formed on the main PCB assembly 130. The half-bridges 135,137 in the half-bridge MMC 128 are connected through the copper trace 132 fabricated on both outer sides of the main PCB assembly 130 and/or the inner layers between the PCBs 131 and 133 forming the main PCB assembly 130.

Figure 12A:
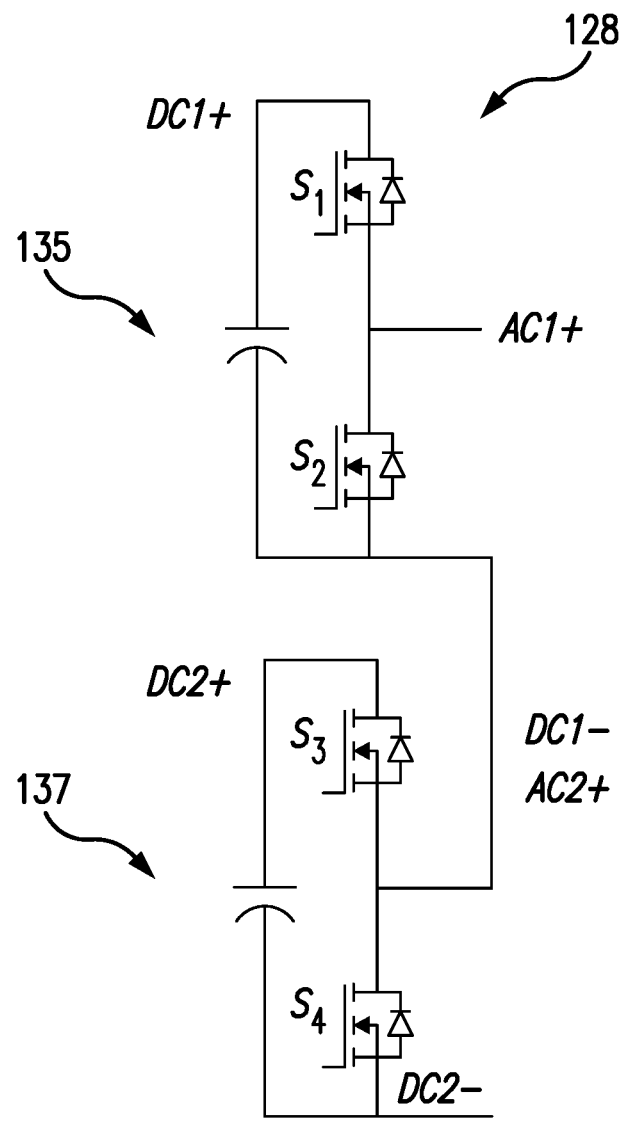
FIGS. 12A-12C show the subject half-bridge MMC configuration, with FIG. 12A being schematic, FIG. 12B being an isometric view, and FIG. 12C being a front view of the half-bridge MMC.
Figure 12B:
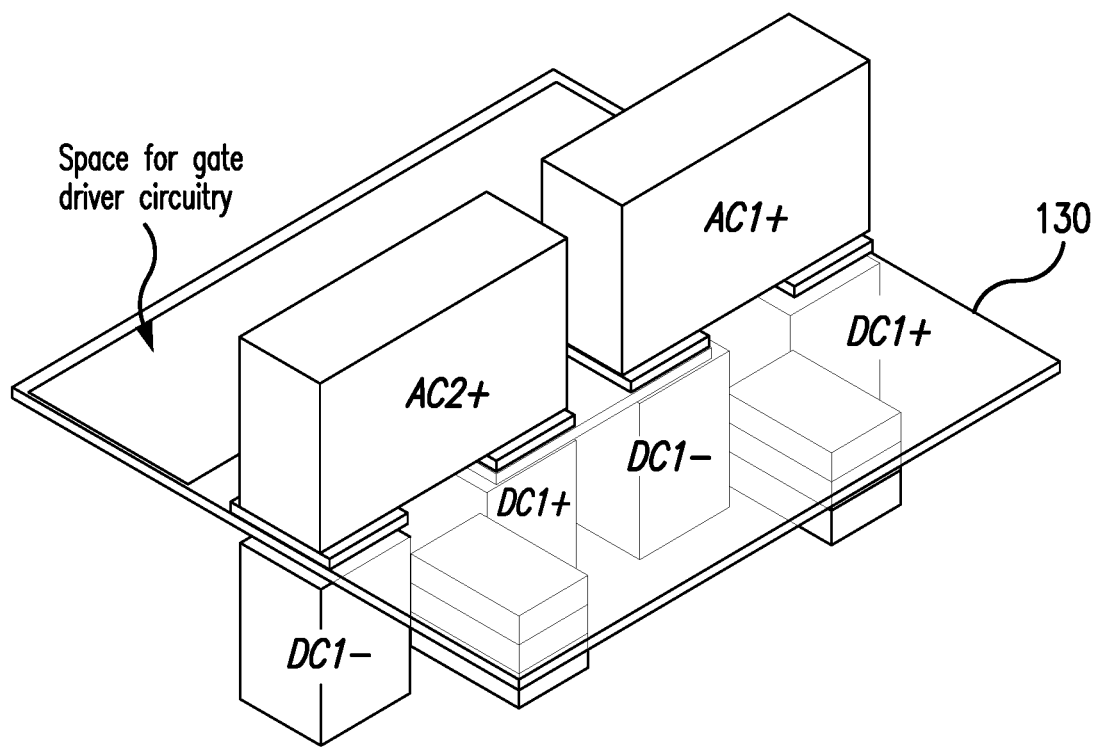
Figure 12C:
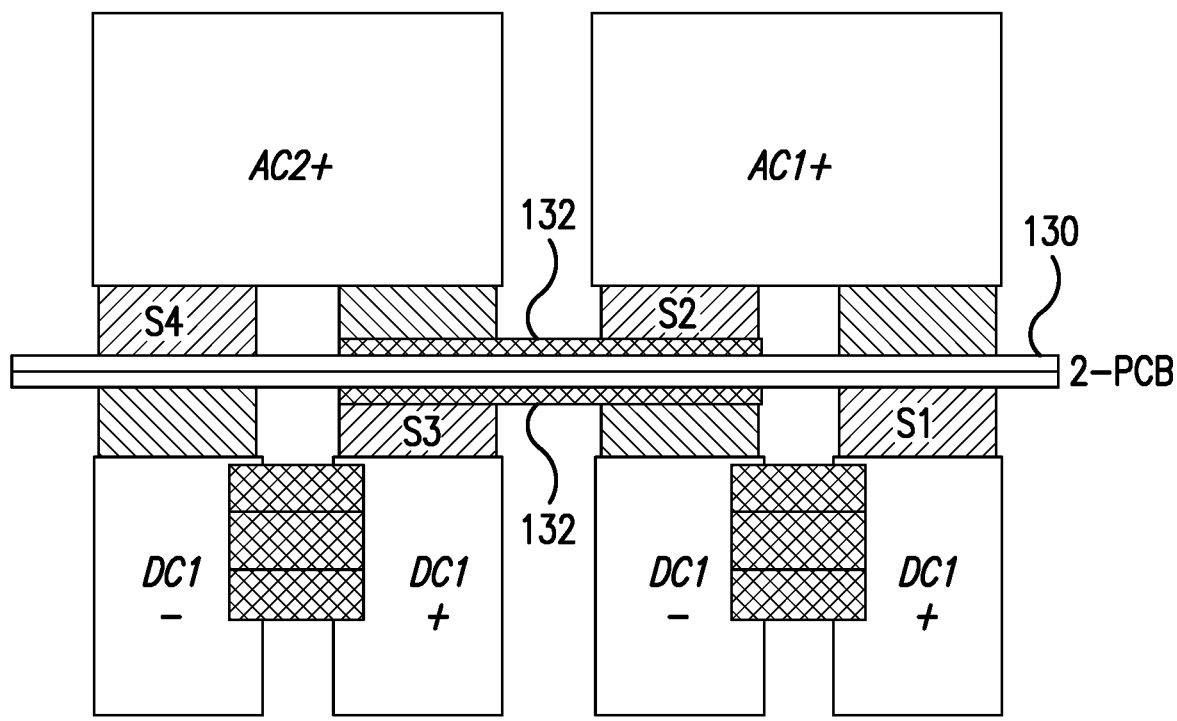
Figure 13A:
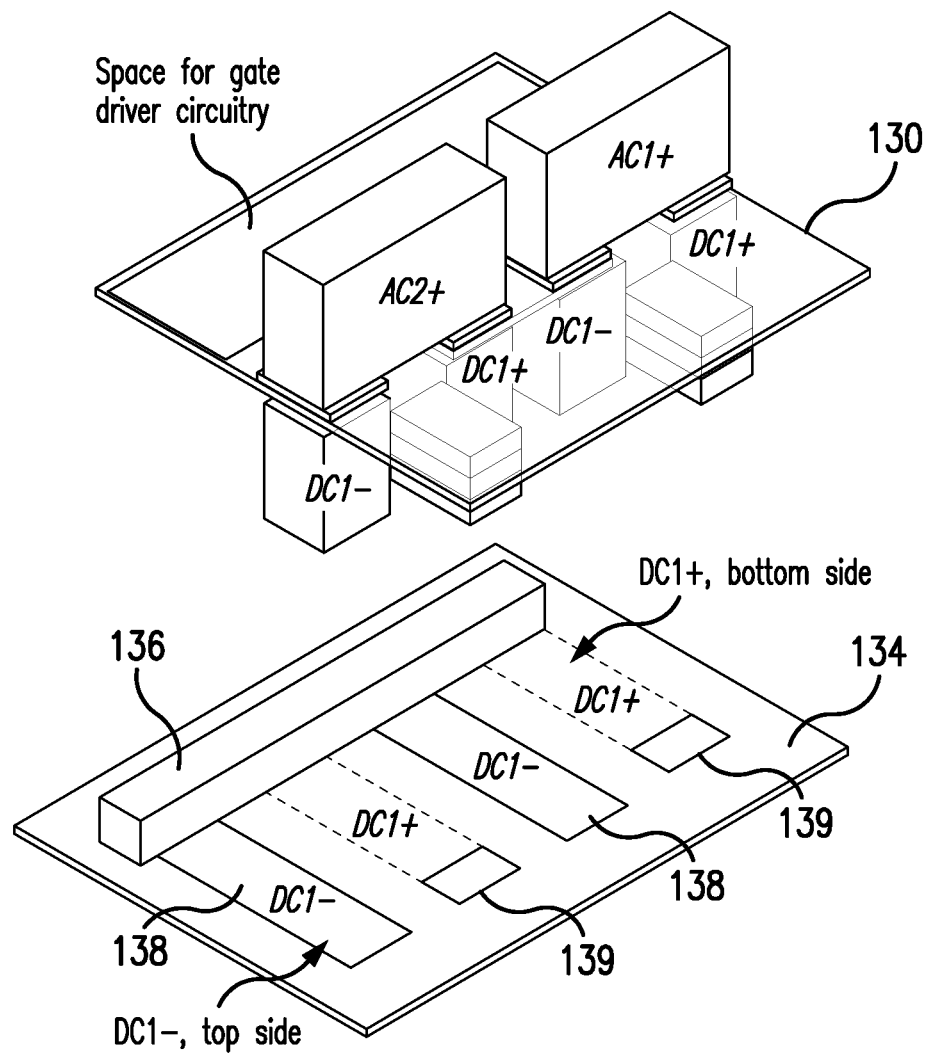
FIGS. 13A-13B show the half-bridge MMC of FIGS. 12A-12C integrated with the interface board, where
Figure 13B:
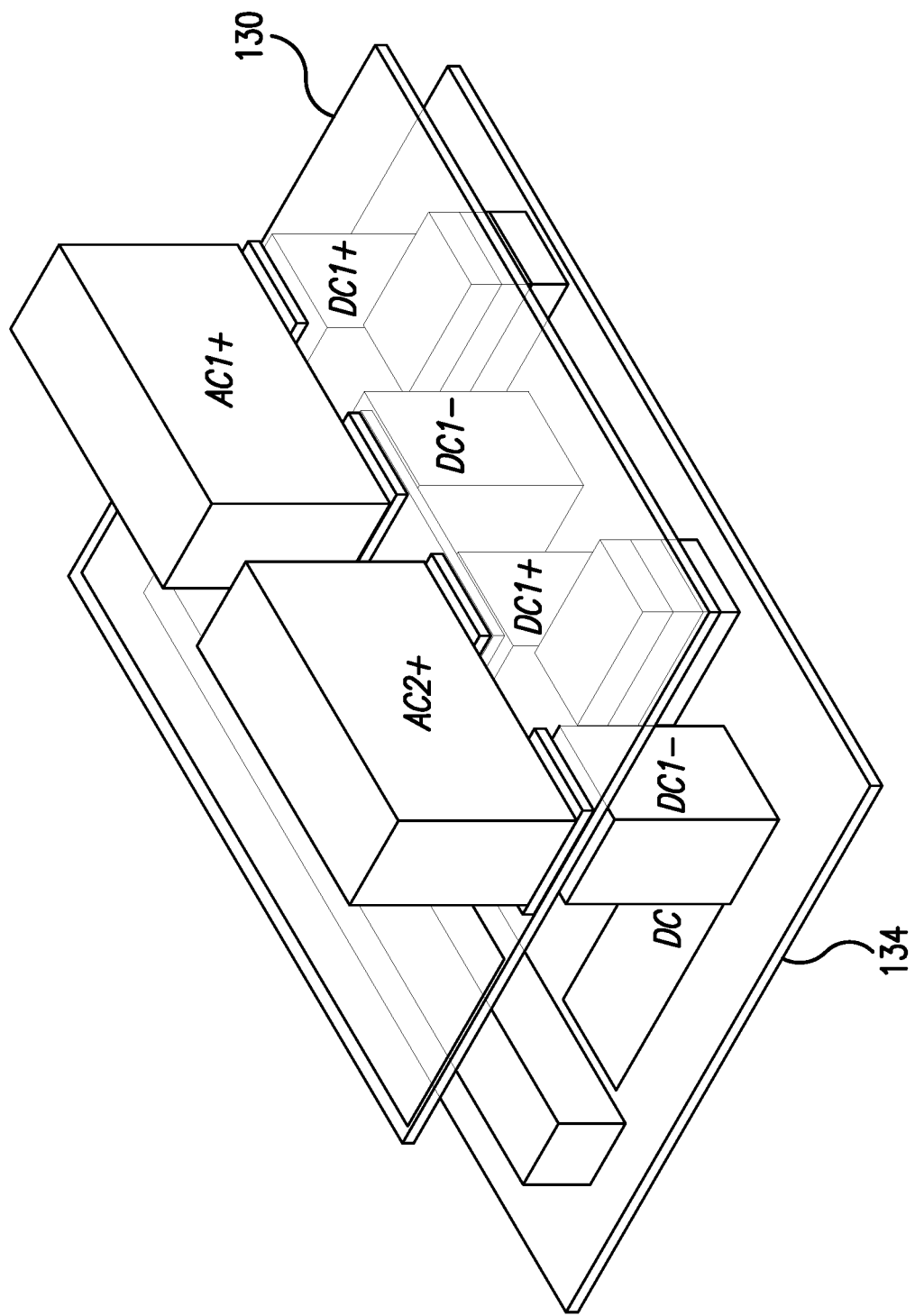
Figure 14A:
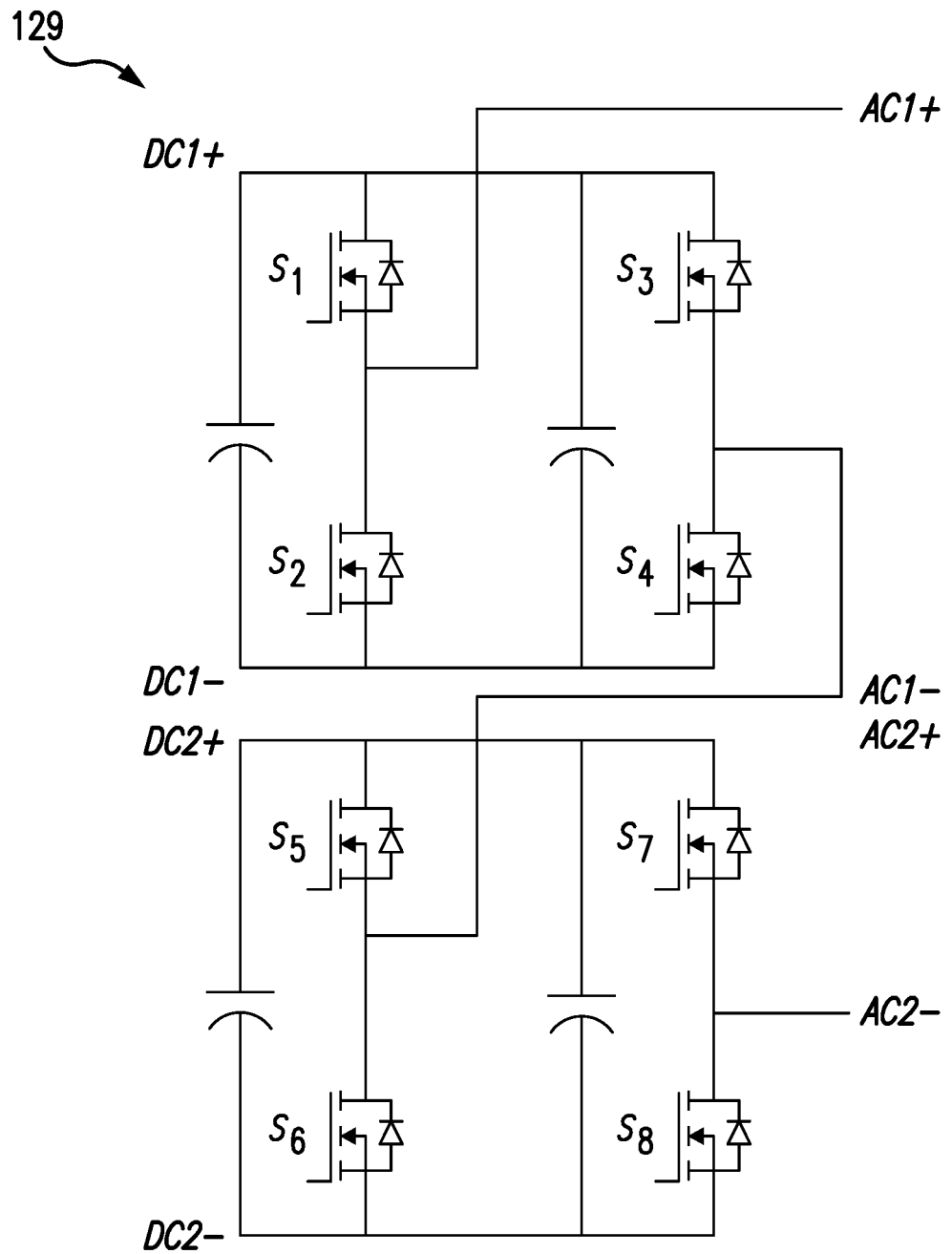
FIGS. 14A-14C show the subject switch configuration for two-series connected full-bridge MMC modules, with FIG. 14A being a schematic of the subject module, FIG. 14B showing a front view of the subject module, and FIG. 14C being an isometric view of the subject module.
Figure 14B:
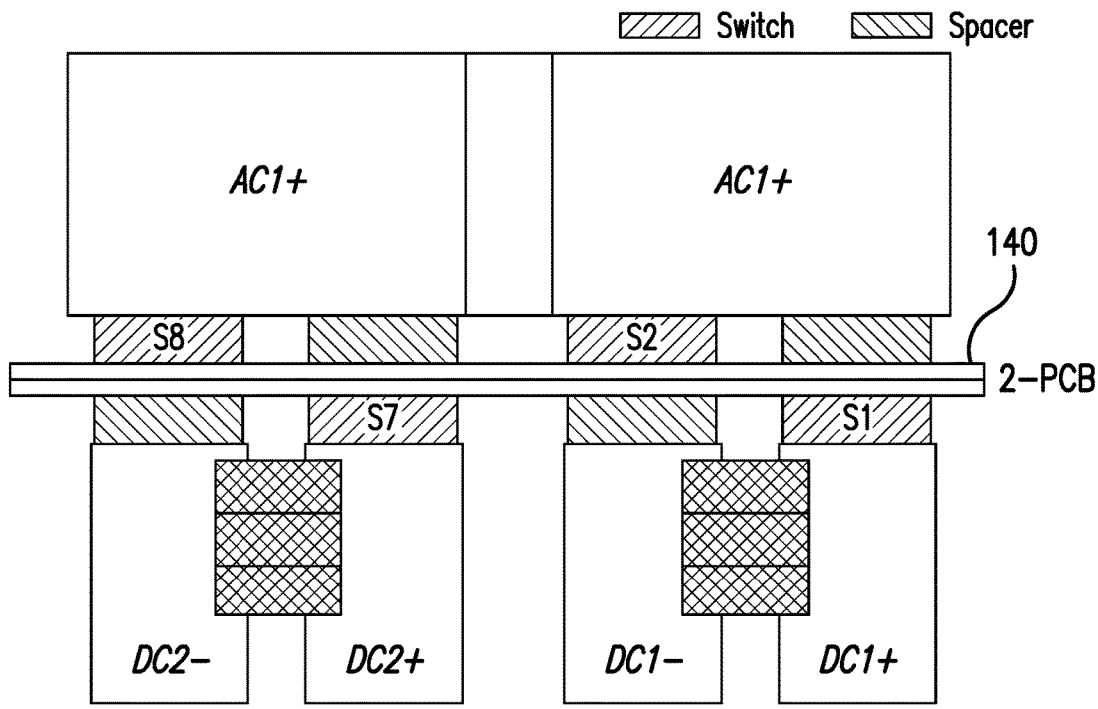
Figure 14C:
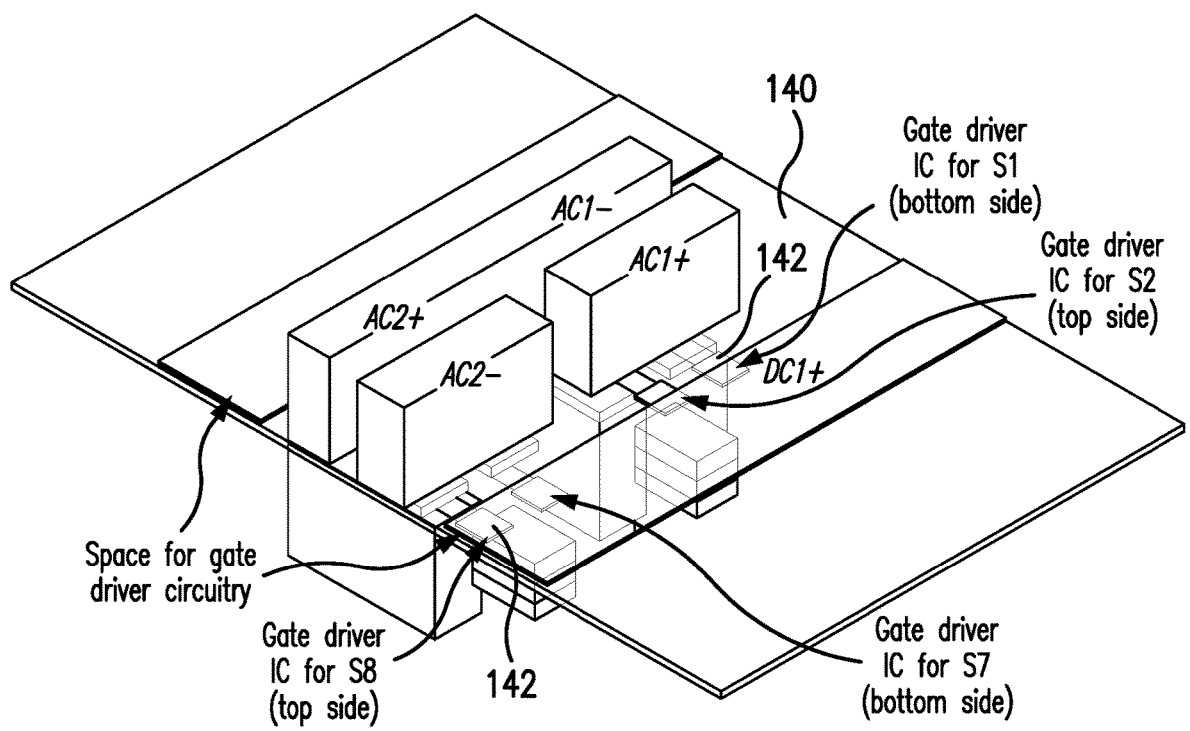

Shown in FIGS. 13A-13B, the integration of the half-bridge MMC 128 shown in FIGS. 12A-12C is shown with the interface board 134. The interface board 134 includes an input connector 136, as well as an array of conductive traces 138 for DC1− and contact pads 139 for DC1+ which are brought in alignment with the corresponding components on the main PCB assembly 130 when integrated one with another.

FIGS. 14A-14C, 15A-15C, and 16A-16B are representative of the switch configuration for a two-series connected full-bridge MMC module 129. In this embodiment, the full-bridge MMC 129 has a common node between successive bridges formed through sharing of the AC nodes of the MFCs. As shown, the main PCB assembly 140 includes switches S1 and S7 formed on the bottom side of the main PCB assembly 140, while switches S2 and S8 are formed on the top side of the main PCB assembly 140. Similarly, switches S3 and S5 can be formed on the top of the main PCB assembly 140, and switches S4 and S5 can be formed on the top and bottom of the main PCB assembly 140 as required by the topology demands. Gate drivers ICs 142 are fabricated on the top and the bottom of the main PCB assembly 140 in proximity to the respective switch dies.

Figure 15A:
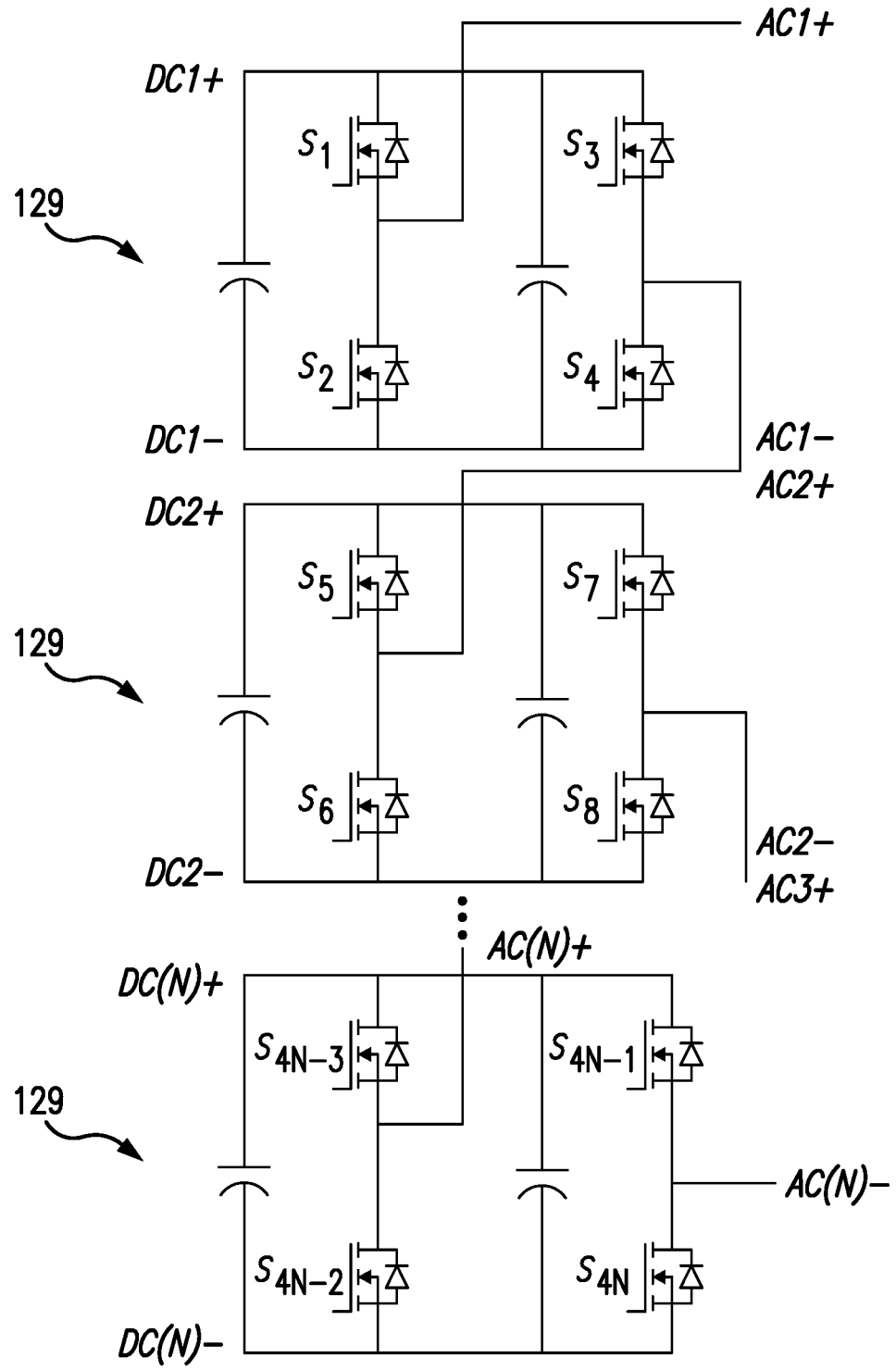
FIGS. 15A-15C show the expansion concept of the structure shown in FIGS. 14A-14C to an N-series connected full-bridge MMC modules with FIG. 15A being schematic, FIG. 15B being a top view, and FIG. 15C being a front view of the subject N-series connected full-bridge MMC module.
Figure 15B:
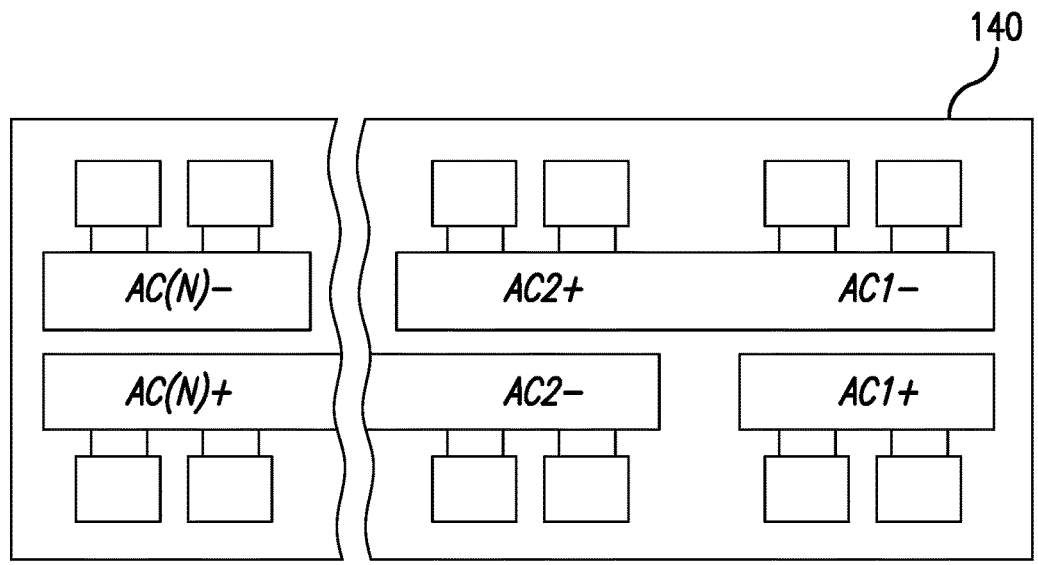
Figure 15C:
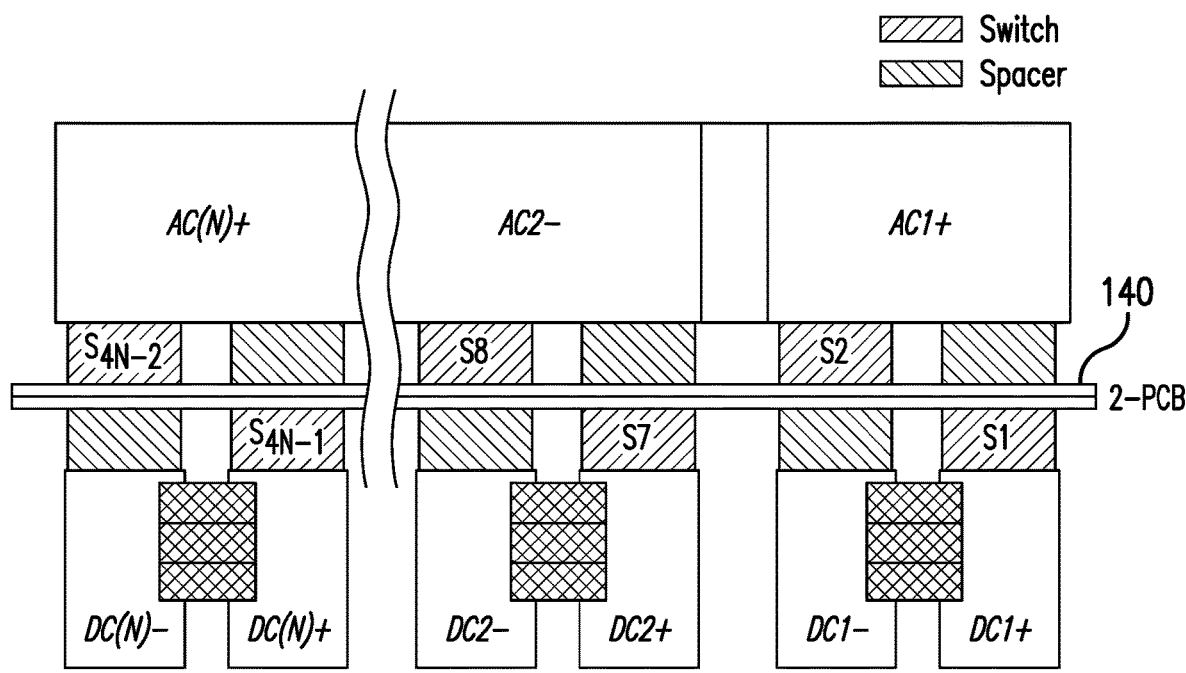

FIGS. 15A-15B are representative of the expansion of the full bridge MMC 129 to a number N-series full bridge MMC. FIGS. 16A-16b depict the integration of the full bridge MMC switch module 129 with the interface board 146 fabricated with the top side DC1− traces and bottom side DC1+ conductive traces 147 as shown in FIG. 16A. The main PCB assembly 140 with the switches assembly and gate drivers is brought into alignment with the conductive traces 147 on the interface board 146 form a complete integrated module.

Referring to FIGS. 17A-17C, shown is the switch configuration and assembly for a switched-capacitor converter 148 where the flying capacitors $C_1$ and $C_2$ are added across the corresponding MFCs. Specifically, the capacitors $C_1$ and $C_2$ are attached to the corresponding AC bus-bars AC1 and AC5 on the top of the main PCB assembly 150 and capacitor $C_2$ is coupled to the AC2 and AC4 by the bars on the bottom of the main PCB assembly 150. The capacitor $C_{DC}$ is coupled between the DC1− and DC1+ bus-bars, as shown in FIGS. 17B and 17C.

Figure 18A:
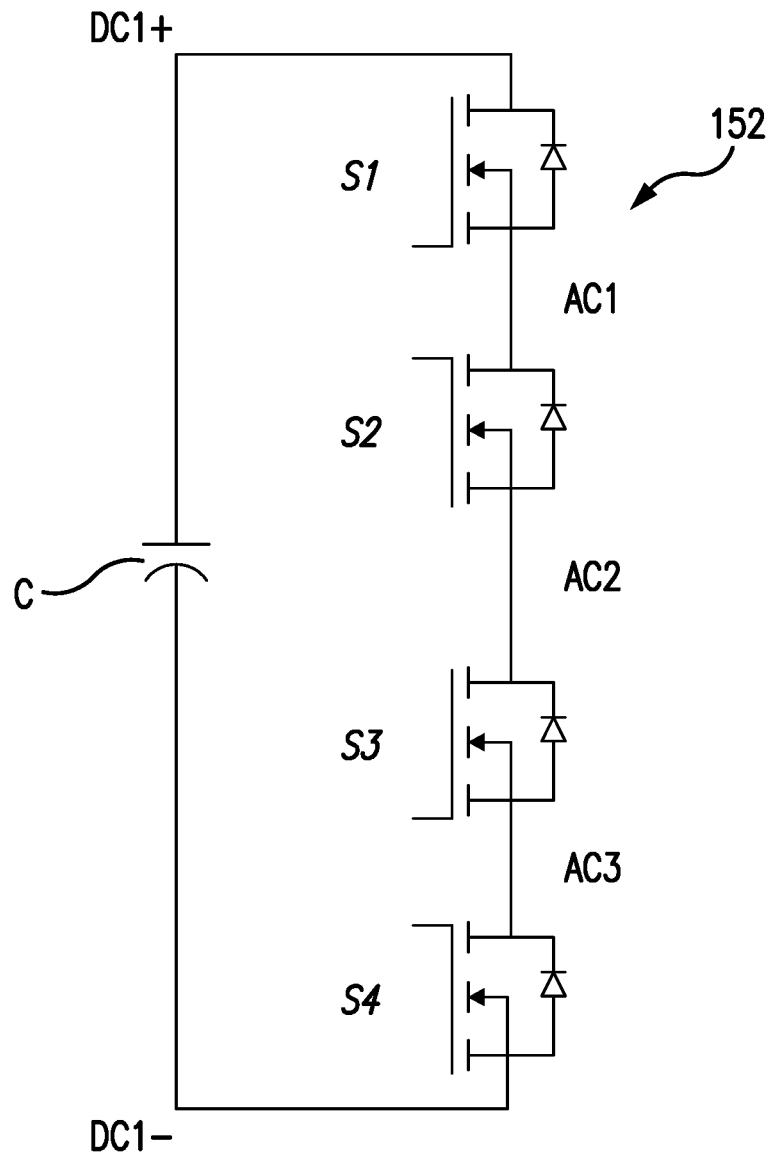
FIGS. 18A-18C show the subject switch configuration and assembly for a half-bridge topology consisting of four quadrant switches, with FIG. 18A showing schematics of the subject half-bridge module, FIG. 18B showing an isometric view of the half-bridge module, and FIG. 18C being a simplified front view of the subject half-bridge module.
Figure 18B:
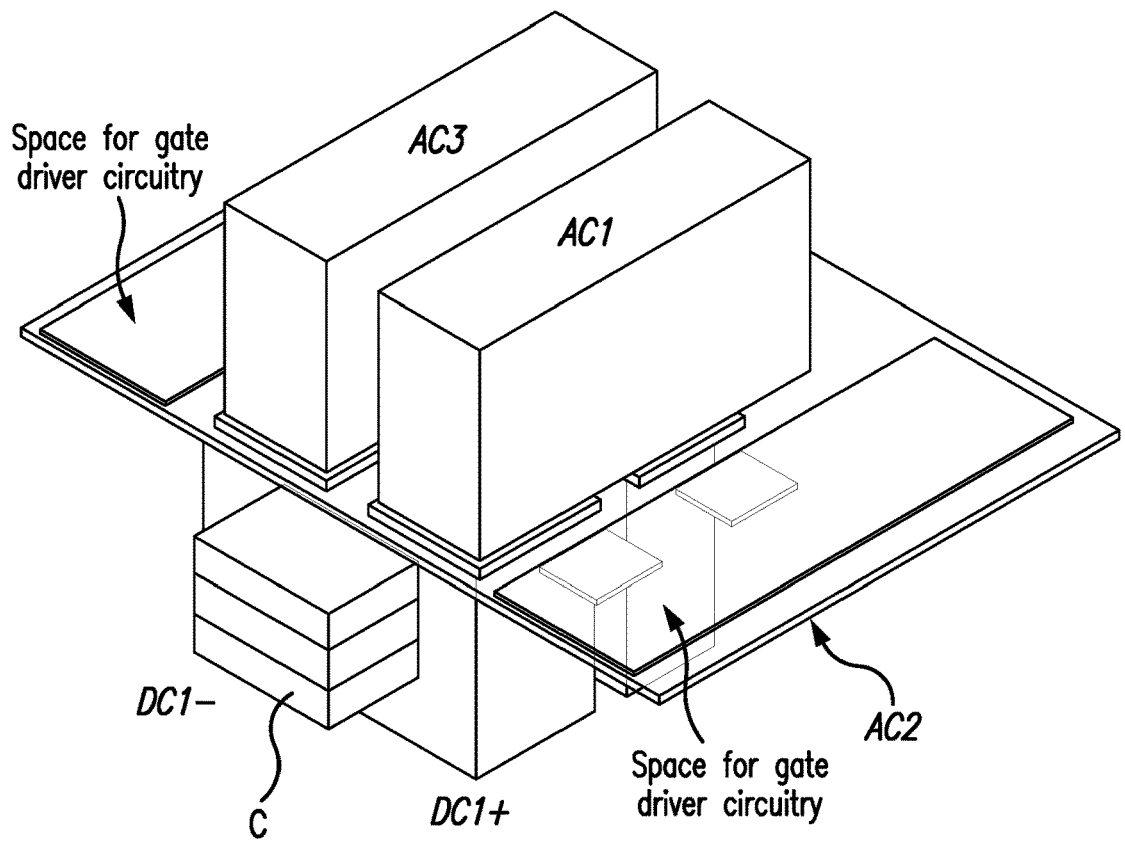
Figure 18C:
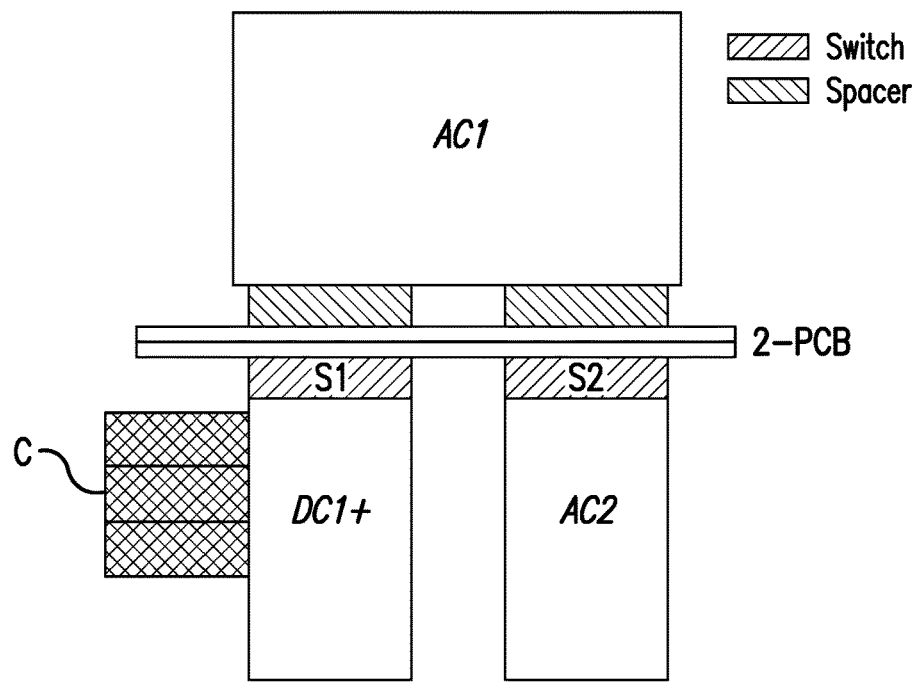

A switch module configuration 152 for a half-bridge is shown in FIGS. 18A-18C. The switch module 152 has four-quadrant (back-to-back) switches S1, S2, S3, S4 for blocking negative off-state current through the body diode of power MOSFET switches. Potential applications include direct AC-AC converters (cycloconverters).

The present switch modules shown in FIGS. 1A-1D and 2A-18C are contemplated in combination with thermal management. As presented in previous paragraphs, the top side and the bottom side of every switch die may be connected to the MFCs either directly (to the top side of the switch die) or indirectly through the THVs and the conductive spacers (to the bottom side of the switch die) for double-sided cooling. The subject concept utilizes both-side solderable bare-die power semiconductor devices in order to achieve double-sided cooling and eliminate wire-bonding. A fabrication process for both-side solderable dies and detailed description of the MFCs are presented in S. U. Yuruker, et al., "Advanced Packaging and Thermal Management of High-Power DC-DC Converters", Proc. Of the ASME 2019 International Technical Conference and Exhibition on Packaging and Integration of electronic and photonic microsystems Inter. Pack 2019, Oct. 7-9, 2019, Causa, and W. Park, et al., "A Bare-Die Sic-Based Isolated by Directional DC-DC Converter for Electric Vehicle On-Board Chargers", 2020 IEEE Transportation Electrification Conference and Expo (ITC) 23-26 Jun. 2020, Chicago Il-USA. However, the subject fabrication process described in previous paragraphs and illustrated in FIGS. 1A-1B, deviates from the fabrication process presented in S. U. Yuruker, et al. and W. Park, et al., supra, in that it is based on the double PCB assembly with various topologies of the switch dies secured at both sides of the double PCB assembly with the help of spring pins contacts, fuzz-button contacts between the switch dies and MFCs, and a small number of solder pastes and soldering steps required for formation of the subject hybrid switch modules. The subject switch modules configuration and fabrication process are highly compatible with the double-sided cooling approach utilized in the present system.

FIGS. 19A-19E illustrate different cooling configurations contemplated for thermal management of the subject switch module configurations presented herein. The MFCs can be implemented by different forms based on the cooling method. Possible cooling mechanisms for the proposed switch modules include forced-air cooling (shown in FIG. 19A) for low heat-flux applications and liquid cooling (FIGS. 19B-19E) for high heat-flux applications.

Figure 19A:
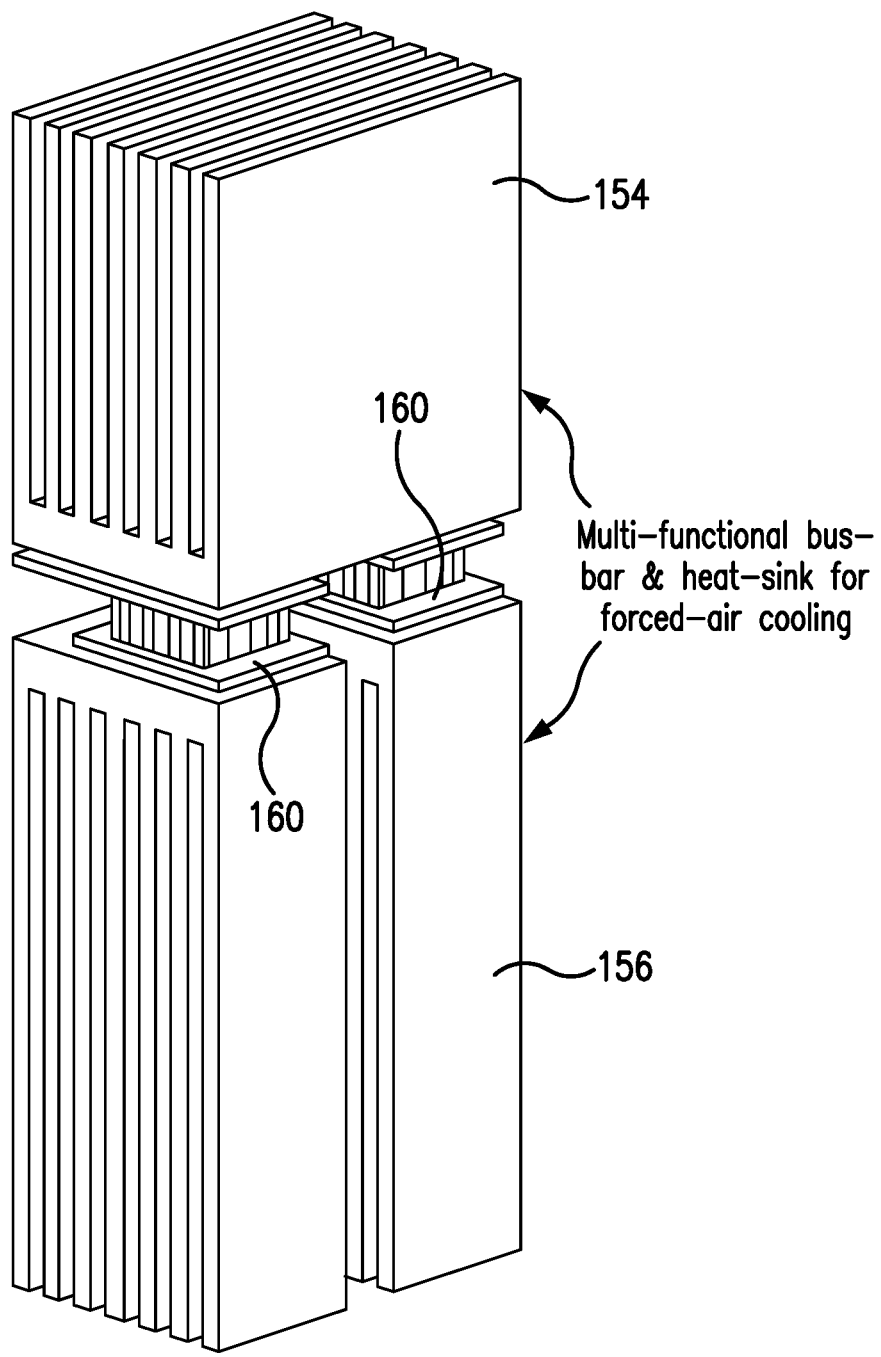
FIGS. 19A-19E are representative of the subject switch module integrated with different cooling configurations, with FIG. 19A showing a forced-air cooling, FIG. 19B showing a liquid cooling with dielectric coolant, FIG. 19C showing a liquid cooling with non-dielectric coolant such as WEG and water, FIG. 19D showing the liquid cooling with insulated ceramic coolant chamber, and FIG. 19E showing a liquid cooling with insulated ceramic coolant chamber where the MFCs operate as heater-spreader, heat-exchanger, and bus-bar, simultaneously.

FIG. 19A demonstrates the use of multi-functional bus-bars 154 and plate-fin heat-sinks 156 for the forced-air cooling. Different types of metallic heat-sinks 156 can be used, including square-pin-fin heat-sinks, round-pin-fin heat-sinks, staggered pin-fin heat-sinks and microchannel heat-sinks. The subject switch module 160 in any configuration presented herein may be installed between the heat-sinks 156 and multi-functional bus-bars (AC, or DC) 154.

Figure 19B:
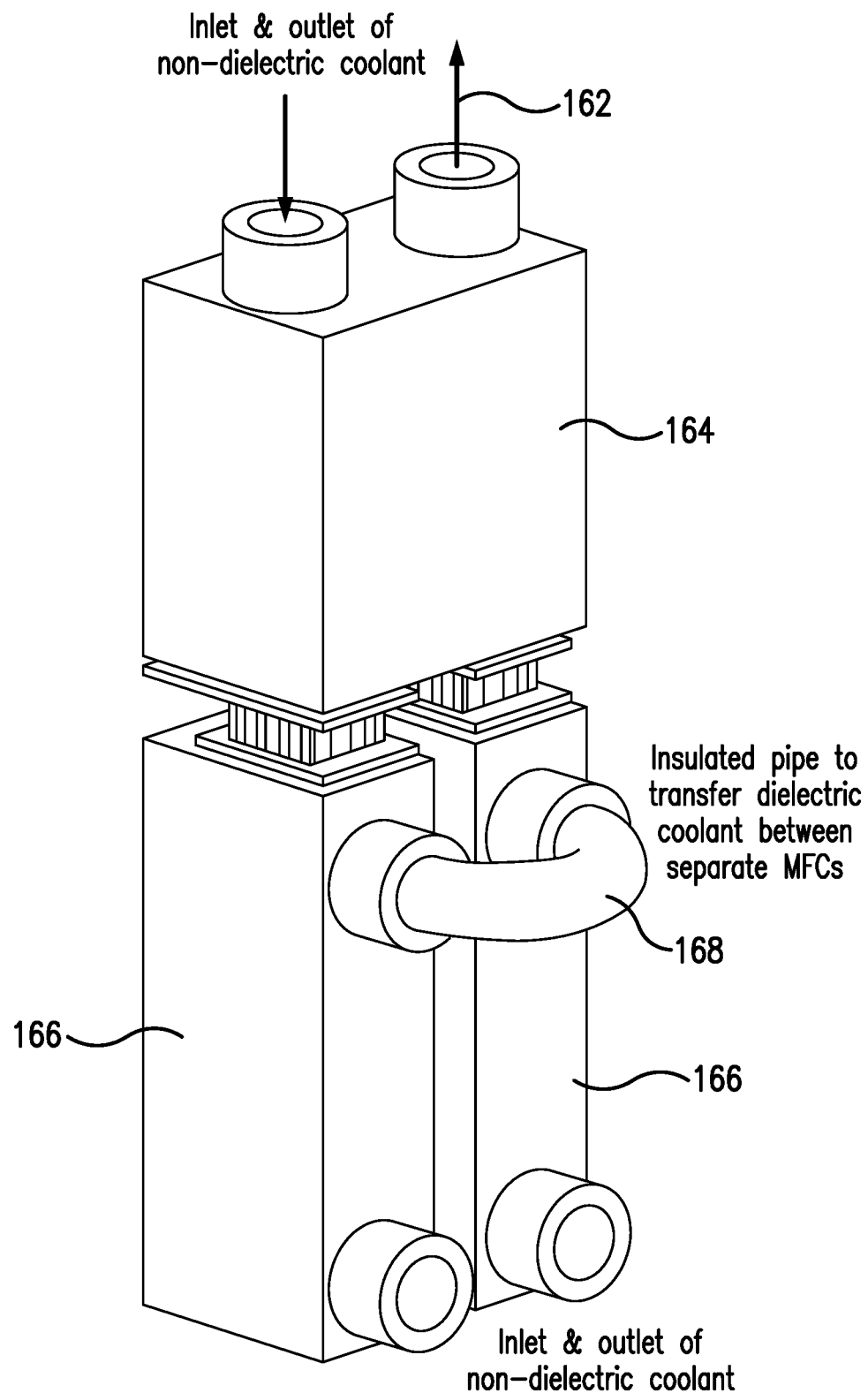

FIG. 19B depicts the liquid cooling configuration with a dielectric coolant (e.g., 3M Novec Engineering Fluid and automatic transmission fluid) for cooling multiple heat-sinks 166 and MFCs 164 through the shared coolant medium. As shown, the coolant 162 flows through multiple multi-functional heat-sinks 164, 166 through electrically insulated pipes 168. This approach maximizes the system simplicity through the single inlet and single outlet for multiple bus-bars.

Figure 19C:
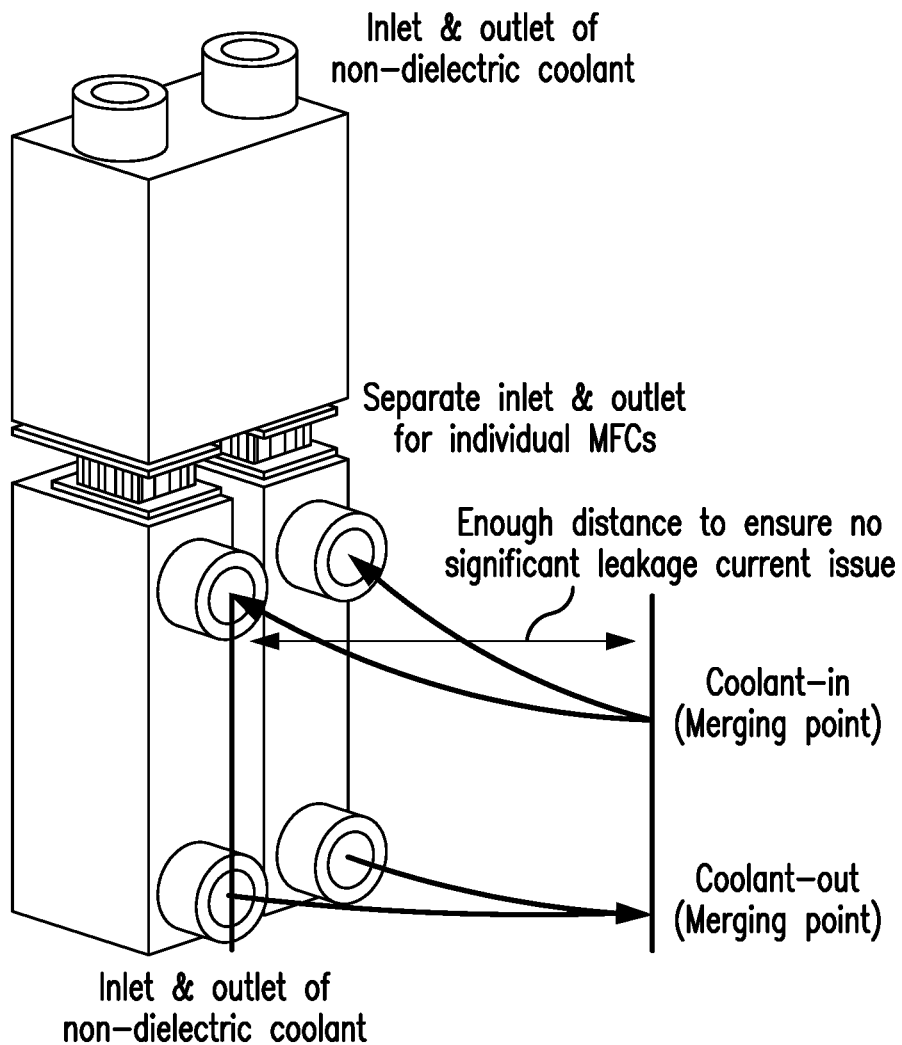

FIG. 19C illustrates the concept of the liquid cooling with a non-dielectric coolant. Water ethylene glycol (WEG) or water can also be used for cooling of the subject switch modules. As the resistivity of WEG is far lower than that of the dielectric fluid, non-negligibly high leakage current can be induced between two different potential nodes if the coolant path is too short. To use WEG without this issue, a sufficient distance is to be maintained between different potential heat-sinks as depicted in FIG. 19C, so that the two adjacent heat-sinks do not share coolant with close proximity.

Figure 19D:
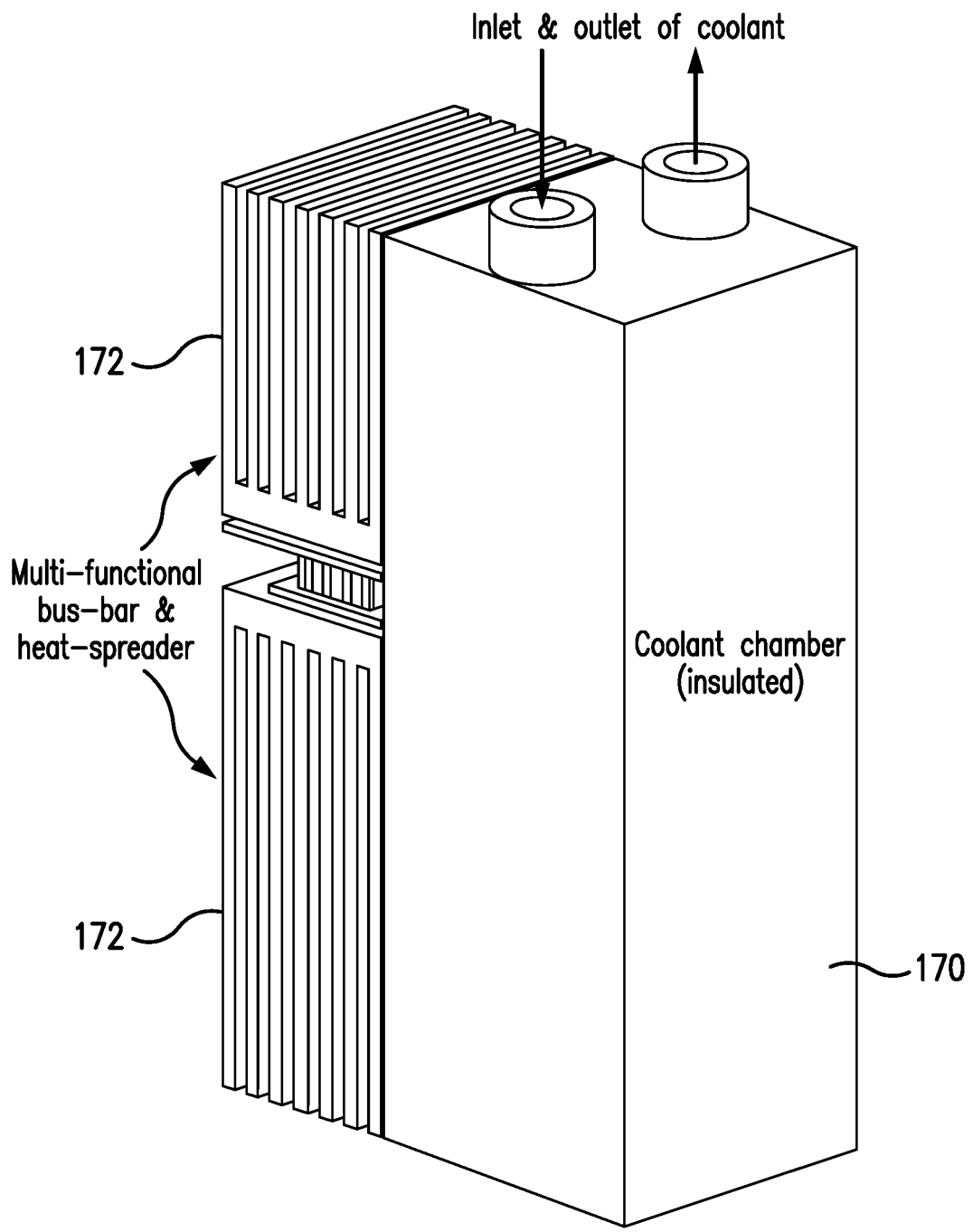
Figure 20A:
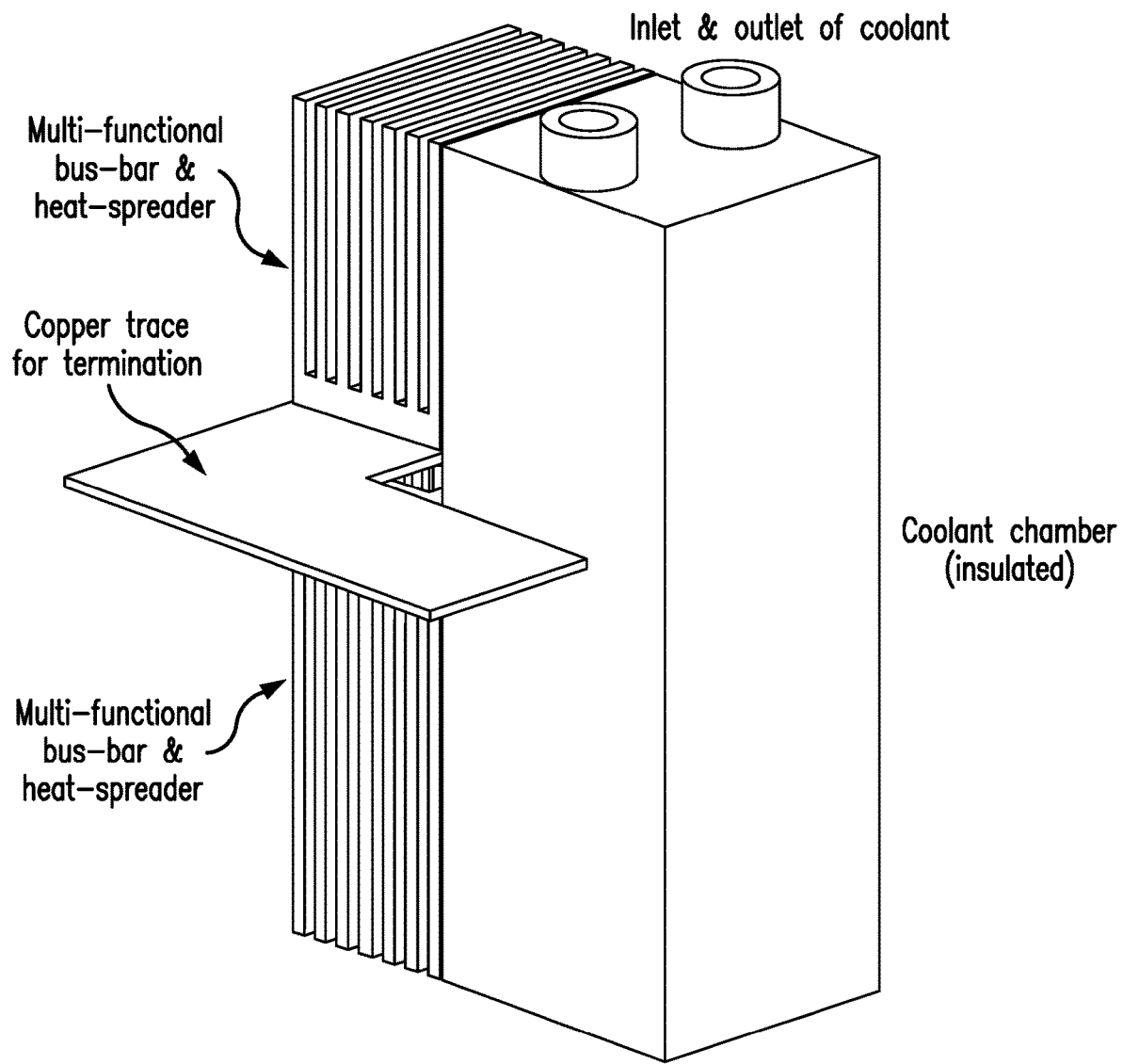
FIGS. 20A-20B are representative of the alternative liquid cooling concept with an insulated ceramic cooling chamber with different ways of termination, with FIG. 20A using a copper trace termination on the PCB assembly, and FIG. 20B showing an extended MFC termination.
Figure 20B:
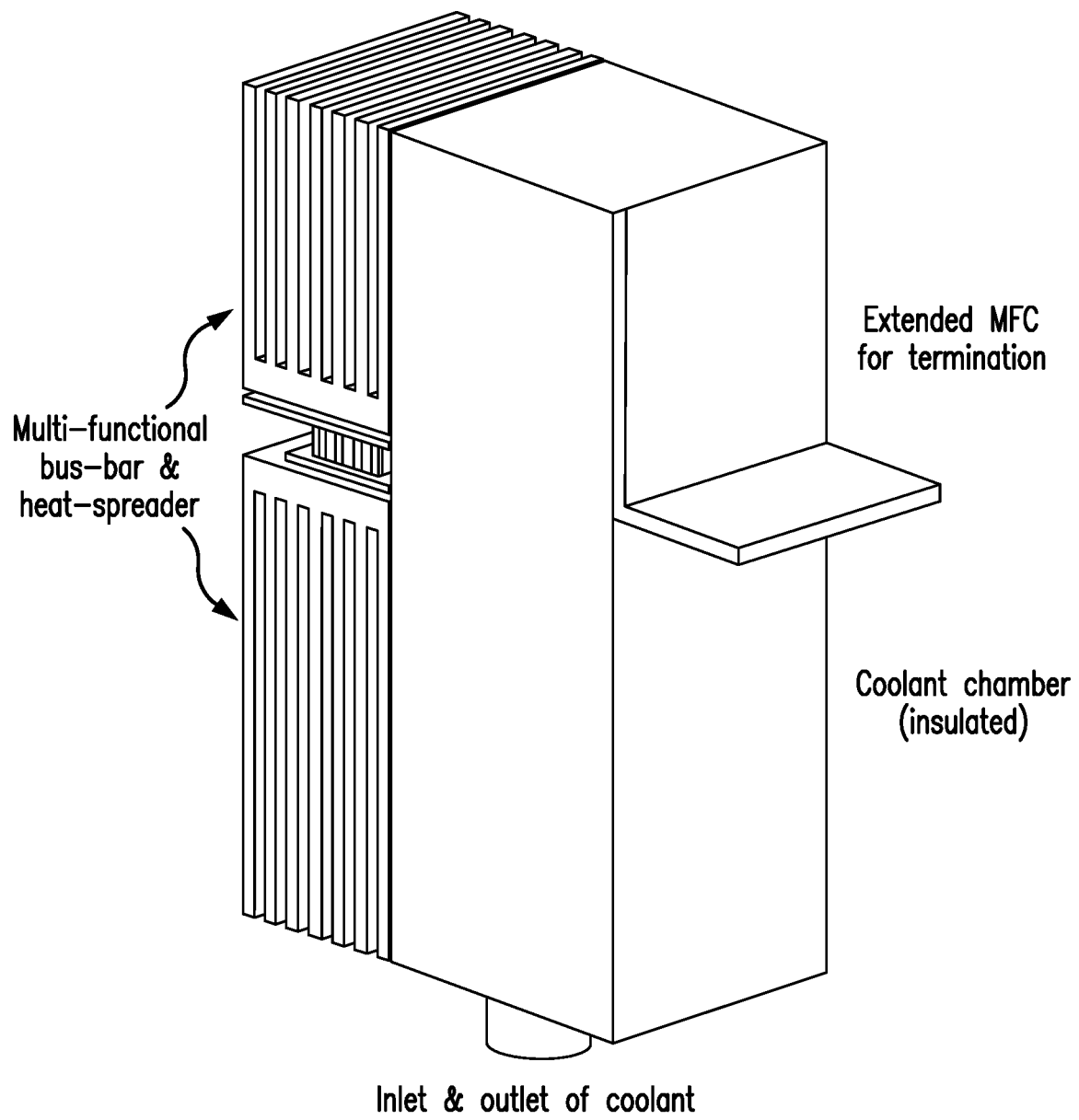

FIG. 19D illustrates liquid cooling with an insulated coolant chamber, where the MFCs serve as heat-spreaders and bus-bars. The coolant chamber 170 may be fabricated of ceramic or ceramic/polymer compound, along with the MFCs 172. The MFCs serve as heat-spreaders and bus-bars simultaneously. The chamber 170 can be attached to the MFCs 172 through soldering or mechanically. For the soldering option, a copper layer is patterned on the chamber either through the DBC approach or the active metal blaze (AMB) approach. For the mechanical clamp option, TIM is required to fill the gap between the MFCs and the chamber for minimizing thermal resistance. The system complexity may be reduced substantially by sharing the cooling chamber for all MFCs. This cooling embodiment may be implemented in combination with the forced-air cooling as a hybrid cooling concept. Two alternative ways of termination are contemplated including (a) through copper traces on the PCB assembly or (b) through MFCs, as shown in FIGS. 20A and 20B, respectively. The copper traces concept provides manufacturing simplicity without requiring complicated MFC structures, and the termination through the MFCs provides a balanced current sharing feature due to its symmetry.

Figure 19E:
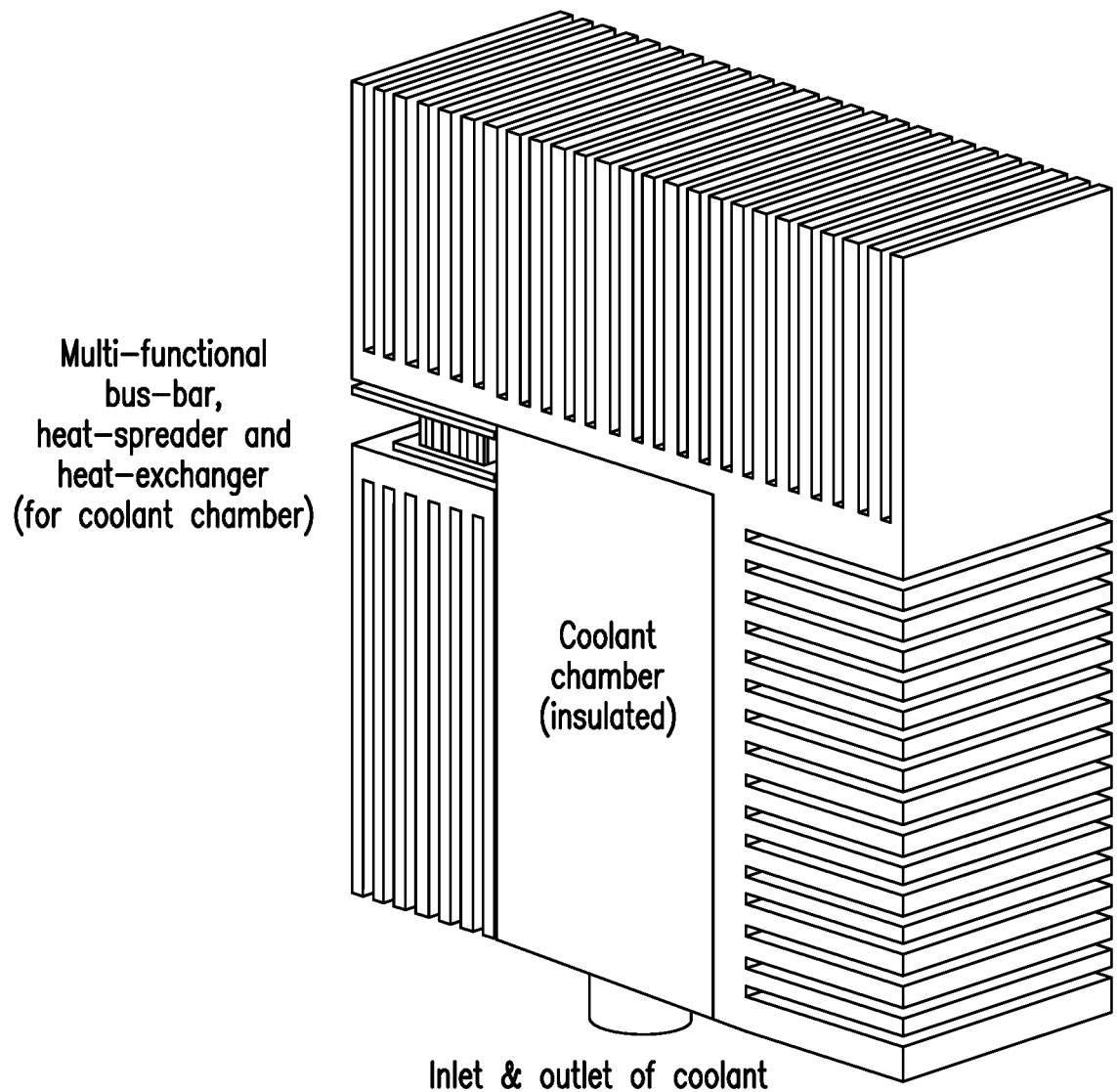

The alternative hybrid cooling configuration for the liquid cooling concept with insulated ceramic coolant chamber where the MFCs serve as heat-spreaders, bus-bars and heat exchangers (for the coolant chamber) is shown in FIG. 19E. The coolant chamber is wrapped by the MFCs for an enhanced cooling performance. Combined with forced-air cooling, the MFCs provide additional paths for the heat from the switches as well as the coolant itself. This approach results in the decrease in the coolant temperature at the same time, thereby enhancing the cooling capability.

Figure 21A:
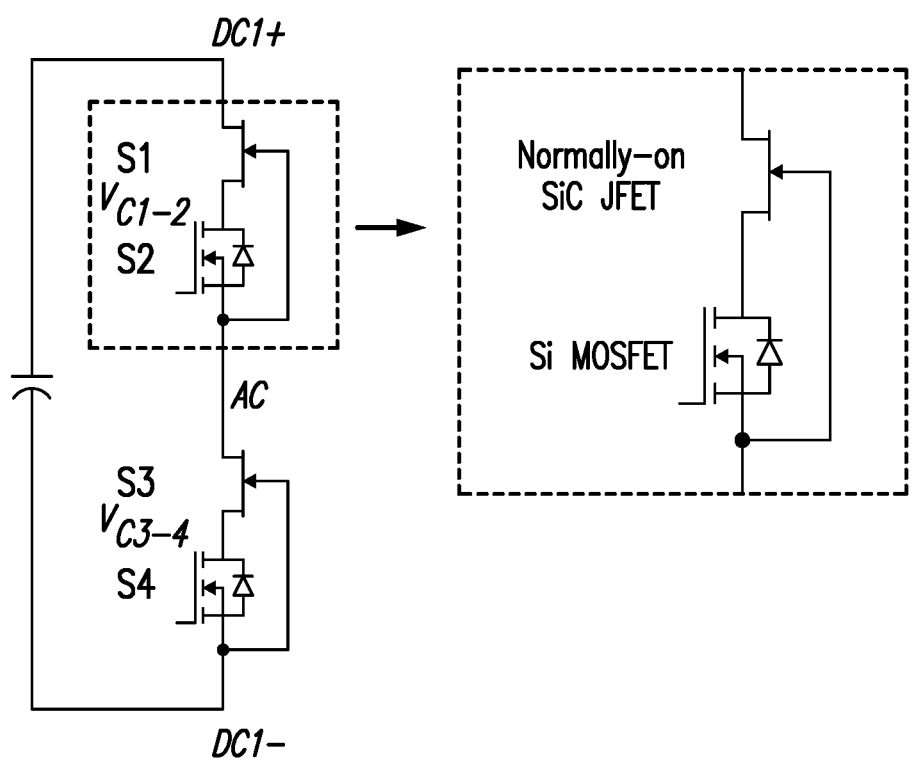
FIGS. 21A-21C are representative of the alternative embodiment of the subject series-connected switch configuration in the form of a cascode arrangement of Si-MOSFET and SiC-JFET having a half-bridge topology, with FIG. 21A showing schematics of the subject module, FIG. 21B being an isometric view of the subject module, and FIG. 21C showing a simplified front view of the subject module.
Figure 21B:
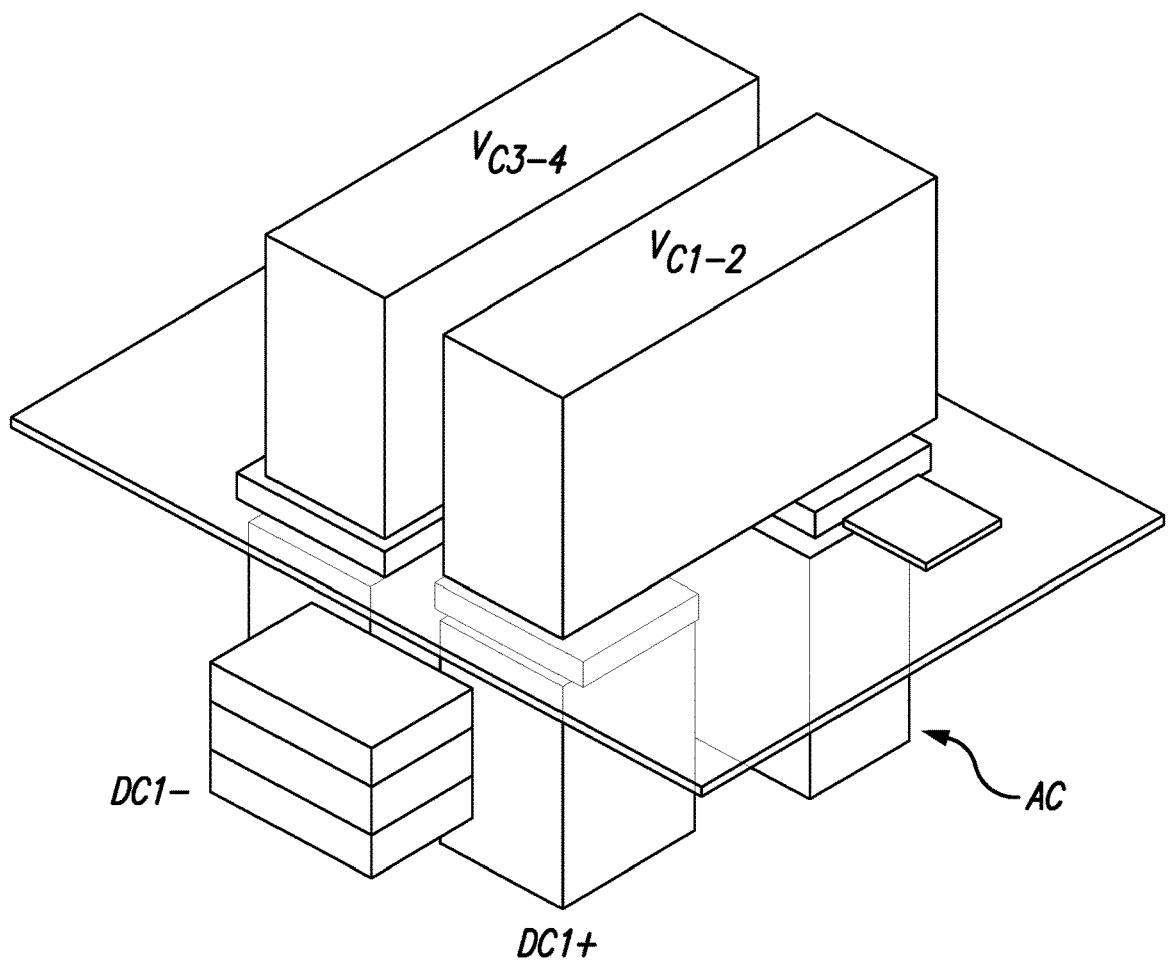
Figure 21C:
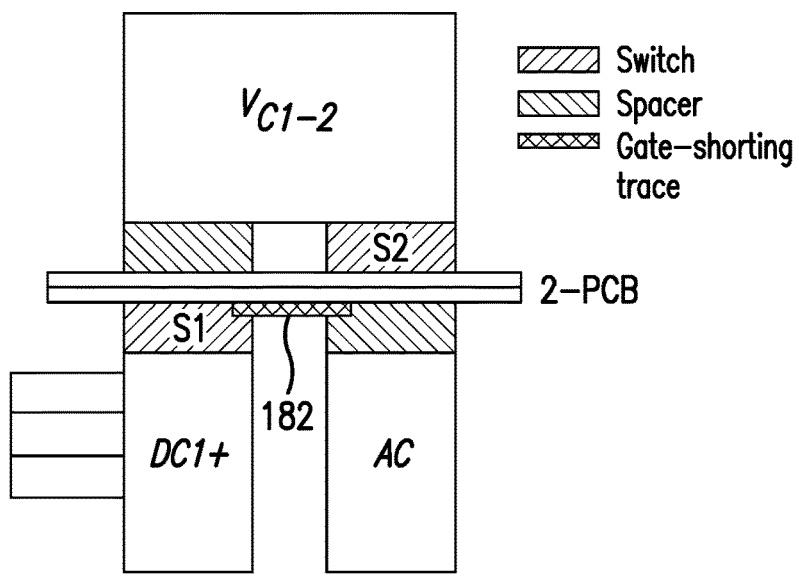

There are additional embodiments of the subject switch configurations contemplated, which constitute modifications to the series-connection switch module including a cascode configuration 180 combining Si-MOSFET and SiC-JFET shown in FIGS. 21A-21C. The gate of each SiC-JFET (S1 and S3) is shorted with the source of the corresponding Si-MOSFET (S2 and S4) through copper traces 182 on the main PCB assembly 184.

Figure 22A:
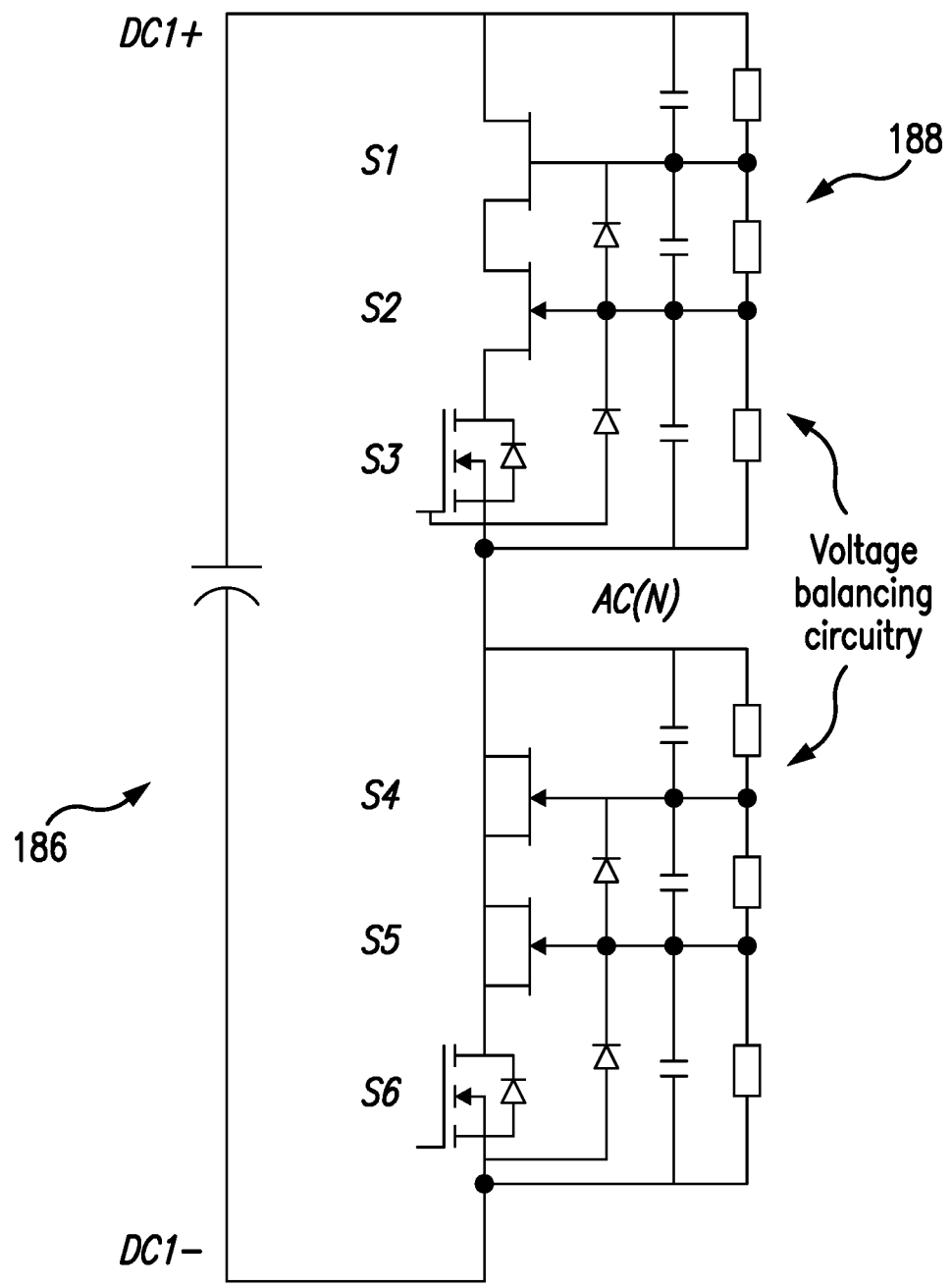
FIGS. 22A-22C are representative of the alternative embodiment of the subject series-connected switch configuration in the form of a HV cascode arrangement having a half-bridge topology with the DC bus-bars extended in x-direction, with FIG. 22A showing schematics of the subject module, FIG. 22B being an isometric view of the subject module, and FIG. 22C showing a simplified front view of the subject module.
Figure 22B:
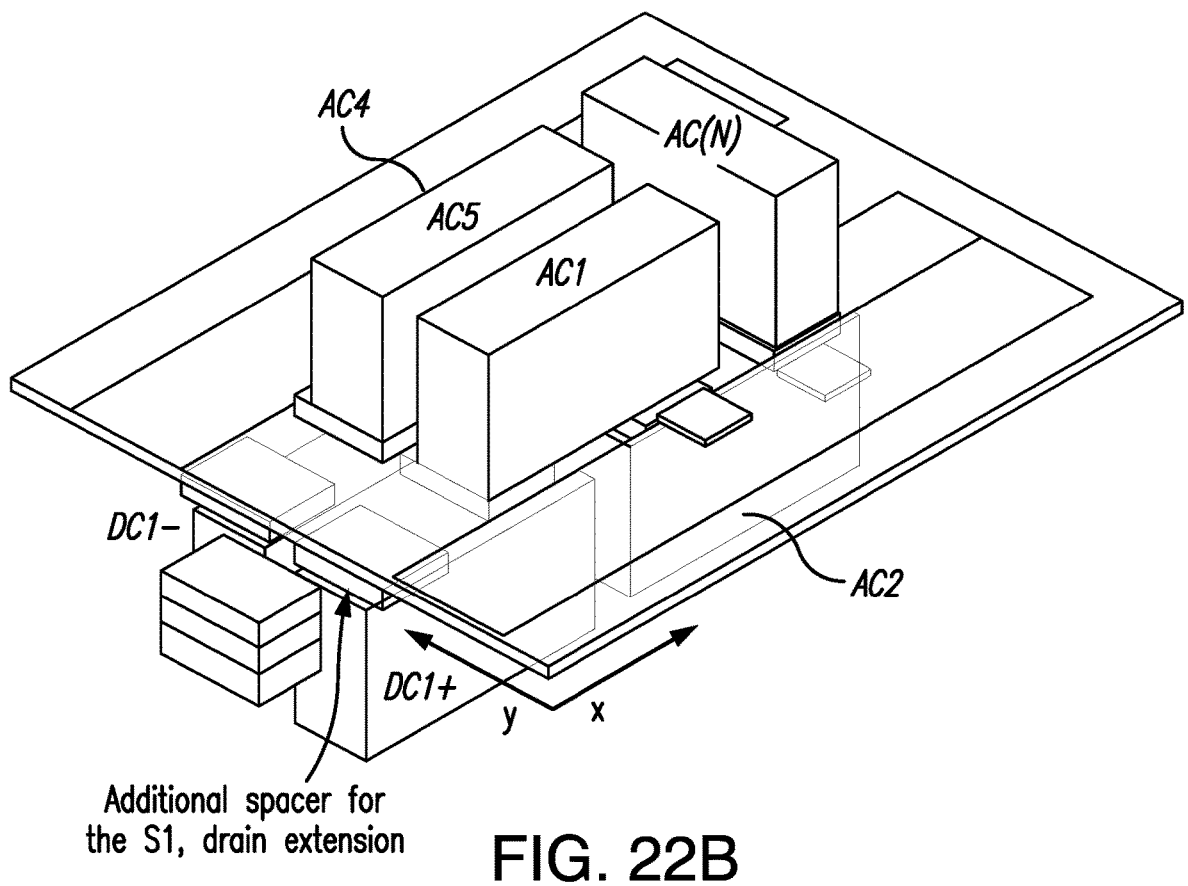
Figure 22C:
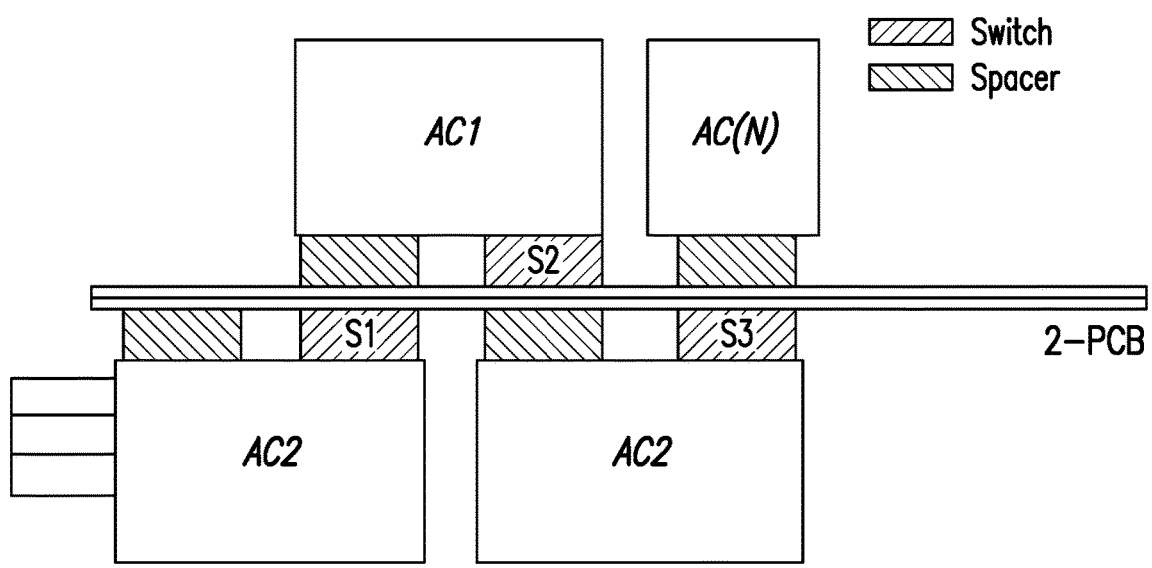

Another modification is a high-voltage series configuration 186 with voltage balancing circuitry 188, shown in FIGS. 22A-22C. For a high-voltage series configuration, dynamic and static voltage balancing is necessary for equally distributed voltage stress across every switch. Typical balancing circuitry consists of capacitors (for dynamic voltage balancing), resistors (for static voltage balancing), and diodes (for reinforcing the gate driver performance), as shown in FIG. 22A. As the drain of the uppermost switch (S1) should be connected to the gate signal of itself through balancing components, the DC1+ node has to be populated on the board for wire-bondless composition. Enlarged DC bus-bars and additional spacers enable populating the voltage node on the board. FIGS. 22B and 22C illustrate extended DC bus-bars for the voltage balancing circuitry 188 with wire-bondless composition. The DC bus-bars can be extended either in x-direction or y-direction.

Figure 23A:
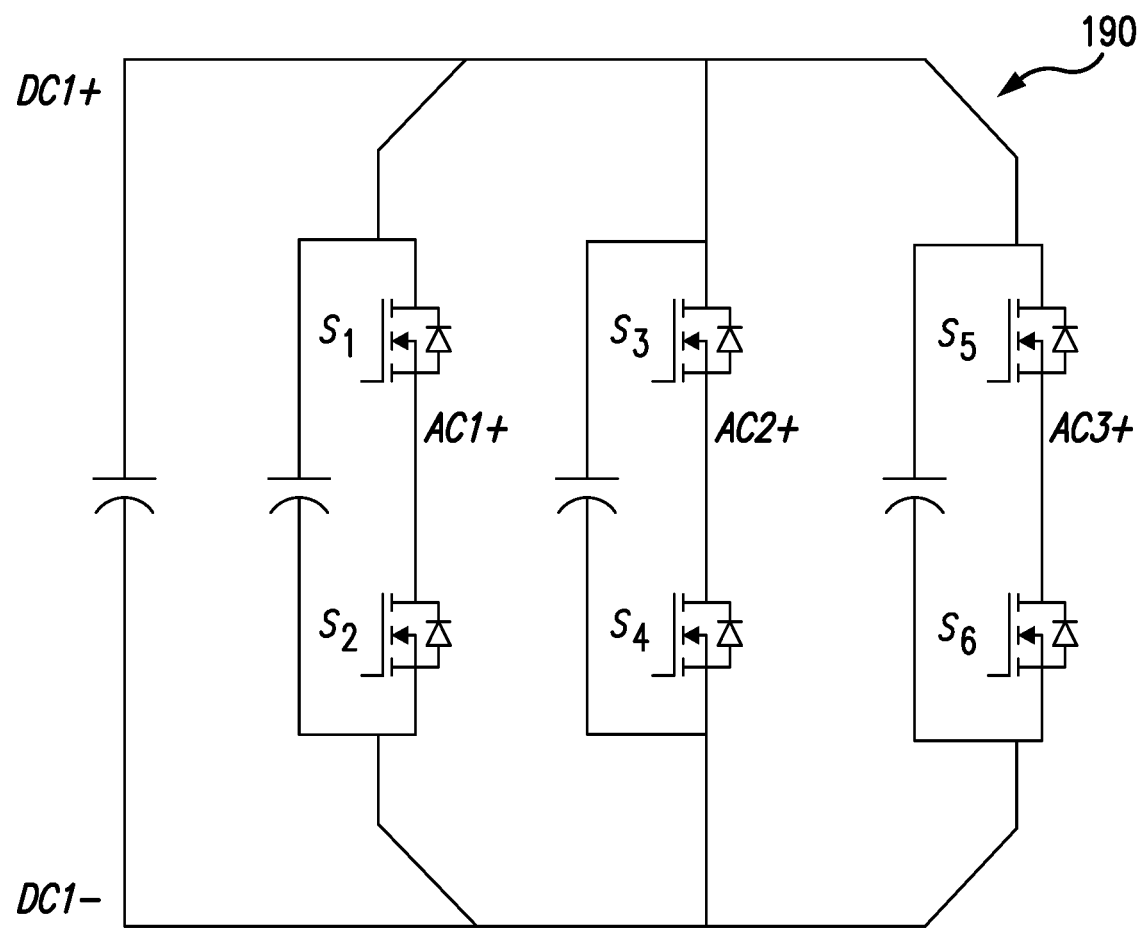
FIGS. 23A-23C show the subject switch configuration for the three-phase converter with FIG. 23A showing a schematic of the subject three-phase power switch module, FIG. 23B being an isometric view, and FIG. 23C being a front view of the subject power switch module configuration for a three-phase converter topology.
Figure 23B:
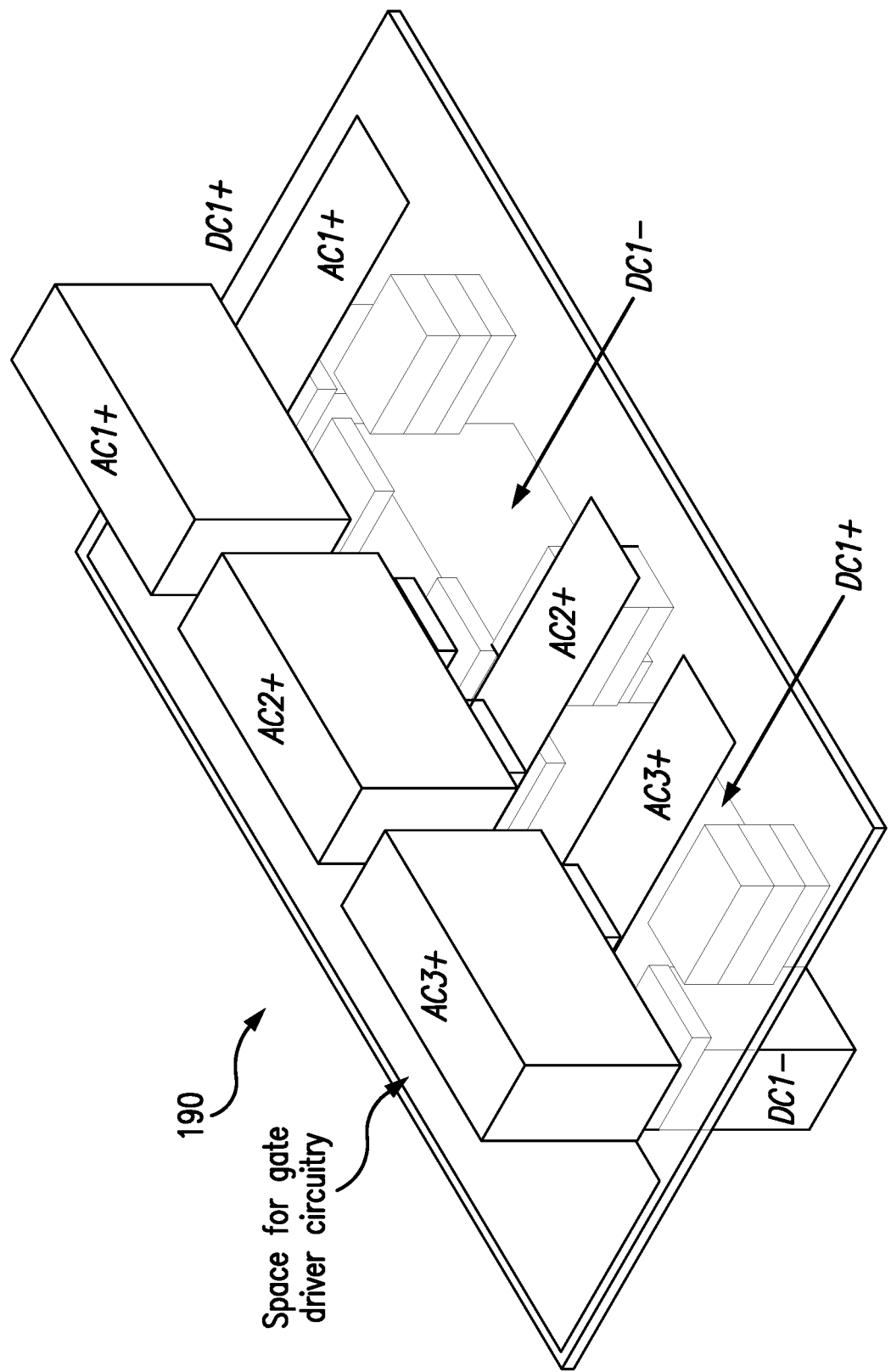
Figure 23C:
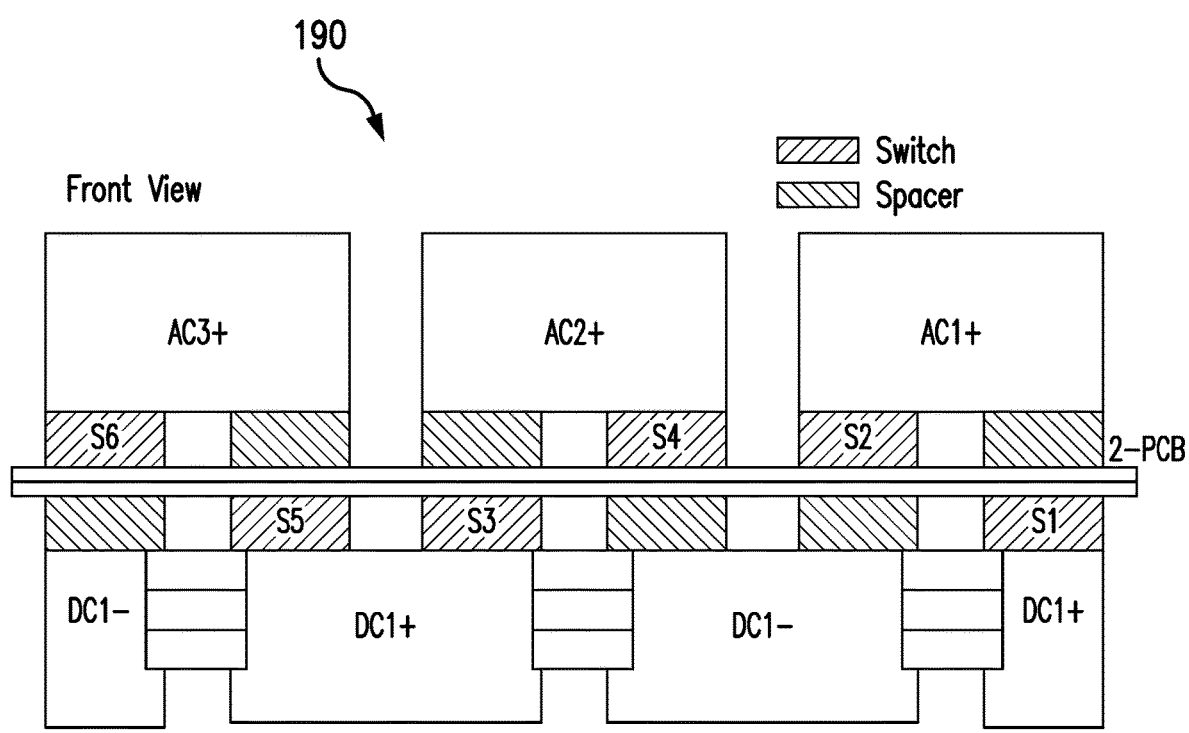
Figure 24A:
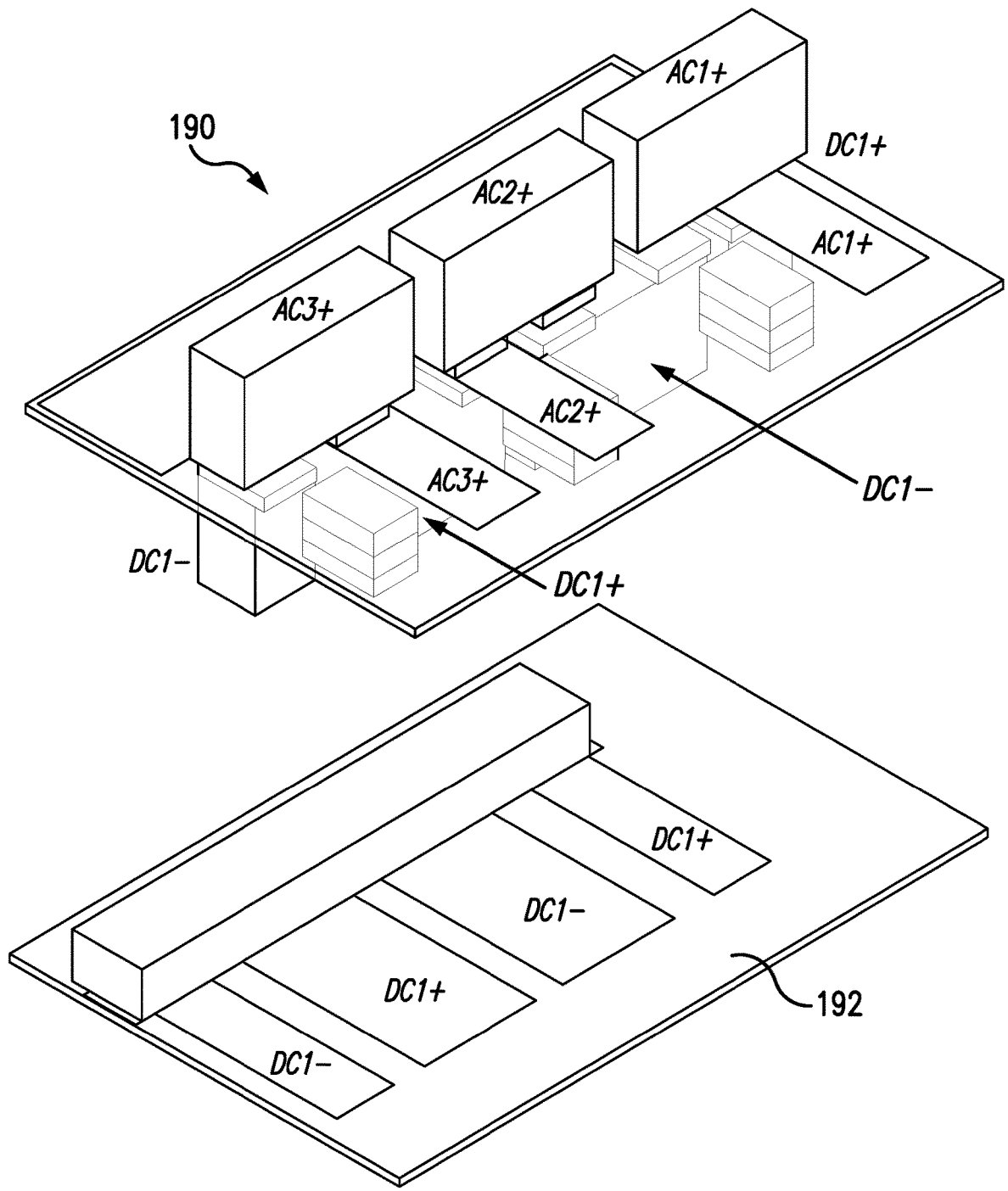
FIGS. 24A-24B show the integration of the three-phase converter shown in FIGS. 23A-23C with the interface board, where
Figure 24B:
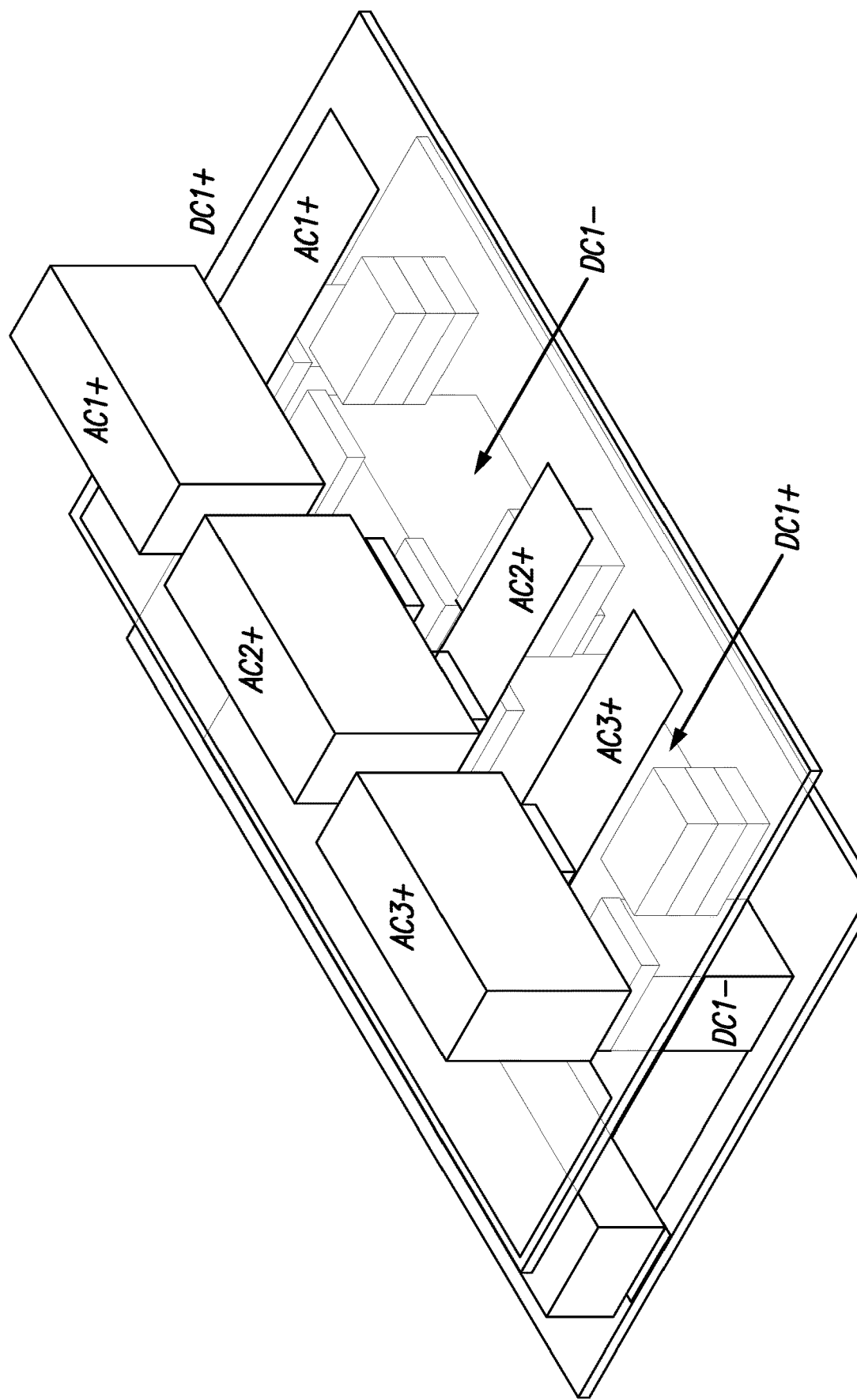
Figure 25A:
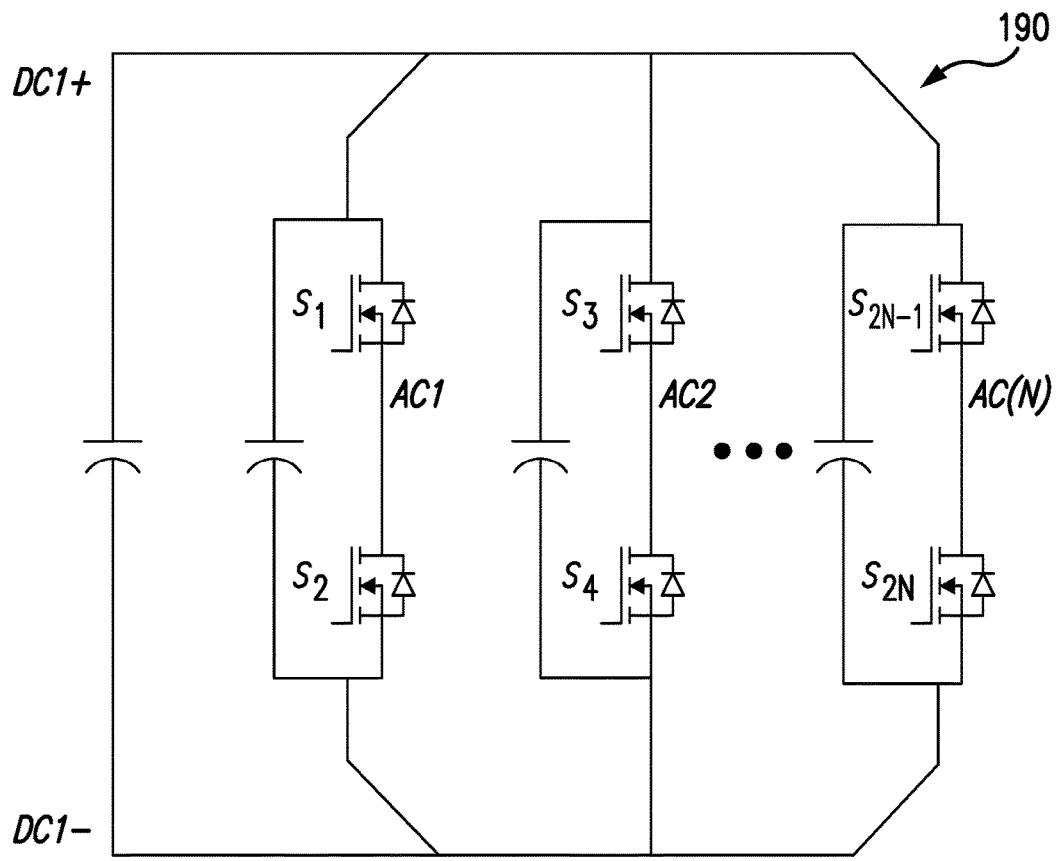
FIGS. 25A-25B depict the concept of expansion of the subject switch configuration for the three-phase converter topology of FIGS. 23A-23C and 24A-24B to the N-phase converter topology, with FIG. 25A being a schematic diagram, and FIG. 25B being a front view of the expanded N-phase switch module topology.
Figure 25B:
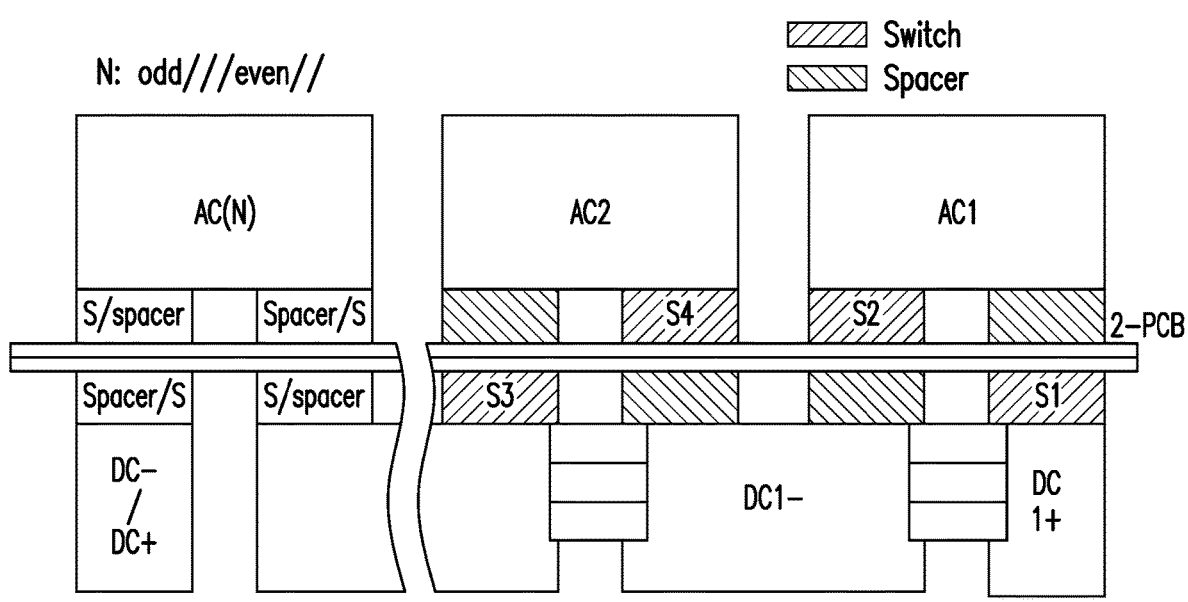

An alternative modification 190 of the subject switch module configuration for multi-phase converters is shown in FIGS. 23A-23C. These switch modules have multiple half-bridges connected in parallel, and each half-bridge has different potentials on the output AC nodes. Potential applications for this modification are traction inverters and multi-phase interleaved converters. The proposed layout for such a three-phase converter 190 is illustrated in FIGS. 23C and 23B. It may be noted that for high-current applications, each phase-leg in this structure can also be realized using the switch paralleling scheme described before. Three-phase converter 190 integrated with the interface board 192 is depicted in FIGS. 24A-24B. A general layout for an expanded N-phase converter corresponding to the configuration 190 shown in FIGS. 23A-23C is depicted in FIGS. 25A-25B.

Although aspects of the present disclosure have been described in connection with specific forms and embodiments thereof, it will be appreciated that various modifications other than those discussed above may be resorted to without departing from the spirit or scope of the present disclosure as defined in the appended claims. For example, functionally equivalent elements may be substituted for those specifically shown and described, certain features may be used independently of other features, and in certain cases, particular locations of the elements may be reversed or interposed, all without departing from the spirit or scope of the present disclosure as defined in the appended claims.

What is claimed is:

1. A hybrid double-sided power switch module, comprising:
 a first printed circuit board (PCB) and a second PCB, wherein said first PCB has a first side and a second side opposite to said first side, and wherein said second PCB has a third side and a fourth side opposite to said third side of said second PCB, said first and second PCBs being configured with at least first and second through-hole-vias (THVs), said first THV extending between said first and second sides of said first PCB, and said second THV extending between said third and fourth sides of said second PCB;
 at least one first switch die secured to said first side of said first PCB with a gate terminal of said at least one first switch die facing said first side of said first PCB in alignment with said first THV formed through said first PBC, and
 at least one first spring pin soldered inside said first THV formed through said first PCB by a high-temperature solder paste, said at least one first spring pin having a first conductive body with a first cap formed at one end of said first conductive body and a second cap formed at another end of said first conductive body, wherein said at least one first spring pin has said first cap aligned and in contact with said gate terminal of said at least one first switch die, and wherein said second cap is exposed at said second side of said first PCB in alignment and contact with said first THV formed through said first PCB; and at least one second switch die secured to said third side of said second PCB with a gate terminal of said at least one second switch die facing said third side of said second PCB in alignment with said second THV formed through said second PCB, and at least one second spring pin soldered inside said second THV formed through said second PCB by said high-temperature solder paste, said at least second spring pin having a second conductive body with a third cap formed at one end of said second conductive body and a fourth cap formed at another end of said second conductive body, wherein said at least one second spring pin has said third cap aligned and in contact with said gate terminal of said at least one second switch die, and wherein said fourth cap is exposed at said fourth side of said second PCB in alignment and in contact with said second THV formed through said second PCB;

wherein said first and second PCBs are secured to one another by a low-temperature solder paste with said second and fourth sides thereof facing each other, thus forming a double PCB assembly with said at least one first switch die and said at least one second switch die secured at said first and third sides interconnected to configure the power switch module of a predetermined configuration.

2. The hybrid double-sided power switch module of claim 1, further comprising:

a first spacer secured to said first side of said first PCB by a first high-temperature solder paste pad, a second spacer secured to said third side of said second PCB by a second high-temperature solder paste pad, a first array of THVs extending through said first PCB between said first and second sides thereof and filled with a conductive material, a second array of THVs extending between said third and fourth sides of said second PCB and filled with said conductive material, wherein each of said first and second arrays of THVs is disposed in alignment with a respective one of said first and second spacers and in contact with a respective one of said first and second high-temperature solder paste pads.

3. The hybrid double-sided power switch module of claim 2, further comprising:

a third and a fourth high-temperature solder paste pads, each interposed between a source terminal of a respective one of said at least one first and second switch dies and a respective one of said first and third surface of said first PCB and said second PCB, respectively, and a third array of THVs formed through said first PCB and a fourth array of THVs formed through said second PCB, each of said third and fourth arrays of THVs extending in alignment with said source terminal of a respective one of said at least one first and second switch dies in contact with a respective one of said third and fourth high-temperature solder paste pads.

4. The hybrid double-sided power switch module of claim 3, wherein said first array of THVs formed through said first PCB is aligned with said fourth array of THVs formed through said second PCB, and wherein said second array of THVs formed through said second PCB is aligned with said third array of THVs formed through said first PCB.

5. The hybrid double-sided power switch module of claim 4, further comprising:

at least first and second multi-functional components (MFCs) disposed at opposite sides of said double PCB assembly, each of said at least first and second MFCs being disposed in contact with a top surface of a respective one of said at least first and second switch dies and an upper surface of a respective one of said first and second spacers.

6. The hybrid double-sided power switch module of claim 5, further comprising:

a first and second arrays of flexible metal fuzz buttons, each array of flexible metal fuzz-buttons being disposed between said respective at least first and second MFCs and said respective one of said at least one first and second switch dies and said respective one of said first and second spacers.

7. The hybrid double-sided power switch module of claim 6, further comprising clamping screws securing said at least first and second MFCs and said first and second PCBs to one another.

8. The hybrid double-sided power switch module of claim 5, having a high-voltage half-bridge configuration, further comprising:

at least one capacitor operatively coupled between said at least first and second switch dies, wherein said at least first and second switch dies further include a first plurality of switch dies $S_1, S_2, S_3$ and a second plurality of switch dies $S_4, S_5, S_6$ series-connected to each other, wherein at least one switch die of said first plurality thereof and at least one switch die of said second plurality thereof are positioned at said first and third sides of said first and second PCBs, wherein said at least first and second MFCs include DC+ and DC− bus-bars and a plurality of AC bus-bars, and wherein said at least one capacitor is secured to said DC+ and DC− bus-bars in proximity to said at least first and second switch dies.

9. The hybrid double-sided power switch module of claim 8, further comprising:

an interface board patterned with DC+ and DC− conductive traces, and an input connector secured to said interface board in contact with said DC+ and DC− conductive traces, wherein said interface board is integrated with said power switch module.

10. The hybrid double-sided power switch module of claim 5, further including at least first and second gate driver circuitry units, each disposed at a respective one of said first and third sides of said first and second PCBs, respectively, at a location devoid of said at least first and second MFCs.

11. The hybrid double-sided power switch module of claim 5, further comprising at least a first and a second voltage balancing circuitry units, each disposed at a respective one of said first and third sides of said first and second PCBs, respectively.

12. The hybrid double-sided power switch module of claim 1, having a high-current half-bridge configuration, wherein said at least first and second switch dies are parallel-connected.

13. The hybrid double-sided power switch module of claim 12, wherein said at least first and second switch dies include a plurality of switch dies $S_1, S_2, S_3, S_4, S_5, S_6, S_7, S_8$, said switch dies $S_1$ and $S_2$ forming a first phase-leg having a first capacitor coupled between said switch dies $S_1$ and $S_2$ and a first MFC forming a first $AC_1$ bus-bar, said switch dies $S_3$ and $S_4$ forming a second phase-leg having a second capacitor coupled between said switch dies $S_3$ and $S_4$ and a second MFC forming of a second $AC_2$ bus-bar, said switch dies $S_5$ and $S_6$ forming a third phase-leg having a third capacitor coupled between said switch dies $S_5$ and $S_6$ and a third MFC forming a third $AC_3$ bus-bar, and said switch dies $S_7$ and $S_8$ forming a fourth phase-leg having a fourth capacitor coupled between said switch dies $S_7$ and $S_8$ and a fourth MFC forming of a fourth $AC_4$ bus-bar, a common MFC in a form of an AC bus-bar connected to said $AC_1$, $AC_2$, $AC_3$ and $AC_4$, bus-bars, wherein said first, second, third and fourth phase-legs are connected in parallel between respective MFCs in a form of DC1+ and DC1− bus-bars, wherein each of said first, second, third and fourth capacitors is secured to said DC1− and DC1+ bus-bars in each of said phase-legs, wherein said switch dies in each phase-leg are disposed at opposite first and third sides of said first and second PCBs, respectively, and wherein said switch dies on said first side and second side of said first and second PCBs, respectively, are arranged in a single row of switch dies.

14. The hybrid double-sided power switch module of claim 13, further including a plurality N of said phase-legs connected in parallel, wherein N exceeds 4.

15. The hybrid double-sided power switch module of claim 14, wherein said switch dies $S_1$, $S_2$, $S_3$, $S_4$, $S_5$, $S_6$, $S_7$, and $S_8$ are arranged in full-bridge configurations, and are disposed in two rows on each of said first and third side of the first and second PCBs, respectively.

16. The hybrid double-sided power switch module of claim 13, further comprising at least four decoupling capacitors, each coupled between adjacent two of said first, second, third and fourth phase legs.

17. The hybrid double-sided power switch module of claim 5, further comprising a copper trace deposited on said first and third sides of said first and second PCBs, respectively, wherein said at least first and second switch dies are connected in series through said copper trace, and wherein said power switch module has a modular half-bridge multi-level converter (MMC) configuration.

18. The hybrid double-sided power switch module of claim 17, further comprising a number N of serially connected full-bridge multi-level converter module configurations, each composed of a pair of said half-bridge MMCs, wherein said serially connected full-bridge multi-level converter module configurations on each of said first and third sides of said first and second PCBs, respectively, share a common AC bus-bar of said MFCs.

19. The hybrid double-sided power switch module of claim 5, further comprising a plurality of flying capacitors, each coupled across respective ones of said at least first and second MFCs.

20. The hybrid double-sided power switch module of claim 8, wherein said half-bridge configuration of said power switch module includes four-quadrant switch dies $S_1$, $S_2$, $S_3$, $S_4$, coupled in series.

21. The hybrid double-sided power switch module of claim 5, further comprising a thermal management sub-system composed of thermal-management components selected from a group consisting of said at least first and second MFCs, at least one heat-sink, at least one heat-spreader, and combination thereof, said power switch module being sandwiched between said thermal-management components in thermal contact therewith.

22. The hybrid double-sided power switch module of claim 21, further comprising a coolant circulating sub-system operatively coupled to said thermal-management components for circulating a coolant medium therethrough, said coolant circulating sub-system being selected from a group consisting of a forced air cooling, a liquid cooling with dielectric coolant, a liquid cooling with non-dielectric coolant, a liquid cooling combined with an insulated coolant chamber, and combination thereof.

23. The hybrid double-sided power switch module of claim 22, wherein, for the forced air cooling, said heat-sink is selected from a group consisting of a plate-fin heat sink, metallic heat sink, square-pin-fin heat sink, round-pin-fin heat sink, staggered pin-fin heat sink, microchannel heat sink, and combination thereof.

24. The hybrid double-sided power switch module of claim 22, wherein, for the liquid cooling with a dielectric coolant, said thermal-management sub-system includes a plurality of MFCs operating as a plurality of heat sinks with a shared coolant circulation therethrough.

25. The hybrid double-sided power switch module of claim 22, wherein, for the liquid cooling with the insulated coolant chamber, the MFCs serve as heat spreaders and bus-bars, and wherein the insulated coolant chamber is secured to the MFCs.

26. A hybrid power switch module, comprising:
a first printed circuit board (PCB) having a first and a second sides,
a second PCB having a third and a fourth sides, said second PCB being secured to said first PCB with said second and fourth sides thereof facing each other,
a first plurality of switch dies and a second plurality of switch dies having a respective predetermined topology on a respective one of said first and third sides of said first and second PCBs, respectively, wherein at least one first switch die of said first plurality thereof and at least one second switch die of said second plurality thereof are disposed in a double-sided fashion on said first and third sides, respectively, of said first and second PCBs, wherein each of first and second pluralities of said switch dies includes a gate terminal and a source terminal facing a respective one of said first and third sides of said first and second PCBs, respectively,
a plurality of spring pins, each soldered in a respective through-hole via (THV) formed through each of said first and second PCBs in alignment with said gate terminal of each switch die, each of said plurality of spring pins having a first cap at one end thereof in electrical contact with said gate terminal and a second cap at another end of said each spring pin exposed from said respective THV and secured to a respective one of said second and fourth sides of said first and second PCBs, respectively, and
a plurality of multi-functional components (MFCs), each expanded vertically from a respective one of said first and third sides of the first and second PCBs, respectively, and secured to said first and second pluralities of the switch dies through an elastic metal contact.

27. The hybrid power switch module of claim 26, further comprising:
a first plurality and a second plurality of conductive spacers,
at least one conductive spacer of said first and second pluralities thereof being secured to a respective one of said first and third sides of said first and second PCBs by a respective one of a first and a second high-temperature solder paste layers,
a first array of THVs extending through said first PCB between said first and second sides thereof,
a second array of THVs extending between said third and fourth sides of said second PCB, said first and second arrays of the THVs being filled with a conductor material,
wherein each of said first and second arrays of THVs is disposed in alignment with a respective one of said first and second pluralities of conductive spacers.

28. The hybrid power switch module of claim 27, further comprising:
at least a third and a fourth high-temperature solder paste layers, each interposed between said source terminal of a respective switch die of said first and second pluralities thereof and a respective one of said first and third surface of said first and second PCB, respectively, and
a third and fourth arrays of THVs, each of said third and fourth arrays of THVs being formed through said first and second PCBs, respectively, in alignment with said source terminal of said respective one of said first and second pluralities thereof in contact with a respective one of said third and fourth high-temperature solder paste layers, wherein said first array of THVs is aligned with said fourth array of THVs, and wherein said second array of THVs is aligned with said third array of THVs.

29. The hybrid power switch module of claim 26, further comprising:
a first and second arrays of flexible metal fuzz buttons, each array of flexible metal fuzz-buttons being disposed between a respective one of said plurality of MFCs and a respective one of said first and second pluralities of switch dies.

30. The hybrid power switch module of claim 26, further comprising:
a thermal management sub-system composed of thermal-management components selected from a group consisting of said plurality of MFCs, at least one heat-sink, at least one heat-spreader, and combination thereof, said power switch module being sandwiched between said thermal-management components in thermal contact therewith.

31. A method for fabrication of a hybrid double-sided power switch module, comprising:
forming a first printed circuit board (PCB) and a second PCB, wherein said PCB has a first side and a second side opposite to said first side, and wherein said second PCB has a third side and a fourth side opposite to said third side, and
configuring each of said first and second PCB s with at least one respective through-hole-via (THV) extending between said first and second sides of said first PCB and between said third and fourth sides of said second PCB;
securing at least one first switch die to said first side of said first PCB with a gate terminal of said at least first switch die facing said first side of said first PCB in alignment with said at least one THV formed through said first PBC, and
soldering at least one first spring pin inside said at least one THV formed through said first PCB by a high-temperature solder paste, said at least one first spring pin having a first conductive body with a first cap formed at one end of said first conductive body and a second cap formed at another end of said first conductive body, wherein said at least one first spring pin has said first cap aligned and in contact with said gate terminal of said at least one first switch die, and wherein said second cap is exposed at said second side of said first PCB in alignment and contact with said at least one THV formed through said first PCB;
securing at least one second switch die to said third side of said second PCB with a gate terminal of said at least one second switch die facing said third side of said second PCB in alignment with said at least one THV formed through said second PCB, and
soldering at least one second spring pin inside said at least one THV formed through said second PCB by said high-temperature solder paste, said at least one second spring pin having a second conductive body with a third cap formed at one end of said second conductive body and a fourth cap formed at another end of said second conductive body, wherein said at least one second spring pin has said third cap aligned and in contact with said gate terminal, and wherein said fourth cap is exposed at said fourth side of said second PCB in alignment and in contact with said at least one THV formed through said second PCB; and
securing said first and second PCBs to one another by a low-temperature solder paste with said second and fourth sides thereof facing each other, thus forming a double PCB assembly with said at least first and second switch dies secured at said first and third sides and interconnected to configure the power switch module configuration.

32. The method of claim 31, further comprising:
securing at least one first spacer to said first side of said first PCB by a first high-temperature solder paste pad,
securing at least one second spacer to said third side of said second PCB by a second high-temperature solder paste pad,
forming a first array of THVs extending through said first PCB between said first and second sides thereof and filled with a conductive material,
forming a second array of THVs extending between said third and fourth sides of said second PCB and filled with said conductive material, and
disposing each of said first and second arrays of THVs in alignment with a respective one of said first and second spacers and in contact with a respective one of said first and second high-temperature solder paste pads.

33. The method of claim 32, further comprising:
interposing each of at least one third high-temperature solder paste pad and at least one fourth high-temperature solder paste pad between a source terminal of a respective one of said at least one first and second switch dies and a respective one of said first and third surface of said first and second PCB, respectively, and
forming a third array of THVs through said first PCB and a second array of THVs through said second PCB, each of said third and fourth arrays of THVs extending in alignment with said source terminal of a respective one of said at least first and second switch dies in contact with a respective one of said third and fourth high-temperature solder paste pads,
positioning said first array of THVs formed through said first PCB in alignment with said fourth array of THVs formed through said second PCB, and
positioning said second array of THVs formed through said second PCB in alignment with said third array of THVs formed through said first PCB.

34. The method of claim 33, further comprising:
securing at least one first and second multi-functional components (MFCs) at opposite sides of said double PCB assembly, each of said at least one first and second MFCs being disposed in contact with a top surface of a respective one of said at least one first and second switch dies and an upper surface of a respective one of said at least one first and second spacers.

35. The method of claim 34, further comprising:
forming said power switch module in a high-voltage half-bridge configuration by:
configuring said at least first and second switch dies to include a first plurality of switch dies $S_1$, $S_2$, $S_3$ and a second plurality of switch dies $S_4$, $S_5$, $S_6$ series-connected to each other,
positioning at least one switch die of said first plurality thereof and at least one switch die of said second plurality thereof are positioned at said first and third sides of said first and second PCBs,
configuring said at least first and second MFCs as DC+ and DC− bus-bars and a plurality of AC bus-bars, and
securing at least one capacitor to said DC+ and DC− bus-bars in proximity to said at least first and second switch dies.

36. The method of claim 35, further comprising:
patterning an interface board with DC+ and DC− conductive traces, and
attaching an input connector to said interface board in contact with said DC+ and DC− conductive traces, and
integrating said interface board with said power switch module.

37. The method of claim 35, further comprising:
securing at least first and second gate driver circuitry units at a respective one of said first and third sides of said first and second PCBs, respectively, at a location devoid of said at least first and second MFCs.

38. The method of claim 35, further comprising:
securing at least a first and a second voltage balancing circuitry units at a respective one of said first and third sides of said first and second PCBs, respectively.

39. The method of claim 35, further comprising:
connecting said at least first and second switch dies in parallel to form said power switch module in a high-current half-bridge configuration.

40. The method of claim 39, wherein said at least first and second switch dies include a plurality of switch dies $S_1$, $S_2$, $S_3$, $S_4$, $S_5$, $S_6$, $S_7$, $S_8$, further comprising:
connecting said switch dies $S_1$ and $S_2$ to form a first phase-leg having a first capacitor coupled between said switch dies $S_1$ and $S_2$ and a first MFC forming a first $AC_1$ bus-bar,
connecting said switch dies $S_3$ and $S_4$ to form a second phase-leg having a second capacitor coupled between said switch dies $S_3$ and $S_4$ and a second MFC forming of a second $AC_2$ bus-bar,
connecting said switch dies $S_5$ and $S_6$ to form a third phase-leg having a third capacitor coupled between said switch dies $S_5$ and $S_6$ and a third MFC forming a third $AC_3$ bus-bar,
connecting said switch dies $S_7$ and $S_8$ to form a fourth phase-leg having a fourth capacitor coupled between said switch dies $S_7$ and $S_8$ and a fourth MFC forming of a fourth $AC_4$ bus-bar,
connecting a common MFC in a form of an AC bus-bar to said $AC_1$, $AC_2$, $AC_3$ and $AC_4$, bus-bars, wherein said first, second, third and fourth phase-legs are connected in parallel between respective MFCs in a form of DC1+ and DC1− bus-bars,
coupling each of said first, second, third and fourth capacitors to said DC1− and DC1+ bus-bars in each of said phase-legs,
disposing said switch dies in each phase-leg at opposite first and third sides of said first and second PCBs, respectively, and
arranging said switch dies on said first side and second side of said first and second PCBs, respectively, in a single row of switch dies.

41. The method of claim 35, wherein said at least first and second switch dies include a plurality of switch dies $S_1$, $S_2$, $S_3$, $S_4$, $S_5$, $S_6$, $S_7$, $S_8$, further comprising:
arranging said switch dies $S_1$, $S_2$, $S_3$, $S_4$, $S_5$, $S_6$, $S_7$, and $S_8$ in full-bridge configurations, and
disposing said switch dies $S_1$, $S_2$, $S_3$, $S_4$, $S_5$, $S_6$, $S_7$, and $S_8$ in two rows on each of said first and third side of the first and second PCB s, respectively.

42. The method of claim 41, further comprising:
coupling a decoupling capacitor between adjacent two of said first, second, third and fourth phase legs.

43. The method of claim 35, further comprising:
depositing a copper trace on said first and third sides of said first and second PCBs, respectively,
connecting said at least first and second switch dies in series through said copper trace, and
configuring said power switch module in a modular half-bridge multi-level converter (MMC) configuration.

44. The method of claim 43, further comprising:
serially connecting a number N of full-bridge multi-level converter module (MMC) configurations, each composed of a pair of said half-bridge MMC configurations, wherein said serially connected full-bridge module MMC configurations on each of said first and third sides of said first and second PCBs, respectively, share a common AC bus-bar of said MFCs.

45. The method of claim 35, further comprising:
coupling a flying capacitor across respective ones of said at least first and second MFCs.

46. The method of claim 35, further comprising:
arranging said half-bridge configuration of said power switch module with four-quadrant switch dies $S_1$, $S_2$, $S_3$, $S_4$, coupled in series.

47. The method of claim 35, further comprising:
sandwiching said power switch module between thermal-management components in thermal contact therewith, said thermal-management components being selected from a group consisting of said at least first and second MFCs, at least one heat-sink, at least one heat-spreader, and combination thereof,
coupling a coolant circulating sub-system to said thermal-management components for circulating a coolant medium therethrough, said coolant circulating sub-system being selected from a group consisting of a forced air cooling, a liquid cooling with dielectric coolant, a liquid cooling with non-dielectric coolant, a liquid cooling combined with an insulated coolant chamber, and combination thereof.

* * * * *